(12) United States Patent
Murooka et al.

(10) Patent No.: US 7,638,382 B2
(45) Date of Patent: Dec. 29, 2009

(54) STORAGE APPARATUS AND MANUFACTURING METHOD THEREOF

(75) Inventors: Kenichi Murooka, Yokohama (JP); Toshiro Hiraoka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 532 days.

(21) Appl. No.: 11/501,897

(22) Filed: Aug. 10, 2006

(65) Prior Publication Data

US 2007/0047323 A1    Mar. 1, 2007

(30) Foreign Application Priority Data

Aug. 11, 2005 (JP) .............................. 2005-233449
Aug. 19, 2005 (JP) .............................. 2005-239092

(51) Int. Cl.
*H01L 21/336* (2006.01)
*H01L 21/8234* (2006.01)

(52) U.S. Cl. .................. 438/197; 438/381; 438/238; 438/680; 438/780; 257/E21.17; 257/E21.051; 257/E21.218; 257/E21.266; 257/E21.645

(58) Field of Classification Search ................. 438/197, 438/238, 381, 680, 687, 688, 692, 767, 782, 438/712

See application file for complete search history.

(56) References Cited

U.S. PATENT DOCUMENTS

| 6,565,763 | B1 | 5/2003 | Asakawa et al. | |
|---|---|---|---|---|
| 6,727,883 | B2 * | 4/2004 | Uno et al. | 345/107 |
| 6,781,166 | B2 | 8/2004 | Lieber et al. | |
| 6,835,591 | B2 | 12/2004 | Rueckes et al. | |
| 6,956,557 | B2 * | 10/2005 | Machida et al. | 345/107 |
| 7,379,324 | B2 * | 5/2008 | Murooka | 365/151 |
| 7,517,466 | B2 * | 4/2009 | Asakawa et al. | 216/41 |
| 2003/0222048 | A1 | 12/2003 | Asakawa et al. | |
| 2004/0050816 | A1 | 3/2004 | Asakawa et al. | |
| 2005/0275617 | A1 | 12/2005 | Murooka | |

FOREIGN PATENT DOCUMENTS

| JP | 2002-536782 | 10/2002 |
|---|---|---|
| JP | 2005-353744 | 12/2005 |

OTHER PUBLICATIONS

U.S. Appl. No. 11/566,937, filed Dec. 5, 2006, Murooka.
U.S. Appl. No. 11/455,916, filed Jun. 20, 2006, Koji Asakawa, et al.
Shin'ichiro Kimura, "Semiconductor memory; DRAM", Oyo Butsuri, vol. 69, No. 10, 2000, pp. 1233-1240.
Natsuo Ajika, "Flash memory, recent topics", Oyo Butsuri, vol. 69, No. 12, 2000, pp. 1462-1466.

* cited by examiner

*Primary Examiner*—David Nhu
(74) *Attorney, Agent, or Firm*—Oblon, Spivak, McClelland, Maier & Neustadt, L.L.P.

(57) ABSTRACT

A method of manufacturing a storage apparatus includes preparing a first substrate on which a plurality of row lines are arranged in parallel, preparing a second substrate on which a plurality of column lines are arranged in parallel, dispensing as a droplet a solution, in which particles are dispersed in a solvent, from a solution supply port to which an electric field is applied, toward a surface of the first substrate or a surface of the second substrate, and arranging the surfaces of the first and second substrates to face each other with a gap such that the column lines cross the row lines, thereby making the particles at crossing portions to be movable between the row lines and the column lines facing each other and between the crossing portions adjacent to each other.

13 Claims, 26 Drawing Sheets

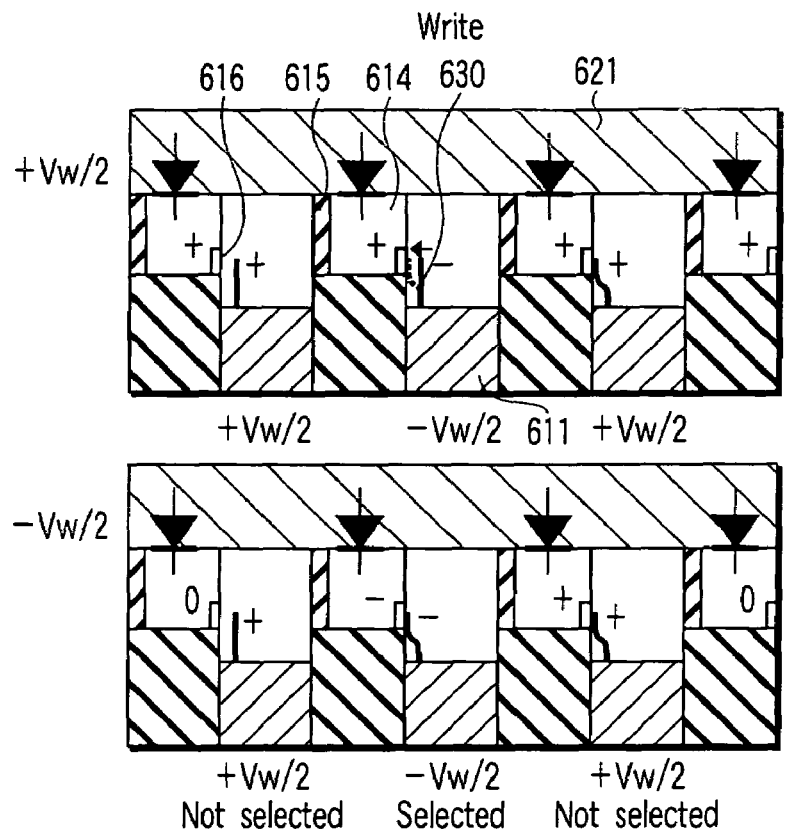
FIG. 28A
FIG. 28B
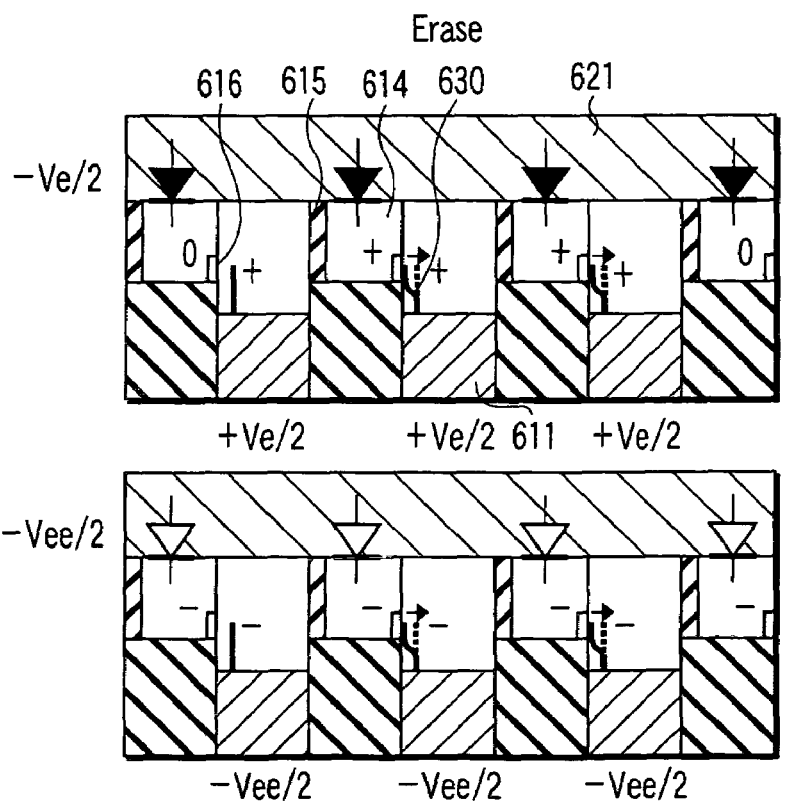
FIG. 29
FIG. 30

STORAGE APPARATUS AND MANUFACTURING METHOD THEREOF

CROSS-REFERENCE TO RELATED APPLICATIONS

This application is based upon and claims the benefit of priority from prior Japanese Patent Applications No. 2005-233449, filed Aug. 11, 2005; and No. 2005-239092, filed Aug. 19, 2005, the entire contents of both of which are incorporated herein by reference.

BACKGROUND OF THE INVENTION

1. Field of the Invention

The present invention relates to a storage apparatus utilizing movements of a movable conductor arranged between electrodes, and a manufacturing method thereof.

2. Description of the Related Art

In recent years, with an increase in an integration degree of a semiconductor device, a circuit pattern of an LSI element constituting this apparatus is further miniaturized. Such pattern miniaturization requires not only a simple reduction in a line width but also an improvement in a dimensional accuracy or a positional accuracy of a pattern. A storage apparatus called a memory is not an exception, and a fixed electric charge necessary for storage must be held in a narrower region in a cell formed by taking advantages of a highly accurate processing technology.

Although various kinds of memories, such as a DRAM, an SRAM, a flash and others have been conventionally manufactured, all these memories use an MOSFET in a memory cell, and hence an improvement in a dimensional accuracy at a ratio exceeding a ratio of miniaturization is required with miniaturization of patterns. Therefore, a large burden is imposed on a lithography technology which forms these patterns, and this is a factor of increasing a product cost (see, e.g., the following references: "Semiconductor Memory; DRAM" in OYO BUTURI Vol. 69, No. 10, pp. 1233-1240, 2000, and "Flash Memory, Recent Topics" in OYO BUTURI Vol. 69, No. 12, pp. 1462-1466, 2000).

On the other hand, as a technology which radically eliminates problems of such miniaturization processing, there is an attempt which artificially synthesizes a desired molecular structure and utilizes homogeneity of obtained molecules to acquire an element having homogeneous characteristics. However, this type of method has a serious problem in a technology of arranging a synthesized molecule at a desired position or acquisition of electrical contact with an arranged electrode. Further, such an element stores information by using a very small number of electric charges, it has a problem that the probability of an erroneous operation due to a disturbance of natural radiation or the like becomes very high.

As described above, in a memory using a conventionally utilized MOSFET for a cell, a dimensional accuracy or a positioning accuracy of a pattern becomes rigorous with miniaturization of a pattern, and there is a factor of increasing a manufacturing cost in addition to a technical difficulty. On the other hand, in a memory utilizing a molecular structure, there is a fear that the probability of an erroneous operation due to a disturbance is large in addition to a problem concerning a manipulation of molecules or contact with an electrode.

Therefore, there have been demanded a highly integrated storage apparatus which is hardly affected by a disturbance and a manufacturing method of a storage apparatus which can manufacture this storage apparatus at a low cost.

BRIEF SUMMARY OF THE INVENTION

According to a first aspect of the invention, there is provided a method of manufacturing a storage apparatus which comprises:

preparing a first substrate on which a plurality of row lines are arranged in parallel;

preparing a second substrate on which a plurality of column lines are arranged in parallel;

dispensing as a droplet a solution, in which particles are dispersed in a solvent, from a solution supply port to which an electric field is applied, toward a surface of the first substrate on which the row lines are formed or a surface of the second substrate on which the column lines are formed; and arranging the surface of the first substrate and the surface of the second substrate to face each other with a gap in such a manner that the column lines cross the row lines, thereby making the particles at crossing portions to be movable between the row lines and the column lines facing each other and between the crossing portions adjacent to each other.

According to a second aspect of the invention, there is provided a method of manufacturing a storage apparatus which comprises:

preparing a first substrate on which a plurality of row lines are arranged in parallel;

preparing a second substrate on which a plurality of column lines are arranged in parallel;

spin-coating a surface of the first substrate on which the row lines are formed or a surface of the second substrate on which the column lines are formed with a solution obtained by dispersing particles in a solvent and further mixing a highly viscous soluble resin in the solvent; and arranging the surface of the first substrate and the surface of the second substrate to face each other through a gap in such a manner that the column lines cross the row lines, thereby making the particles at crossing portions to be movable between the row lines and the column lines facing each other and between the crossing portions adjacent to each other.

According to a third aspect of the invention, there is provided a method of manufacturing a storage apparatus which comprises:

forming on a substrate a plurality of row lines made of a first wiring material and arranged in parallel;

forming on the substrate a structure which defines an air gap region on the row lines;

embedding a mixture including a pyrolysis polymer and particles in the air gap region to form a mixture layer;

forming a film of a second wiring material on the mixture layer;

processing the second wiring material to obtain a plurality of column lines arranged in parallel in such a manner that the column lines cross the row lines;

performing a heat treatment to the substrate in order to decompose and expel the pyrolysis polymer in the mixture layer; and forming a dielectric film over the column lines and between the column lines adjacent to each other.

According to a fourth aspect of the invention, there is provided a storage apparatus comprising:

a plurality of row lines arranged in parallel on a substrate;

a plurality of column lines arranged in parallel and oppose the row lines with a gap so as to cross the row lines;

a plurality of semiconductor films, each provided at a region adjacent to each crossing portion of the row lines and the column lines, and each having an uppermost portion in contact with one of the column lines and a lowermost portion apart from the row lines; and a plurality of movable conductors, each arranged at each crossing portion of the row lines and the column lines, to selectively connect the row lines with the semiconductor films when one of the movable conductors touches one of the row lines and one of the semiconductor films at the same time.

According to a fifth aspect of the invention, there is provided a method of manufacturing a storage apparatus which comprises:

alternately arranging on a substrate a plurality of row lines and a plurality of row-line-side dielectric lines, the row lines including a first wiring material, in such a manner that upper ends of the dielectric lines are higher than upper ends of the row lines adjacent to the row-line-side dielectric lines;

forming insulating walls on the same side edge of each of the row-line-side dielectric lines;

stacking semiconductor lines on the row-line-side dielectric lines, respectively, to form a plurality of linear structure portions, which include the row-line-side dielectric lines, the semiconductor lines and the insulating walls attached to the semiconductor lines;

embedding a mixture including a pyrolysis polymer and conductive particles in regions on the row lines and sandwiched between neighboring ones of the linear structure portions to form a plurality of mixed film portions;

forming a film of a second wiring material over the semiconductor lines and the mixed film portions;

etching the second wiring material to provide a plurality of column lines arranged in parallel with each other, in such a manner that the column lines cross the row lines, followed by etching the semiconductor lines;

performing a heat treatment to the substrate to decompose and expel a polymer in the mixed film portions outside; and forming an interlayer dielectric film over the column lines and between the column lines adjacent to each other.

BRIEF DESCRIPTION OF THE SEVERAL VIEWS OF THE DRAWING

FIGS. 18A and 18B are equivalent circuit diagrams each showing a crosspoint type memory cell array in which a switch substitutes for a memory cell, in which FIG. 18A shows a case where each crosspoint includes a diode and FIG. 18B shows a case where a diode is not included;

FIGS. 28A and 28B are schematic views illustrating a write operation of the storage apparatus according to the eighth embodiment;

FIG. 29 is a schematic view illustrating an erase operation of the storage apparatus according to the eighth embodiment;

FIG. 30 is a schematic view illustrating an erase-for-rescue operation of the storage apparatus according to the eighth embodiment.

DETAILED DESCRIPTION OF THE INVENTION

Prior to an explanation of embodiments according to the present invention, a description will be given as to an outline of JP-A (KOKAI) 2005-353744 (U.S. Application No. 11147323) filed for prior application by the present applicant.

Figure 1:
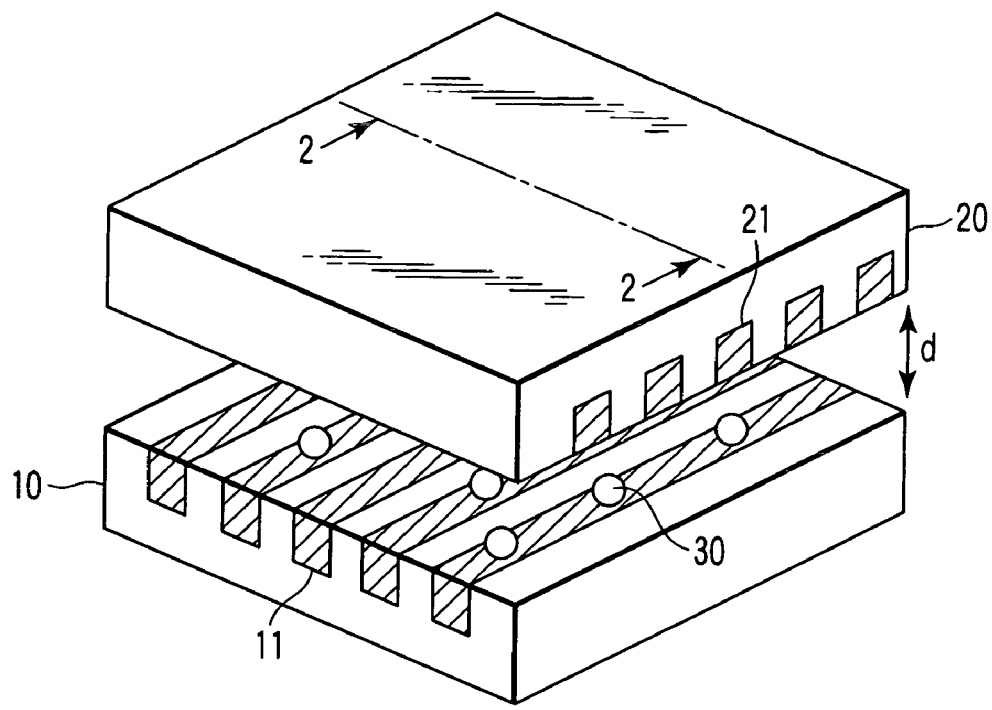
FIG. 1 is a perspective view showing a cell portion structure of a storage apparatus according to an embodiment of the present invention.

FIG. 1 is a perspective view showing a cell portion structure of the storage apparatus in the above application. A plurality of row lines 11 arranged in parallel are embedded and formed in a surface portion of a first substrate 10, and a plurality of column lines 21 arranged in parallel are embedded and formed in a surface portion of a second substrate 20. Furthermore, these substrates 10 and 20 are arranged to face each other with a fixed gap d therebetween in such a manner that their respective surface portions face each other and the row lines 11 and the column lines 21 have an orthogonal relationship.

Here, the row line 11 will be referred to as a word line and the column line 21 will be referred to as a bit line in accordance with a regular MOS type memory cell.

An intersecting portion of the word line 11 and the bit line 21 corresponds to a memory cell, and fine particles 30 movable between electrodes adjacent to each other are selectively arranged in a gap between the word lines 11 and the bit lines 21 at respective intersecting portions. Here, the fine particle 30 can move in not only a direction vertical to the word lines 11 and the bit lines 21 but also a direction parallel with the word lines 11 or the bit lines 21. That is, the fine particle 30 can move in a direction along which the substrates 10 and 20 face each other and between the word lines adjacent to each other or the bit lines adjacent to each other.

In such a structure, the word lines 11 provided in the first substrate 10 and the bit lines 21 provided in the second substrate 20 form a simple lines-and-spaces pattern, it is good enough for the word lines 11 and the bit lines 21 to have a positional relationship in which they are orthogonal to each other, and displacement in a word line direction and a bit line direction does not have to be taken into consideration. Therefore, a positioning accuracy in a cell is not required at the time of manufacture, thereby readily effecting production.

Figure 2:
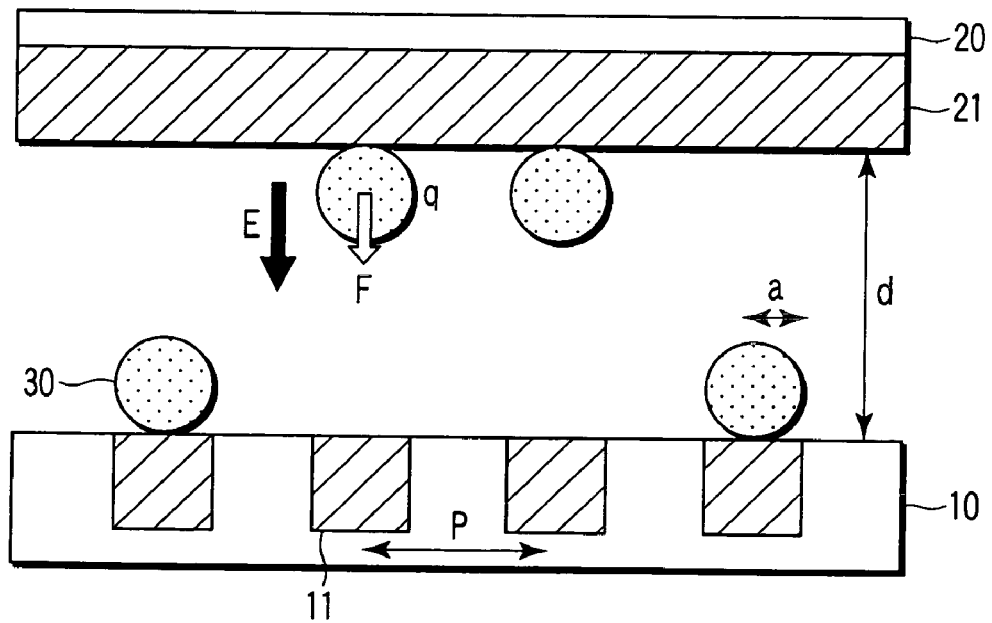
FIG. 2 is a schematic view illustrating an operational principle of the embodiment according to the present invention.

An operational principle of this structure will now be explained with reference to FIG. 2. FIG. 2 is a schematic view illustrating an operational principle of this embodiment, and corresponds to a cross section taken along a line 2-2 in FIG. 1.

When each fine particle 30 having a radius a on an electrode (the word line 11 or the bit line 21) takes on an electric charge q and the fine particle 30 is placed in an electric field E provided by a voltage applied to the electrode, a force received by the electric charge from the electric field, a force received from a mirror image charge induced in the electrode and a force received from a mirror image dipole are applied to this fine particle 30. Moreover, when approximation is performed in a case where the electrode is infinitely wide, a force F obtained by combining these forces can be given by the following Expression (1).

$$F = qE - \frac{q^2}{4\pi\varepsilon_0(2a)^2} - \frac{3\pi\varepsilon_0}{8}\left(\frac{\varepsilon_r-1}{\varepsilon_r+2}\right)^2(2a)^2E^2 \quad (1)$$

In this expression, $\varepsilon_0$ is the dielectric constant of a vacuum (approximately $8.85\times10^{-12}$ F/m), and $\varepsilon_r$ is the relative dielectric constant of a fine particle.

When the gap is in atmospheric air, the dielectric constant must be corrected in a precise sense, but its difference is very small and hence can be ignored, and Expression (1) can be used as it is. Since the electric charge q necessarily becomes an integral multiple of an elementary electric charge e (approximately $1.6\times10^{-19}$ C), it can be expressed as q=ne. Additionally, the electric field E can be approximated by E=V/d, where V is a potential difference between electrodes facing each other and d is the gap.

On the other hand, an electrostatic capacitance C of the fine particle 30 is given by an expression $C=4\pi\varepsilon_0 a$, and a charging energy obtained by this capacitance is $(\frac{1}{2})q^2/C=n^2e^2/8\pi\varepsilon_0 a$.

There is a phenomenon called a Coulomb barrier by which an electron (or a hole) having an energy exceeding this energy alone can move to the fine particle 30. Therefore, in case of a potential difference V satisfying $eV>n^2e^2/8\pi\varepsilon_0 a$, an nth electron (or hole) moves to the fine particle 30. Considering these circumstances, when the force F which is defined by Expression (1) and acts on the fine particle 30 is represented in the form of a graph, FIG. 3 can be obtained.

Figure 3:
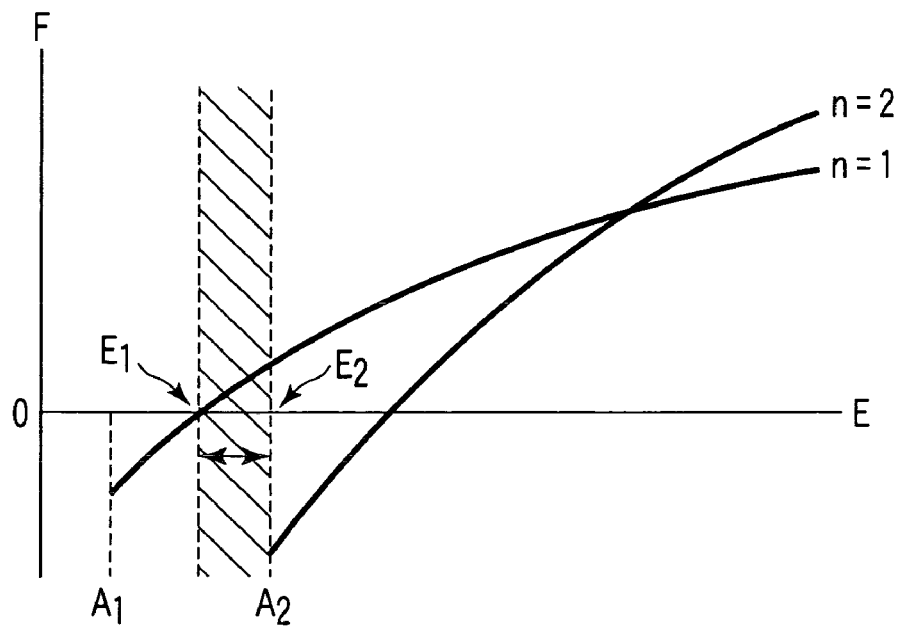
FIG. 3 is a characteristic view showing forces acting on a particle in the form of a graph.

FIG. 3 shows cases where n=1 and n=2, but the two cases are enough for the explanation of this embodiment. Since the above-described Coulomb barrier exists, each charging state is realized on the right side part from positions indicated by dotted lines A1 and A2 in the drawing. That is, starting points of curves A1 and A2 at left ends are points where the charging energy begins to exceed the Coulomb barrier. As a result, it can be understood that an attraction force obtained by a mirror image surpasses until the electric field has an intensity not smaller than a given fixed value even though the fine particle is charged, and the fine particle is not separated from the electrode. The most important thing is that separation necessarily occurs under a condition of n=1 in a hatched section in FIG. 3. It is to be noted that E1 indicates a lower limit electric field which is required for separation when n=1 and E2 indicates a lower limit electric field corresponding to a lower limit voltage (the Coulomb barrier) required for charging when n=2.

The fine particle separated from the electrode is accelerated to reach an electrode on the opposite side, discharges the electric charge there, newly receives an electric charge having an opposite sign, and is again separated to reach the original electrode. This process is repeated. Since the electric charge is carried by this series of process, it can be detected as a current between the electrodes. As described above, when these processes necessarily occur under the condition of n=1, a constant current flows, and presence/absence of the fine particle can be readily detected. Further, when two fine particles exist between the same electrodes, a carrier which carries the electric charges is doubled, and a moving distance is shortened. Therefore, a twofold or above current is detected, thereby clearly detecting existence of the two fine particles.

Specifically, assuming that the radius a of the fine particle is 10 nm and the gap d between the electrodes is 60 nm, the separation and the reciprocating motion of the fine particle in the state where n=1 occur when an inter-electrode voltage V falls within a range of 0.22 V to 0.29 V. Then letting the inter-electrode voltage set to 0.28 V, +0.14 V corresponding to V/2 is applied to the upper electrode which selects an intersecting point, −0.14 V corresponding to −V/2 is applied to the lower electrode which selects an intersecting point, and the other electrodes are set to 0 V. In this case, it is estimated that a force which acts on the fine particle existing at a selected intersecting point immediately after separation is approximately 0.2 pN and a time required for a one-way motion is approximately 70 nsec. Furthermore, since one electric charge is carried per one-way motion of one fine particle, it can be understood that a current of approximately 2 pA is detected. Therefore, measuring this current can detect presence/absence (the number) of fine particles existing at intersecting points of the upper and lower electrodes.

At the same time, an electric field is also applied to a neighboring fine particle, especially a fine particle existing at an adjoining part on the same electrode, but its intensity is in inverse proportion to a distance. Therefore, assuming that a pitch p of the electrodes in the lateral direction is 40 nm, an electric field with respect to the closest fine particle is reduced to approximately 83%, and an electric field with respect to the second closest fine particle is reduced to approximately 73%.

When the inter-electrode voltage V is 0.28 V, the closest fine particle can be separated, but the electric field applied to the second closest fine particle does not reach a lower limit required for separation. Therefore, the closest fine particle alone is a target of an interaction, and utilized for a write operation as will be described later. It is to be noted that, if the inter-electrode voltage V is not greater than 0.26 V, the electric field applied to the closest fine particle does not reach the lower limit required for separation, and hence this can be utilized for a read-only mode having no interaction.

Moreover, a minimum unit constituting this embodiment is one linear electrode, at least two electrodes facing this electrode with a gap therebetween, and at least one fine particle which is arranged in the gap. It can be understood that information is stored by utilizing the fact that this fine particle can two-dimensionally move between the electrodes.

It is to be noted that a size of each parameter can be selected from a wide range without being restricted to the above-described example, and the following range can be used in principle based on the approximation mentioned above. In order to simplify an expression, a ratio of the gap d between the electrodes and the radius $\underline{a}$ of the fine particle is k (d=ka), and a ratio of the pitch $\underline{p}$ of the electrodes in the lateral direction and the gap $\underline{d}$ between the electrodes is κ (p=κd). b and β are defined in the following Expressions (2) and (3):

$$b = \frac{2}{1 + \sqrt{1 - \frac{3}{8}\left(\frac{\varepsilon_r - 1}{\varepsilon_r + 2}\right)^2}} \quad (2)$$

$$\beta = \frac{8\pi\varepsilon_0}{e} \quad (3)$$

Here, when each parameter is used in a mode having an interaction, each parameter can be selected within a range where the following Expression (4) is achieved:

$$\frac{k}{2}b\sqrt{1+\kappa^2} < \alpha\beta V < 4 \quad (4)$$

Additionally, when each parameter is used in the read-only mode, each parameter can be selected within a range where the following Expression (5) is achieved:

$$\frac{k}{2}b < \alpha\beta V < \frac{k}{2}b\sqrt{1+\kappa^2} \quad (5)$$

On the other hand, in order to prevent an interaction with respect to the closest fine particle from being provoked as described above, a design which can achieve the following Expression (6) must be adopted in advance, or each parameter must be used under conditions which can attain Expression (7):

$$\frac{k}{2}b\sqrt{1+2\kappa^2} > 4 \quad (6)$$

$$\alpha\beta V < \frac{k}{2}b\sqrt{1+2\kappa^2} \quad (7)$$

Further, application of a voltage to a selected intersecting point is not restricted to a method of dividing the inter-electrode voltage V into +V/2 and −V/2 and applying the divided voltages to upper and lower selected lines, and a voltage can be selected within a range satisfying the following conditions which do not generate crosstalk. A potential of a non-selected line is determined as 0 V, and absolute values of voltages applied to the upper and lower selected lines are compared with each other. A larger voltage is determined as Vm, and a ratio with respect to the inter-electrode voltage V is determined as γ (Vm=γV, 0.5≦γ≦1). At this time, each parameter must be used under conditions where the following Expression (8) can be attained, or a design which can achieve Expression (9) must be adopted in advance.

$$\frac{k}{2}b > \gamma\alpha\beta V \quad (8)$$

$$\gamma\sqrt{1+\kappa^2} < 1 \quad (9)$$

Clearly specifying a value of each parameter in the foregoing example as a reference, k=6, κ=⅔, b=1.025, β=1.39× 10⁹ [1/V·m], and γ=0.5.

Figure 4:
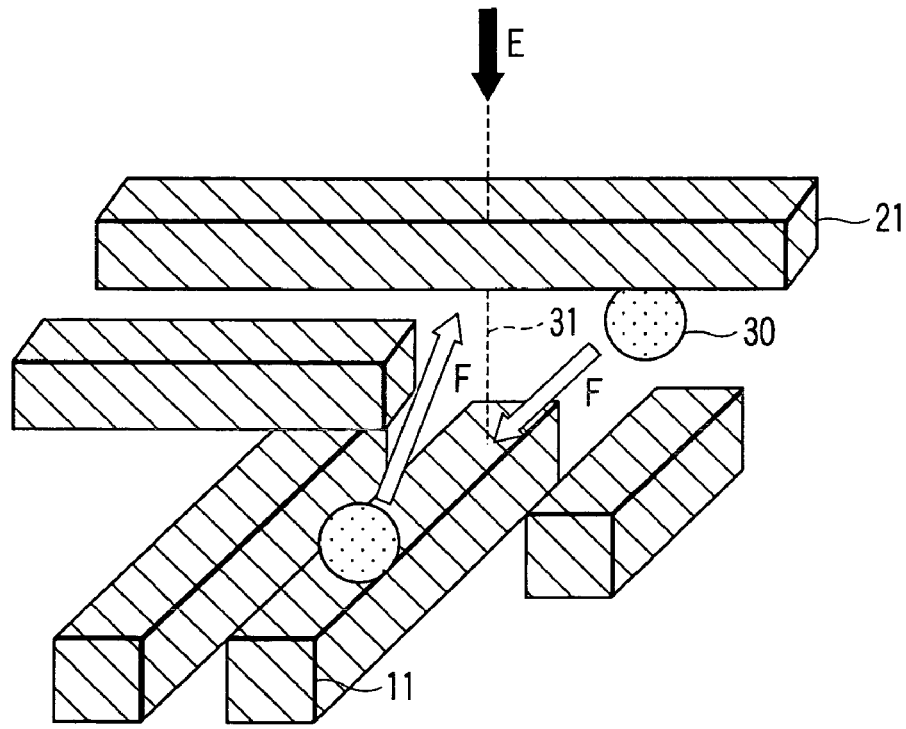
FIG. 4 is a perspective view schematically showing how particles move.

As to the interaction between intersecting points, it is adequate that taking the closest four positions into account. A phenomenon which actually occurs is a movement of a fine particle to a selected intersecting point from the closest region, but the movement does not occur in the horizontal direction only. It is necessary that the movement in the vertical direction is involved in the example of the electric field distribution. That is, as shown in FIG. 4, there are characteristics that the fine particle 30 on a wiring line which is common to a selected intersecting point 31 moves to the opposite side of the selected intersecting point in the vertical direction. Even if the fine particle exists at the closest position, the movement does not occur when this particle does not exist on the common wiring line.

Therefore, in the case of assuredly moving a fine particle existing at a given intersecting point $\underline{a}$ to another closest intersecting point $\underline{b}$, the following operation must be performed. That is, a predetermined voltage is applied to the intersecting point $\underline{b}$, and whether a current detected at the intersecting point $\underline{b}$ has a specific value is confirmed. When the detected current is not the specific value, a voltage is applied to the intersecting point $\underline{a}$ to shake up upper and lower positions of the fine particle, and the predetermined voltage is again applied to the intersecting point $\underline{b}$. This procedure must be repeated until the current detected at the intersecting point b takes on the specific value.

Figure 5C:
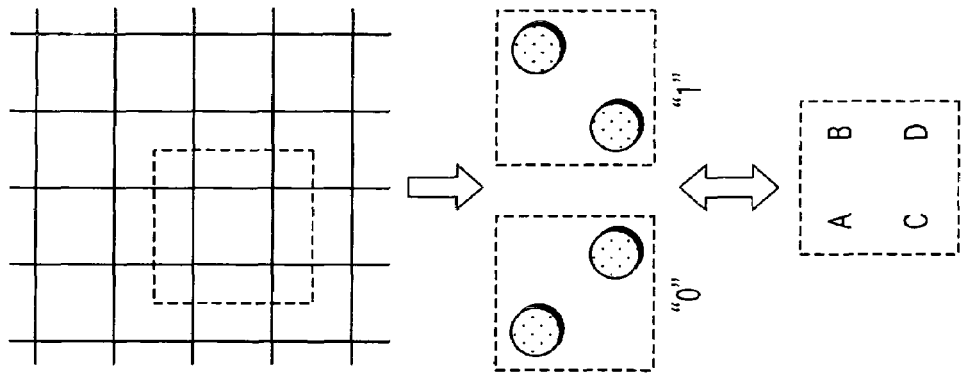
FIGS. 5A to 5C are schematic views showing a relationship between an intersecting portion and a cell and a storage state based on particles.
Figure 5B:
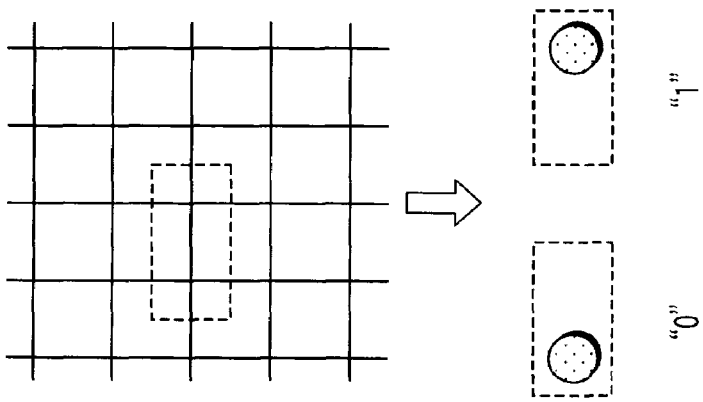
Figure 5A:
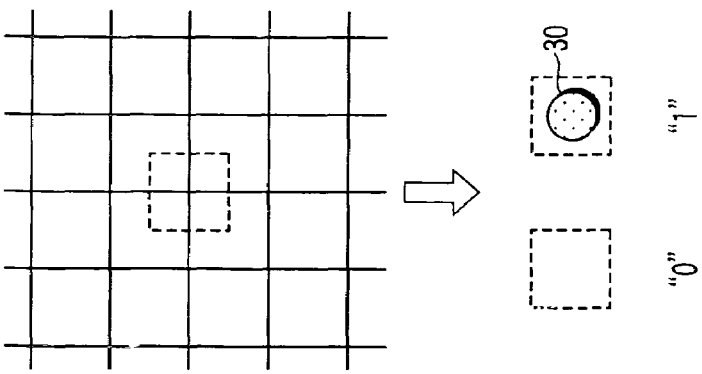

In view of this circumstance, as a write method for this storage apparatus, there are used three examples which are schematically shown in FIGS. 5A to 5C. It is to be noted that each of portions shown in FIGS. 5A to 5C is a part of a memory cell array 41 depicted in FIG. 6, and a row decoder 42 is connected with each row wiring line, and a driver 43 including a read circuit and a column decoder 44 are connected with each column wiring line, like a conventional memory. An upper level block 45 for transferring address data and inputting/outputting data is connected with each decoder 42 or 44.

When such a structure is adopted, information of all columns included in the same row can be collectively read at one time.

FIG. 5A shows a scheme by which one intersecting point constitutes one cell and information of one bit is allocated to this cell. Whether a corresponding bit is "0" or "1" is stored based on information indicating whether the number of fine particles existing at a corresponding intersecting point is larger/smaller than a predetermined value. A magnitude relationship of the number of fine particles and a correspondence relationship of "0" or "1" of a bit have arbitrary properties, and either value can be selected. In this example, however, a case where the number of fine particles is smaller than the predetermined value is associated with the bit value "0", and a case where it is larger than the predetermined value is associated with the bit value "1". Since the number of fine particles existing at the intersecting point and a current flowing through the intersecting point have clear correspondence as described above, this bit information is read by comparing the current flowing through the corresponding intersecting point with a predetermined reference value in a state where a voltage in the read mode is applied.

In the read operation, so-called random access which selects an arbitrary intersecting point can be adopted. However, in a write operation, the following technique is used. A reservoir of fine particles is formed on an outer side of the last row in the memory cell array 41 in advance. First, of intersecting points in a last row (an nth row) in the memory cell, a predetermined voltage is applied to an intersecting point corresponding to a data string which is to be written in a first row of the memory cell, thereby taking in fine particles.

Specifically, in a state where the last row (the nth row) alone is selected by the row decoder 42, the column decoder 44 selects only a column in which a bit value "1" is to be written in the first row, thereby forming contents of the first row in the last row (the nth row). Then, the row decoder 42 is operated to cancel selection of the last row (the nth row) and select an (n−1)th row while maintaining the selected state of the column decoder 44.

There may be a case where all fine particles do not move from the nth row to the (n−1)th row by an operation at one time as described above. Thus, a current in each column is detected to read contents of the (n−1)th row. When a desired state is not attained, the selected state of the (n−1)th row is maintained, and the state of the nth row is re-selected. After one clock cycle or more have elapsed, the selected state of the nth row is canceled, and data contents of the (n−1)th row are again confirmed. This series of operations is repeated until contents of the (n−1)th row enter a desired state. When enabling the selected state of the nth row, keeping the selected state of the (n−1)th row can prevent a fine particle from turning back to the nth row from the (n−1)th row while shaking up upper and lower positions of the fine particle remaining in the nth row.

Subsequently, the row decoder 42 is likewise operated to move contents of the (n−1)th row to an (n−2)th row while maintaining the selected state of the column decoder 44.

Sequentially repeating this operation can set contents of the first row to a desired state. Likewise, a data string to be written in the second row is also transferred to the third row by sequential shift from the nth row. However, before finally moving to the second row, an operation of selecting the second row is performed with the first row being in a selected state. As a result, the fine particle existing in the first row can be prevented from turning back to the second row, and the fine particle in the third row can be moved to the second row.

Then, a write operation to the third row is likewise performed, but the first row and the second row may remain in the selected state until the last fourth row shifts to the third row. It is to be noted that, when the selected state of the first row and the second row is canceled until the nth row shifts to the fourth row, cancellation and reselection of both rows must be simultaneously carried out in order to protect written data. Subsequently, a write operation in the fourth row, a write operation in the fifth row and a write operation in the nth row are likewise executed, thereby setting all data in the memory cell to a desired state.

At the time of an erase operation, in a state where all columns are selected by the column decoder 44, the same procedure as that in the write operation is used to move all fine particles in the nth row to the storage position, and then fine particles in the (n−1)th row are moved to the storage position through the nth row. This procedure is sequentially performed down to the fine particles in the first row. As a result, all fine particles can be removed from the memory cell array, thereby completing the erase operation. In this scheme, the write/erase operation is complicated, but there is an advantage of increasing an integration degree.

FIG. 5B shows a scheme which allocates information of one bit to a cell constituted of two intersecting points adjacent to each other. In this scheme, whether a corresponding bit is "0" or "1" is stored in accordance with a fact that which one of the two intersecting points has more fine particles. Arbitrary properties are provided to association of either the vertical direction or the horizontal direction along which intersecting points are adjacent to each other or either the vertical direction or the horizontal direction along which more fine particles exist with the bit value "1". In the illustrated example, a horizontal pair of intersecting points aligned in the row direction are used, and the bit value "1" is associated with a case where the number of fine particles existing at the right-side intersecting point is larger than that at the left-side intersecting point, whilst the bit value "0" is associated with a case where the number of fine particles existing at the right-side intersecting point is smaller than that at the left-side intersecting point.

In this scheme, bit information is read by selecting corresponding intersecting points by the row decoder 42 and the column decoder 44 and associating the bit value "1" or "0" in accordance with a positive or negative sign of a value obtained by subtracting a current flowing through the left-side intersecting point from a current flowing through the right-side intersecting point.

Specifically, a current flowing through the right-side intersecting point is converted into a voltage by using a reference resistance, and the obtained voltage is input to a positive input port of a differential amplifier. A current flowing through the left-side intersecting point is converted into a voltage by using the reference resistance, and then the obtained voltage is input to a negative input port of the differential amplifier. A sign of an output from the differential amplifier is detected, and the bit value "1" or "0" is thereby associated in accordance with a positive or negative sign. Since this read method uses a difference in current flowing through a common row address line to judge the bit value, accurate detection is possible even if there are irregularities in resistance of the row address line, thus increasing a margin. In regard to a column address line, since high-density wiring lines adjacent to each other are used to detect a difference, it can be understood that the same effect can be obtained with respect to global irregularities in resistance.

Since a threshold value of a MOSFET must be controlled in a storage apparatus in which a drive MOSFET is provided in accordance with each cell like a prior art, irregularities in a line width must be suppressed to 10% or below of a line width or preferably 5% or below of the same. On the contrary, using this embodiment can easily constitute a cell without requiring such rigorous line width control.

In the write operation, when "1" is written, a right-side intersecting point of a corresponding cell is first selected by using the row decoder 42 and the column decoder 44, and a predetermined voltage is applied for a predetermined time. Since fine particles may not move by an operation at one time in some cases as described above, the read operation is executed in this state. That is, the right-side intersecting point and the left-side intersecting point are selected by the column decoder 44, and currents flowing through both the selected intersecting points are compared with each other. When a desired state is not attained, the right-side intersecting point is again selected by using the row decoder 42 and the column decoder 44, a predetermined voltage is applied for a predetermined time, and data contents of the corresponding cell are again confirmed. This series of operations is repeated until a desired state is obtained.

Alternatively, a right-side intersecting point of a corresponding cell is selected by using the row decoder 42 and the column decoder 44, and a predetermined voltage is applied for a predetermined time. A left-side intersecting point is additionally selected in this state, currents flowing through both the corresponding intersecting points are detected, and contents of the corresponding cell are read. Further, when a read result is not in a desired state, selection of the left-side intersecting point is canceled while the right-side intersecting point is kept in the selected state. After one or more clock cycles have elapsed, the left-side intersecting point is again set in the selected state, and data contents of the corresponding cell are again confirmed. This series of operations is repeated until a desired state is attained.

In this method, it is possible to reduce the number of times of switching a selected state and a non-selected state by the decoders 42 and 44. In the case of writing "0", counterchanging light and left intersecting points in the case where "1" is written can suffice. First, a left-side intersecting point of a corresponding cell is selected by using the row decoder 42 and the column decoder 44, and a predetermined voltage is applied for a predetermined time. Since fine particles do not move by an operation at one time in some cases as described above, the read operation is executed in this state. That is, the left-side intersecting point and the right-side intersecting point are selected by using the column decoder 44, and currents flowing through both the selected intersecting points are compared with each other. When a desired state is not attained, a left-side intersecting point is again selected by using the row decoder 42 and the column decoder 44, a predetermined voltage is applied for a predetermined time, and data contents of a corresponding cell are again confirmed. This series of operations is repeated until a desired state is obtained.

Alternatively, in the case of reducing the number of times of switching a selected state and a non-selected state by the decoders 42 and 44, a left-side intersecting point of a corresponding cell is selected by using the row decoder 42 and the column decoder 44, and a predetermined voltage is applied for a predetermined time. In this state, a right-side intersecting point is additionally selected, currents flowing through both the corresponding intersecting points are detected, and contents of the corresponding cell are read. Furthermore, when a read result is not in a desired state, the selected state of the right-side intersecting point is canceled while maintaining the selected state of the left-side intersecting point. After one or more clock cycles have elapsed, the right-side intersecting point is set to the selected state, and data contents of the corresponding cell are again confirmed. This series of operations is repeated until a desired state is attained.

As different from the foregoing example, one of characteristics of this scheme lies in that random access is possible in regard to the write operation. It is to be noted that one fine particle is moved in the horizontal direction in one cell in the illustrated example, but the write operation can be effected by holding two or more fine particles in one cell and moving at least one of the fine particles. This is because a bit value is reversed when a magnitude relationship of the number of fine particles at left and right intersecting points is switched in principle of the read operation. For example, if three fine particles exist in one cell, reciprocating one fine particle can form a two-to-one state and one-to-two state in terms of the number of fine particles at left and right intersecting points, and it can be understood that each case corresponds to a bit number "0" or "1".

FIG. 5C shows a scheme which allocates information of one bit to a cell constituted of four intersecting points. According to this scheme, four intersecting points are divided into two pairs each including two intersecting points (B and C) on an upward-sloping diagonal or two intersecting points (A and D) on a downward-sloping diagonal. Information indicating that a corresponding bit is "0" or "1" is stored in accordance with one of the pairs which has more fine particles. Arbitrary properties are provided to association of either pair having more fine particles with a bit value "1". In the illustrated example, the bit value "1" is associated with a case where the number of fine particles existing in the pair on the upward-sloping diagonal is larger than the number of fine particles existing in the pair on the downward-sloping diagonal, and the bit value "0" is associated with a case where the number of fine particles existing in the pair on the upward-sloping diagonal is smaller than the number of fine particles existing in the pair on the downward-sloping diagonal.

This operation of reading bit information is executed by selecting corresponding four intersecting points by the row decoder 42 and the column decoder 44 and associating the bit value "1" or "0" in accordance with a positive or negative sign of a value obtained by subtracting a sum of currents flowing through the pair on the downward-sloping diagonal from a sum of currents flowing through the pair on the upward-sloping diagonal.

Specifically, a current flowing through the intersecting point B is converted into a voltage by using a reference resistance, and then the obtained voltage is input to a positive input port of a differential amplifier. A current flowing through the intersecting point A is converted into a voltage by using the reference resistance, and then the obtained voltage is input to a negative input port of the differential amplifier. Further, detecting an output from the differential amplifier acquires a value obtained by subtracting the number of fine particles existing at the intersecting point A from the number of fine particles existing at the intersecting point B, and this value (the intersecting point B—the intersecting point A) is temporarily stored in a driver. Then, a current flowing through the intersecting pint D is converted into a voltage by using the reference resistance, and then the converted voltage is input to the positive input port of the differential amplifier. A current flowing through the intersecting point C is converted into a voltage by using the reference resistance, and then the converted voltage is input to the negative input port of the differential amplifier. Furthermore, detecting an output from the differential amplifier acquires a value (the intersecting point D—the intersecting point C) obtained by subtracting the number of fine particles existing at the intersecting point C from the number of fine particles existing at the intersecting point D.

Subsequently, the value of (the intersecting point D—the intersecting point C) is subtracted from the value of (the intersecting point B—the intersecting point A) temporarily stored in the driver, thereby acquiring a value of (the intersecting point B+the intersecting point C—the intersecting point A—the intersecting point D). The bit value "1" or "0" is associated in accordance with a positive or negative sign of this value.

Since this read method uses a difference between currents flowing through the common row and column address line to judge a bit value, accurate detection is possible even in a case where irregularities or the like exist in the resistances of the row and column lines, thus increasing a margin. A threshold value of an MOSFET must be controlled in a storage apparatus in which a drive MOSFET is provided in accordance with each cell like a prior art, and hence irregularities in line width must be suppressed to 10% or below of a line width, or preferably 5% or below of the line width. On the contrary, using this embodiment can readily constitute a cell without requiring such rigorous line width control.

As to a write operation, in the case of writing "1", an intersecting point B and an intersecting point C of a corresponding cell are sequentially selected by using the row decoder 42 and the column decoder 44, and a predetermined voltage is applied. As different from the foregoing example, applying the voltage to the intersecting point B at one time and applying the voltage to the intersecting pint C at one time complete the write operation. That is because fine particles on a row address line move in a direction along the row address line and fine particles on a column address line move in a direction along the column address line. For example, the fine particle existing at the intersecting point A can move by attracting fine particles from two directions of the intersecting point B and the intersecting point C even when the fine particle exists on a row address line and even when the fine particle exists on a column address line.

Incidentally, in order to increase reliability of storage, the read operation may be carried out immediately after the write operation to confirm that written information is appropriately stored. Likewise, in the case of writing "0", it is good enough to sequentially select an intersecting point A and an intersecting point D of a corresponding cell by the row decoder 42 and the column decoder 44 and then apply a predetermined voltage. Applying the voltage to the intersecting point A at one time and applying the voltage to the intersecting point D at one time complete the write operation.

As described above, this scheme has an advantage of readily executing the write operation in a short time. Moreover, one of characteristics of this scheme also lies in that random access is possible in both the read operation and the write operation. It is to be noted that reciprocating two fine particles between pairs on different diagonals in one cell is shown in the illustrated example, but the write operation is also possible by holding one, three or more fine particles in one cell and reciprocating at least one of the fine particles. That is because a bit value is reversed when a magnitude relationship of the number of fine particles existing in pairs on different diagonals is counterchanged in principle of reading.

As described thus far, in this embodiment, although electric charges are used in reading/writing information, existence information of a fine particle rather than a stored electric charge is utilized for storage. Therefore, this embodiment is characterized in that stored contents are hardly affected by natural radiation. Additionally, since a size of each fine particle is of the 10 nm order, like the foregoing example, a gravitational force acting on each fine particle is as small as approximately $10^{-18}$ N, and movements of each fine particle due to the gravitational force acting on the fine particle or an external impact shock can be ignored. Of course, magnetic properties are not utilized, and hence it is possible to provide a storage apparatus which is hardly affected by a disturbance caused by an influence of a magnetic field.

Figure 7:
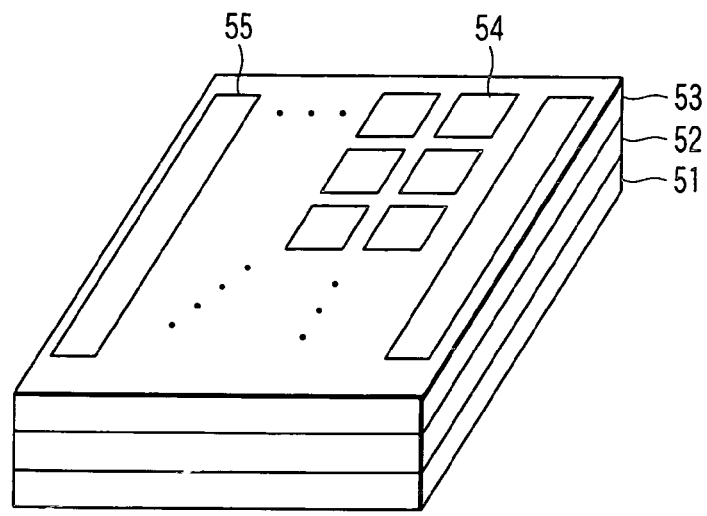
FIG. 7 is a perspective view showing an entire structure of another storage apparatus according to the present invention.

FIG. 7 is a perspective view showing an entire structure of a storage apparatus according to a second aspect of a prior application.

A CMOS circuit 52 including a wiring line layer is constituted on a regular Si substrate 51 by a usually adopted process, and a layer 53 including a plurality of memory cell portions 54 is formed thereon. Each memory cell portion 54 in FIG. 7 corresponds to the memory cell array 41 in FIG. 6, and a portion which includes the driver/decoder and the upper block in FIG. 6, called a peripheral circuit in a regular memory, is included in the CMOS circuit 52 in FIG. 7.

It is to be noted that the CMOS circuit 52 has been designed and manufactured based on a 90-nm design rule which is loose as compared with that of a wiring line of the memory cell portion 54 except a connecting portion between the CMOS circuit 52 and the memory cell portion 54. One memory cell portion 54 occupies a region which is approximately 11 μm×11 μm, and includes 256×256 intersecting points. An electrical connecting portion with respect to the CMOS circuit 52 is provided around each memory cell portion 54, and blocks in units of each of these memory cell portions 54 and the peripheral connecting portion are arranged in a matrix form. Further, through-holes are formed in the layer 53 including the memory cell portion 54, and an input/output portion 55 of an apparatus which is constituted of a terminal having electrical connection with an input/output portion of the CMOS circuit 52 is formed at a peripheral portion of the layer 53 including the memory cell portions 54 as shown in FIG. 7.

Adopting such a structure can allow an insulating film formed in the memory cell portion 54 to also function as a protection film for the CMOS circuit 52. On the other hand, since each memory cell portion 54 is coupled with the CMOS circuit 52 in the vertical direction, an operating time can be reduced or the number of cells to/from which information can be written/read at the same time can be greatly increased without enlarging a chip area. It is to be noted that the input/output portion 55 of the apparatus is bonded to a lead frame in a packaging process like a regular semiconductor device.

Furthermore, since 256×256 intersecting points exist in one memory cell portion 54 as described above, information of 128×128=16384 bits can be allocated in the case of allocating information of one bit to a cell constituted of four intersecting points. However, in order to improve reliability of a memory, an error correcting code bit may be assigned and used with respect to a part of bits. For example, when an error correction code bit of one bit is allocated to each eight bits of input/output data with respect to the outside, net information of approximately 14336 to 14563 bits is allocated in the same array. As a result, an amount of information which can be stored in the same array is reduced, but the reliability of the memory can be greatly improved.

An error correction code can be arranged in the same row in the memory cell portion 54, arranged in the same memory cell 54, or distributed and arranged together with data in the plurality of memory cell portions 54. An arrangement to be adopted can be determined by the CMOS circuit 52. In order to read/write data at a high speed, it is desirable to arrange the error correction code in the same row in the memory cell portion 54. In order to increase redundancy of data, it is desirable for data to be distributed in a range which is wide as possible. Therefore, distributing and arranging the error correction code in the plurality of memory cell portions 54 is advantageous. Arranging the error correction code in the same memory cell portion 54 has characteristics of both the arrangements.

Moreover, like a regular memory, providing a preliminary row and column wiring lines in the memory cell portion 54 in accordance with a redundancy circuit which rescues a defect in manufacture can improve a production yield. In this embodiment, since a size of one memory cell portion 54 is as small as approximately 11 μm×11 μm, providing a preliminary memory cell portion 54 can make use of collectively counterchanging a block including 256×256 intersecting points in terms of a circuit, thereby remedying a defect.

Further, in addition to a redundancy circuit, arranging a row wiring line or a column wiring line which is not used as a storage region or both a row wiring line and a column line in a peripheral portion of the memory cell portion 54 can assure a region in which fine particles are supplied or stored when fine particles are insufficient or superfluous in the memory cell portion 54. A circuit such as a row decoder, a column decoder or a driver is connected with this region like a portion used as a storage region, and there is no difference in appearance. An upper level block of the CMOS circuit 52 gives a functional difference, and is specifically utilized in the following initializing procedure.

First, currents which flow through the respective intersecting points in the memory cell portion 54 are measured by sequentially applying a predetermined voltage, and the number of fine particles existing at the respective intersecting points is measured. Then, if the number of fine particles is insufficient in a portion which is used as a storage region, the fine particles are sequentially moved to an adjacent intersecting point to eliminate insufficiency. At this time, if there is the number of fine particles is insufficient in the entire storage region, fine particles are supplied from a custody region other than the storage region. On the contrary, if there is an excess of fine particles in the entire storage region, fine particles are accommodated in a custody region other than the storage region. Finally, the number of fine particles existing at intersecting points in the storage region is again measured to confirm that a predetermined number of fine particles is achieved.

A description will now be given as to embodiments of the present invention which further develop the technologies mentioned above.

First Embodiment

Figure 8:
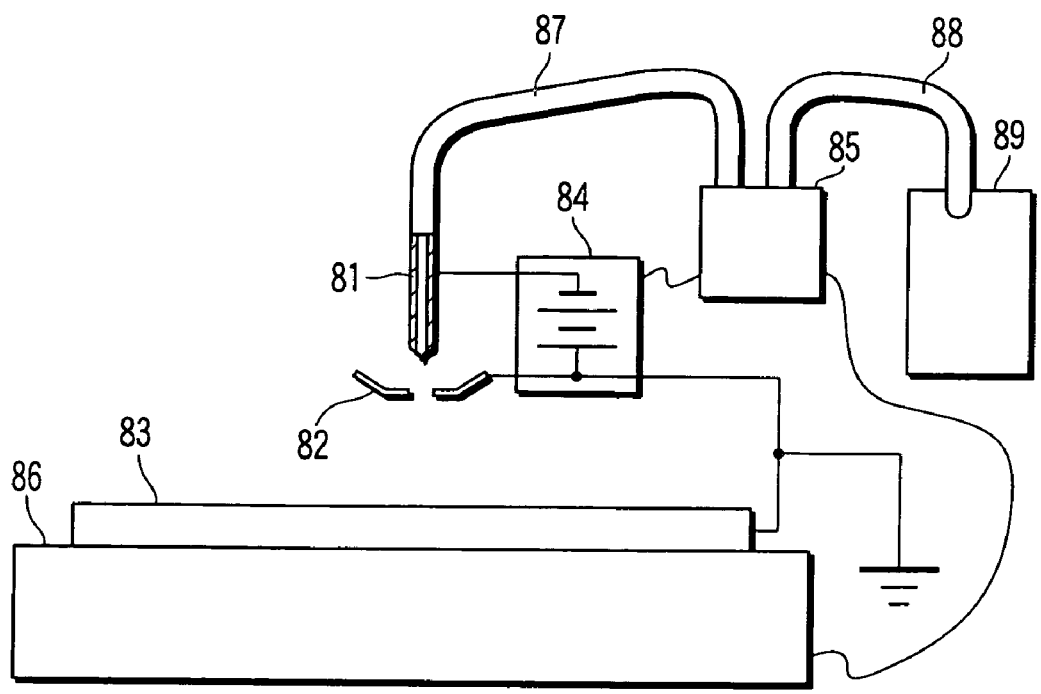
FIG. 8 is a schematic structural view showing a fine particle distribution apparatus according to a first embodiment of the present invention.

A fine particle distribution apparatus shown in FIG. 8 is used in a manufacturing process of the storage apparatus of the present invention.

Reference numeral 81 in the drawing designates a hollow needle electrode which dispenses a solvent in which fine particles are dispersed, and a base end side of this electrode is connected with a later-described pipe so that a liquid solution is dispensed from a supply port on a leading end side. Additionally, an electric field can be applied to the supply port of the needle electrode 81 on the leading end side.

Reference numeral 82 denotes an extraction electrode which forms an electric field at the supply port of the needle electrode 81 on the leading end side; 83, a substrate corresponding to the first substrate 10 described in conjunction with the embodiment of the prior application; 84, a voltage control portion which applies an electric field to a space between the needle electrode 81 and the extraction electrode 82 or the substrate 83; 85, a solution dispensing pump; 86, a substrate stage on which the substrate 83 is mounted; 87 and 88, pipes; and 89, a raw material container.

Here, the voltage control portion 84 applies an electric field to a droplet dispensed from the supply opening of the needle electrode 81 on the leading end side to charge the droplets. An intensity of the electric field for this charging is adjusted in such a manner that a repulsive force caused due to charging becomes larger than the surface tension of the droplet before the droplet reaches the substrate.

Fine particles are supplied to the hollow needle electrode 81 as a supply port in a state where they are dispersed in a solvent, turned to a small droplet to be dispensed by an electric field between the hollow needle electrode 81 and the extraction electrode 82, and it advances toward the substrate 83. Since the small droplet has a large ratio of a surface area to a volume, solvent molecules are rapidly vaporized from the surface. Furthermore, since a surface of the small droplet dispensed by the electric field as described above is charged with a large amount of electric charges, a repulsive force acting between electric charges becomes very large to exceed the surface tension of the droplet. Then, the droplet is divided into several small droplets, and vaporization of the solvent molecules further advances. Moreover, this process is repeated. As a result, the droplet breaks into pieces at once, thereby providing a state where the electric charge has moved to the fine particles. Therefore, the fine particles are charged with the electric charges to discretely independent states before reaching the substrate 83, and come to the upper side of the substrate 83 in the dispersed state without being recombined due to the repulsive force between the electric charges.

On the contrary, when the solvent droplet in which fine particles are dispersed is simply dropped onto the substrate 83 without utilizing an electric field, vaporization of solvent molecules occurs on the substrate. However, since the surface tension of the droplet is dominant, a gap between the fine particles is narrowed as a size of the droplet is reduced. Further, after the solvent is completely vaporized, the fine particles are agglomerated and remained in that state. After forming electrodes, when a voltage is sequentially applied to the electrodes, the agglomerated fine particles are separated from an end portion and aligned, and initialization is performed. As a result, a storage apparatus is available. However, according to the previously-described method, this process can be greatly simplified.

As shown in FIG. 8, an electric field applied to a space between the hollow needle electrode 81 and the extraction electrode 82 is controlled by a voltage output from the voltage control portion 84. It is to be noted that the voltage control portion 84 can also control a voltage between the extraction electrode 82 and the substrate 83 to adjust a kinetic energy of fine particles which come to the upper side of the substrate 83. Furthermore, the voltage control portion 84 can perform control in association with the solution dispensing pump 85 and the substrate stage 86, and it can increase a voltage to disperse fine particles when a desired position on the substrate becomes a point to which fine particles arrive by the substrate stage 86. Moreover, the solution dispensing pump 85 is configured to adjust a dispensing amount in accordance with a dispersion amount of fine particles.

A fluorocarbon resin, which is a high-insulation synthetic resin, is used for the pipe 87 which connects the needle electrode 81 with the solution dispensing pump 85 in order to isolate other portions from a voltage applied to the needle electrode 81. Additionally, the fluorocarbon resin, which is the same material as that of the pipe 87, is also used for the pipe 88 which connects the raw material container 89 which stores a solvent having fine particles dispersed therein with the solution dispensing pump 85. This is because the fluorocarbon resin is superior in low dust emission properties and has good manufacturing process compatibility with respect to such a storage apparatus according to this embodiment.

It is to be noted that the plurality of hollow needle electrodes 81 and extraction electrodes 82 can be provided and aligned in a linear or two-dimensional array in order to improve productivity. In this case, it is possible to adopt both a technique by which the voltage control portion 85 has a plurality of outputs and controls a voltage of each electrode pair to improve controllability of each electrode pair and a technique by which the voltage control portion 85 has one output alone and collectively controls voltages of all electrode pairs to reduce an apparatus cost.

Figure 9:
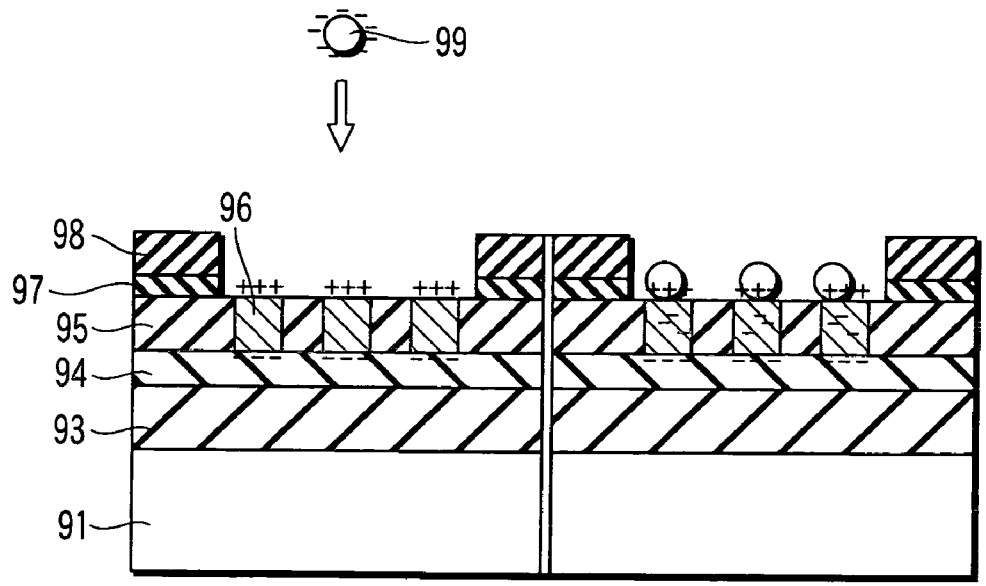
FIG. 9 is a schematic view illustrating an operation of the first embodiment.

FIG. 9 is a schematic explanatory view showing how charged fine particles come to the upper side of the substrate in an enlarged manner. In the substrate, an Si substrate 91 as an underlying substrate, an $SiO_2$ film 93 having a film thickness of 100 nm, an $Si_3N_4$ film 94 having a film thickness of 20 nm, an $SiO_2$ film 95 having a film thickness of 30 nm, an $Si_3N_4$ film 97 having a film thickness of 20 nm and an $SiO_2$ film 98 having a film thickness of 40 nm are formed from the lower side, and an aluminum wiring pattern 96 is formed in the $SiO_2$ film 95.

As shown in the left side of FIG. 9, when a fine particle charged to have a negative polarity approaches this substrate, many positive polarization charges appear on the aluminum surface as a conductor than the $SiO_2$ film or the $Si_3N_4$ film as an insulator. Therefore, the fine particle 99 is drawn onto the wiring pattern 96, and automatically arranged on the wiring line, which is a desired position, without agglomeration. A desired deposition amount of the fine particle 99 is obtained by controlling the voltage application time in accordance with the measured relationship between the deposition amount and the voltage application time in advance.

Here, the right side of FIG. 9 shows a status where the fine particles 99 are excessively dispersed. Since the fine particles 99 bring negative charges in the wiring pattern 96, the entire wiring lines are changed to have a negative polarity. Then, a repulsive force having an intensity which cancels out an attracting force from positive charges by polarization is generated as the fine particles 99 are stored. Therefore, excessively supplied fine particles 99 are arranged at positions other than the wiring lines, but such fine particles 99 become wasteful fine particles 99 which cannot be utilized as a storage apparatus as they are. In order to avoid this, after neutralization of the charged state by natural discharge or forced discharge using an ionizer, additional dispersion must be carried out. However, such a process can be utilized for application of the fine particles 99 in another mode as described below.

First, a solvent including no fine particle 99 alone is supplied while reversing a polarity of a voltage between the hollow needle electrode 81 and the extraction electrode 82 in the mechanism shown in FIG. 8. At this time, a solvent droplet electrified to have a positive polarity is discharged and sequentially vaporized from the surface. As a result, like the example including the fine particles 99, the droplet is divided into several small drops, and vaporization of solvent molecules further advances. Therefore, the liquid droplet breaks into small pieces at once. However, since the fine particles 99 are not included, an electric charge cannot be transferred when the last solvent molecule is vaporized, and the solvent molecule itself is ionized to have a positive polarity and reaches the substrate 83 in this state. At this time, positive and negative polarities are reversed from those in FIG. 9, but a positive ion is drawn onto the electrode by a polarization charge which appears on the electrode surface, and the electrode is charged to have a positive polarity.

When the fine particles 99 charged to have a negative polarity are dispersed in this state by using the mechanism shown in FIG. 8 as described above, the attracting force acting on the fine particles 99 and the electrode surface is further increased due to the polarization charge and the charged electrode having the positive polarity. Even if a small amount of the fine particles 99 arrive to bring a negative charge, it is consumed for neutralization of the charge. Therefore, more fine particles 99 can be diffused on the electrode before the electrode is charged to have a negative polarity.

It is to be noted that this process can be performed by not only switching a solution supplied to one pair of the hollow needle electrode 81 and the extraction electrode 82 but also a technique by which a plurality of pairs of the hollow needle electrode 81 and the extraction electrode 82 and the voltage control portion 85 are provided and these pairs are divided into pairs which ionize a solvent alone to perform diffusion and pairs which charge the fine particles 99 with a negative polarity to effect deposition, thereby continuously performing deposition while moving on the substrate in parallel.

Second Embodiment

In the second embodiments, there will be described a manufacturing process of a storage apparatus, using the fine particle distribution apparatus explained in the first embodiment.

Figure 10A:
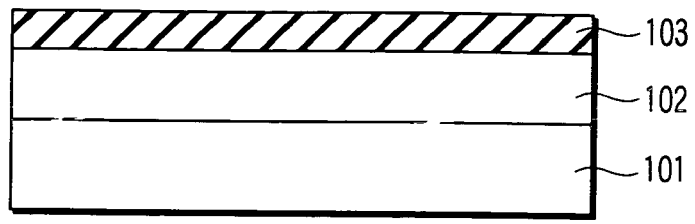
FIGS. 10A to 10E are cross-sectional views showing a manufacturing process of a first portion in a storage apparatus according to a second embodiment step by step.

First, as shown in FIG. 10A, a desired CMOS circuit 102 is formed on one main surface of an Si substrate (a first substrate) 101 having a thickness of 625 μm by using a regular CMOS process, and an $SiO_2$ film 103 having a film thickness of 30 nm as a dielectric film is formed on this substrate by a CVD method using TEOS as a main raw material. It is to be noted that the CMOS circuit 102 includes connection lines with respect to memory cell arrays in addition to regular MOSFETs and multilayer wiring lines.

Figure 10B:
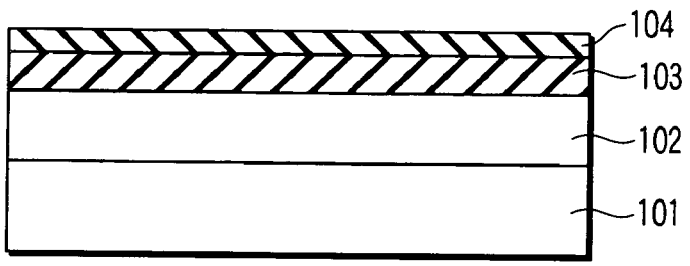
Figure 10C:
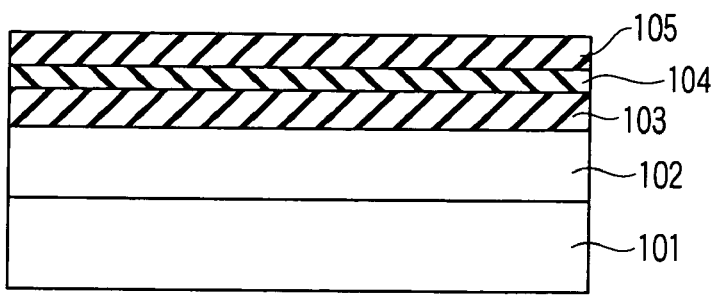

Subsequently, as shown in FIG. 10B, an LPCVD method using dichlorosilane and ammonia as main raw materials is used to form an $Si_3N_4$ film 104 having a film thickness of 20 nm. Then, as shown in FIG. 10C, the CVD method using TEOS as a main raw material is again used to form an $SiO_2$ film having a film thickness of 30 nm.

Figure 10D:
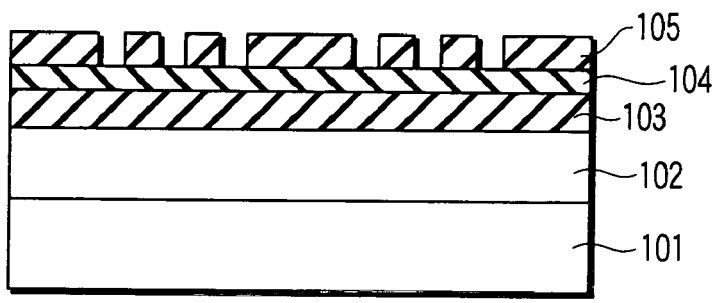
Figure 10E:
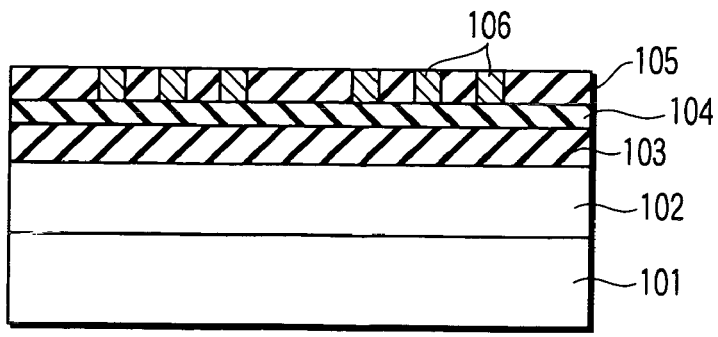

Then, as shown in FIG. 10D, an imprint lithography technique is used to form a resist pattern (not shown) having a pitch of 40 nm, and the $SiO_2$ film 105 is patterned by reactive ion etching (RIE) using $CHF_3$ and CO gases with the obtained resist pattern being used as a mask. Subsequently, as shown in FIG. 10E, after an Al film is formed by a sputtering technique, so-called reflow processing is carried out to agglomerate and embed the Al film 106 in pattern grooves, and the excessive Al film 106 is removed by a CMP method.

Figure 11A:
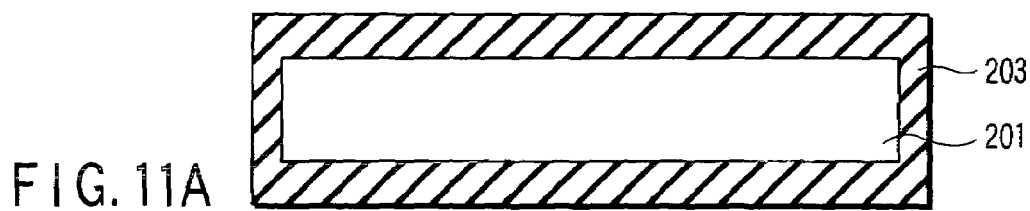
FIGS. 11A to 11P are cross-sectional views showing a manufacturing process of a second portion in the storage apparatus according to the second embodiment step by step.
Figure 11B:
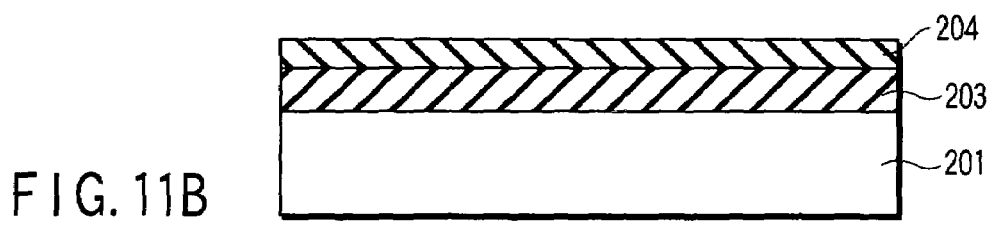
Figure 11C:
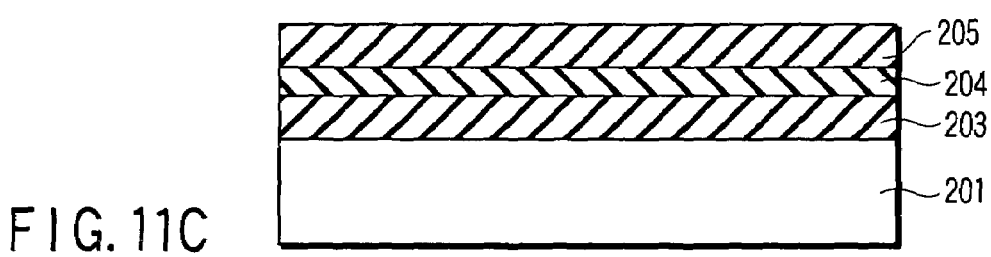

On the other hand, as shown in FIG. 11A, another Si substrate (a second substrate) 201 which has a thickness of 625 μm and subjected to cleaning processing using a dilute hydrofluoric acid is prepared, and a thermally-oxidized film (an $SiO_2$ film) 203 having a film thickness of 100 nm is formed on an entire surface of this substrate 201 at a temperature of 950° C. Subsequently, as shown in FIG. 11B, an $Si_3N_4$ film 204 having a film thickness of 20 nm is formed by the LPCVD method using dichlorosilane and ammonia as main raw materials, and then the $Si_3N_4$ film 204 and the $SiO_2$ film 203 on a rear surface side are removed off. Thereafter, as shown in FIG. 1C, an $SiO_2$ film 205 having a film thickness of 30 nm as a dielectric film is formed on the $Si_3N_4$ film 204 on the substrate front surface side by the CVD method using TEOS as a main raw material.

Figure 11D:
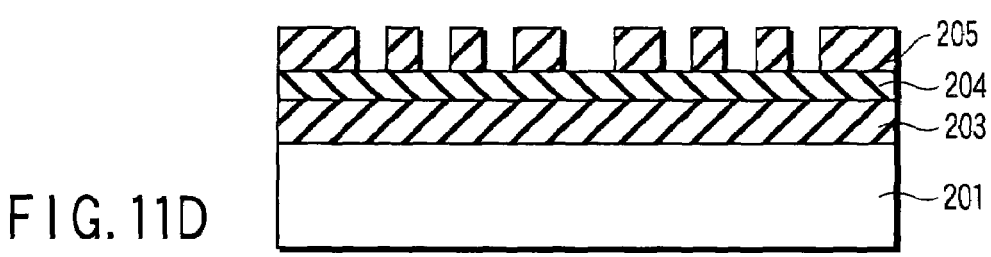
Figure 11E:
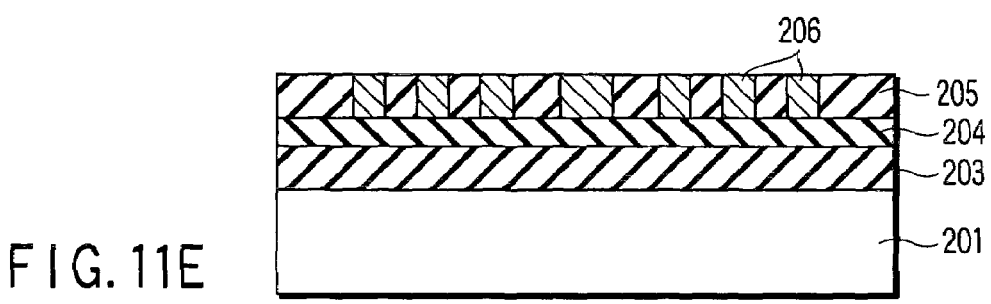

Subsequently, as shown in FIG. 11D, the imprint lithography technique is used to form a resist pattern (not shown) having a pitch of 40 nm, and the $SiO_2$ film 205 is patterned by reactive ion etching using $CHF_3$ and CO gases with the obtained resist pattern being utilized as a mask. Thereafter, as shown in FIG. 11E, after an Al film is formed by the sputtering method, so-called reflow processing is carried out, the Al film 206 is agglomerated and embedded in pattern grooves, and then the excessive Al film 206 is removed by the CMP method.

Figure 11F:
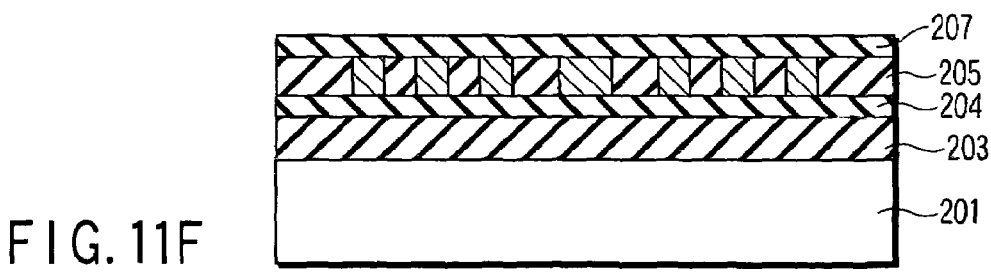
Figure 11G:
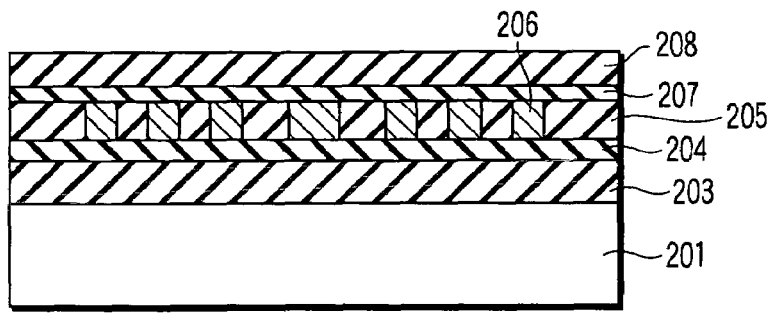

Then, as shown in FIG. 11F, an $Si_3N_4$ film 207 having a film thickness of 20 nm is formed by plasma nitriding and the LPCVD method using dichlorosilane and ammonia as main raw materials. Subsequently, as shown in FIG. 11G, an $SiO_2$ film 208 having a film thickness of 40 nm is formed as a dielectric film by the CVD method using TEOS as a main raw material.

Figure 11H:
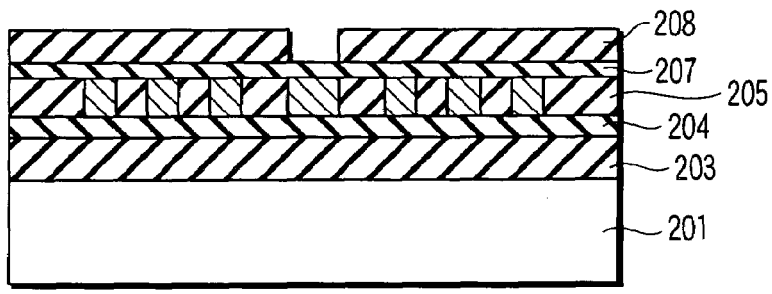
Figure 11I:
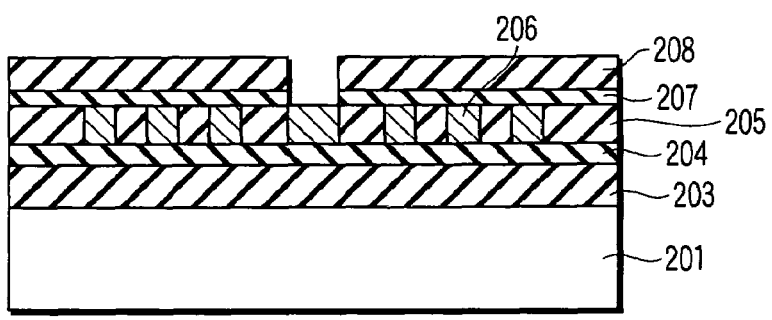

Then, as shown in FIG. 11H, a connecting portion with respect to the CMOS circuit is patterned by the photolithography process, and the $SiO_2$ film 208 is patterned by reactive ion etching using $CHF_3$ and CO gases with a resist pattern (not shown) being utilized as a mask. Subsequently, as shown in FIG. 11I, the $Si_3N_4$ film 207 is patterned by reactive ion etching using $CHF_3$, $CF_4$ and $O_2$ gases.

Figure 11J:
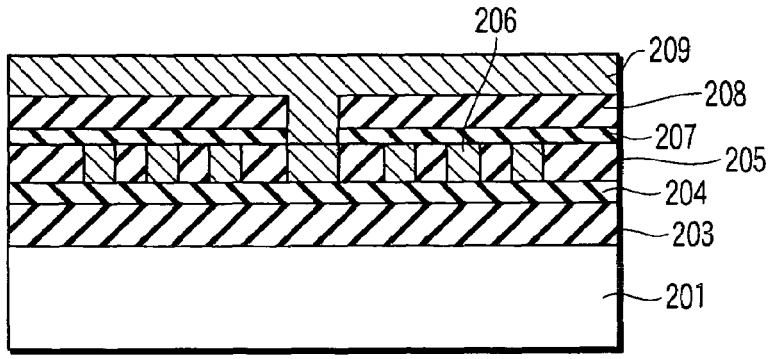
Figure 11K:
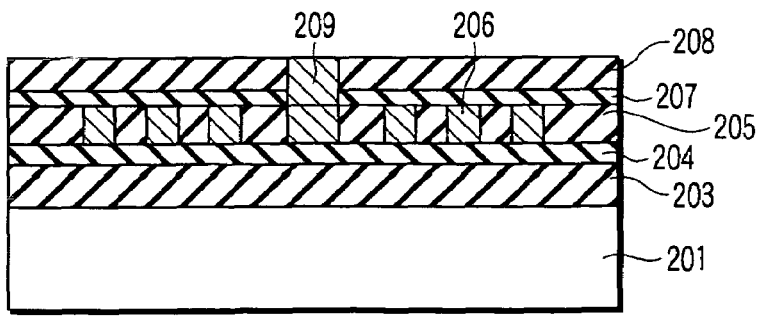

Then, as shown in FIG. 11J, after an Al film 209 is again formed by the sputtering method, so-called reflow processing is carried out, and Al is agglomerated and embedded in an obtained opening portion. Subsequently, as shown in FIG. 11K, the excessive Al film 209 is removed by the CMP method.

Figure 11L:
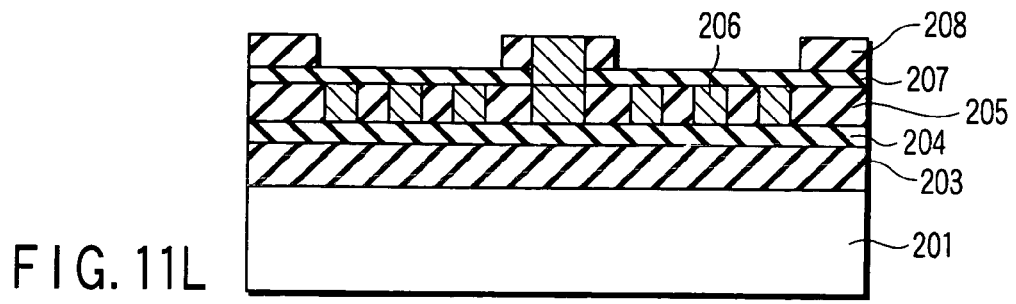
Figure 11M:
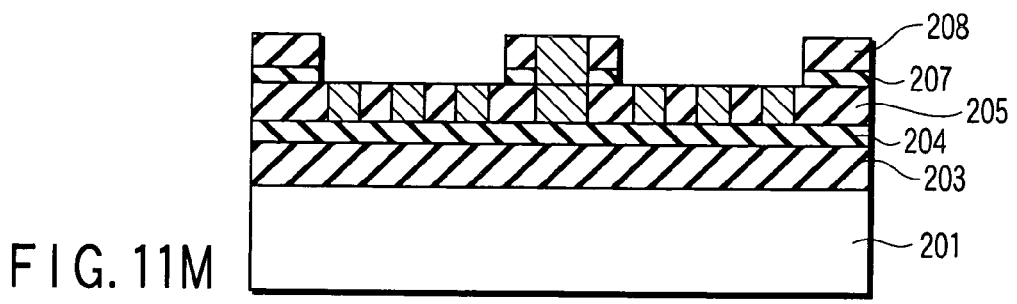

Then, as shown in FIG. 11L, a memory cell array portion is patterned by the photolithography process, and the $SiO_2$ film 208 is patterned by reactive ion etching using $CHF_3$ and CO gases with a resist pattern being utilized as a mask. Thereafter, as shown in FIG. 11M, the $Si_3N_4$ film 207 is patterned by reactive ion etching using $CHF_3$, $CF_4$ and $O_2$ gases.

Figure 11N:
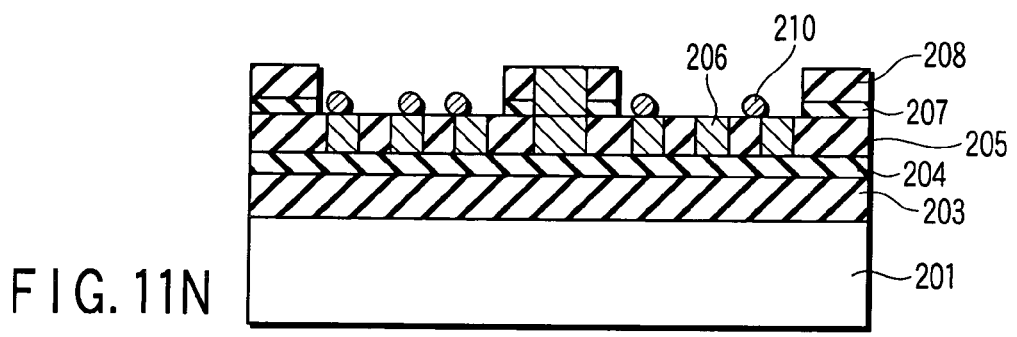
Figure 11O:
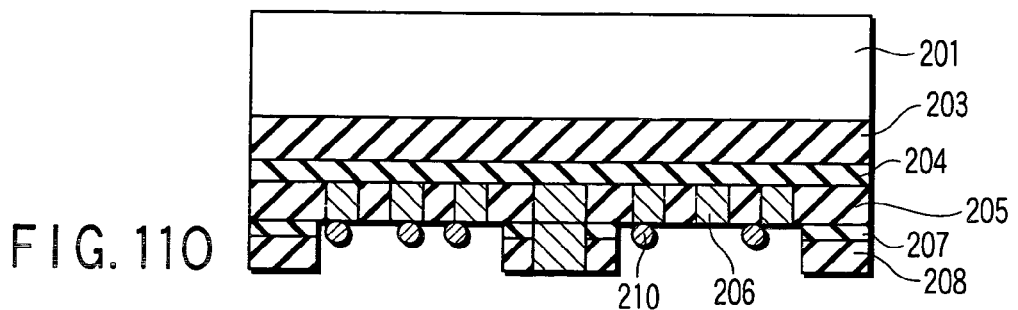

Then, as shown in FIG. 11N, a solution, in which colloidal silica particles with a particle diameter of 14 nm formed by a reverse miscelle method are dispersed in isopropyl alcohol, is diffused by an apparatus having the structure shown in FIG. 8, and a desired quantity of fine particles 210 is arranged on wiring lines in the memory cell array portion. Then, as shown in FIG. 11O, the obtained substrate is turned upside down. Subsequently, as shown in FIG. 11P, the substrate is rotated in such a manner that the wiring lines face a predetermined direction.

Figure 11P:
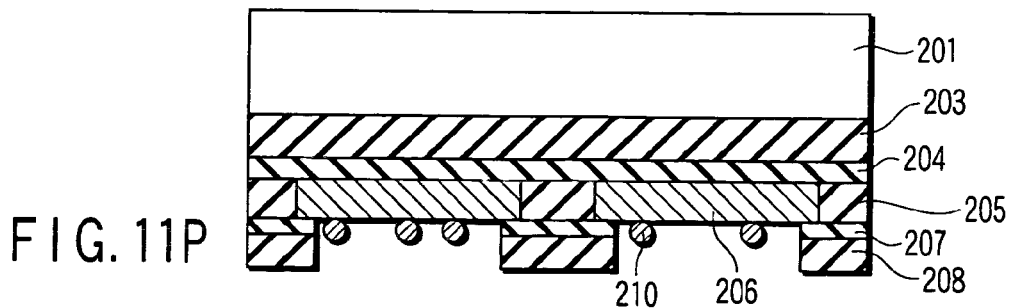
Figure 12:
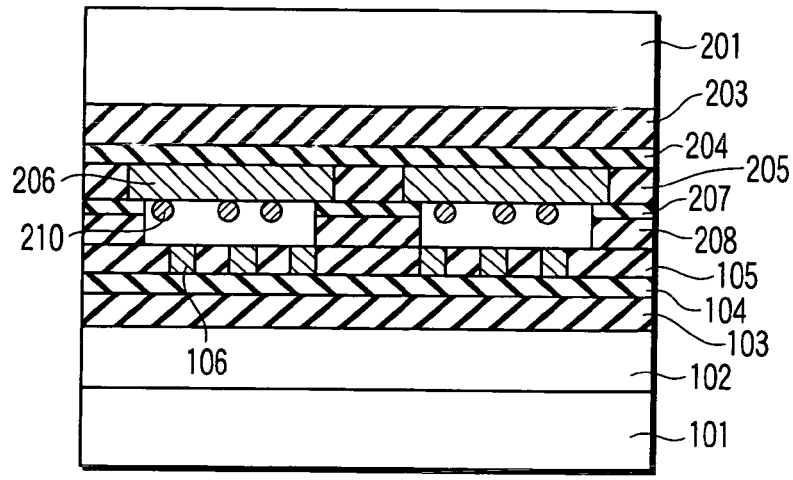
FIG. 12 is a cross-sectional view of the storage apparatus showing a state where the first portion and the second portion are superimposed.

Then, as shown in FIG. 12, the substrate obtained in FIG. 10E and the substrate acquired in FIG. 11P are positioned, and the two substrates are attached by direct bonding in a dry nitrogen atmosphere under one barometric pressure. Subsequently, in order to assure strength of direct bonding, a heat treatment is carried out for one hour in a nitrogen atmosphere at 200° C. after bonding. Finally, the Si portion of the upper substrate 201 is removed by polishing, and a wiring connecting portion which serves as an input/output portion is formed. Thereafter, a so-called post-process such as an inspection or dicing is executed, thereby bringing the storage apparatus to completion.

As described above, according to this embodiment, when arranging fine particles on the substrate, such an apparatus as shown in FIG. 8 is used to discharge a solution, in which colloidal silica particles are dispersed in isopropyl alcohol, as a droplet, from a supply port of a needle hollow electrode 81 having an electric field applied thereto. As a result, fine particles are electrically charged, and the droplet is divided into pieces and dispersed with vaporization of a solvent. The fine particles are arranged on the substrate without being recombined due to a repulsive force between electric charges. Therefore, the fine particles can be prevented from agglomeration, thus improving a manufacturing efficiency.

Third Embodiment

Figure 13A:
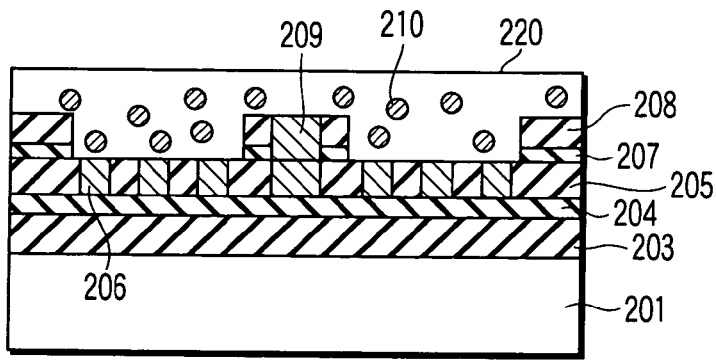
FIGS. 13A to 13C are cross-sectional views showing a manufacturing process of a storage apparatus according to a third embodiment.
Figure 13B:
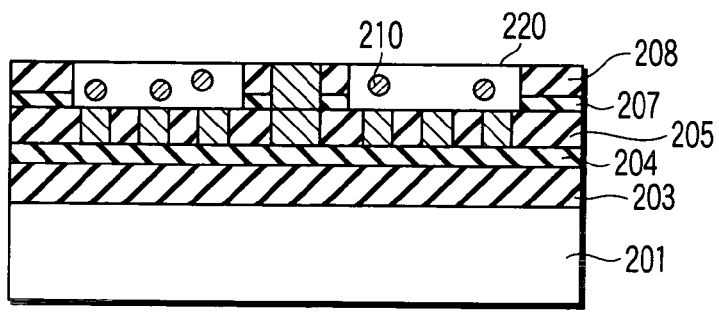
Figure 13C:
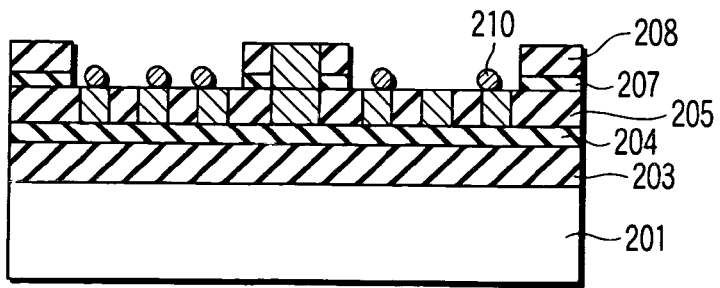

In FIGS. 13A to 13C, showing a manufacturing process of a storage apparatus according to a third embodiment of the present invention, it is to be noted that like reference numerals denote parts equal to those in FIGS. 11 and 12, thereby eliminating their detailed explanation.

This embodiment is different from the manufacturing method described in conjunction with the second embodiment, and provides a method of manufacturing a storage apparatus without using a special fine particle distribution apparatus.

According to the manufacturing method of a storage apparatus described in conjunction with the fourth embodiment, it is possible to suppress excess or deficiency of fine particles for realization of a function of the storage apparatus or wasteful consumption such as emission of fine particles to the outside of a substrate at the time of dispersion, but such a novel apparatus as shown in FIG. 8 is required. However, introduction of the novel apparatus requires tremendous cost, such as an expense for installation in a clean room in addition to a cost of the apparatus main body. Therefore, it is desirable to perform manufacture by utilizing an existing facility if possible. Accordingly, this embodiment provides a technique which utilizes a spin coater and a CMP apparatus to disperse fine particles on a substrate without agglomeration.

Since a solution in which fine particles are simply diffused in a solvent such as an organic solution or water has low viscosity, even if regular spin coating is tried, it is difficult to form a homogeneous film. Thus, polyvinyl alcohol as a highly viscous resin is added as means for adjusting viscosity. When viscosity is increased, even if fine particles are to be agglomerated, they are prevented from being agglomerated by a viscosity resistance, thus avoiding agglomeration. Further, polyvinyl alcohol can perform not only adjustment of viscosity in an extensive range, but has characteristics that it can be readily dissolved in water having a high temperature but its dissolution speed is not very high with respect to water having a temperature close to a room temperature. This results in an advantage that removing is possible in an inexpensive easy-to-use solvent, which is high-temperature water, when recoating must be performed for some reason and an embedded shape can be formed by the CMP method using water as a solution in the vicinity of a room temperature.

Solubility with respect to water is further reduced by a heat treatment, and swelling can be suppressed by a heat treatment at approximately 100 to 180° C. Furthermore, since polyvinyl alcohol has a very small environmental load, it can be easily processed after use. Moreover, fine particles alone can be extracted from a mixture of polyvinyl alcohol and fine particles and left on the substrate by generally used ashing process utilizing an oxygen gas, which can remove polyvinyl alcohol alone.

Specifically, a solution in which colloidal silica particles with a particle diameter of 14 nm formed by the reverse miscelle method is prepared, and by adding a solution of polyvinyl alcohol having an average degree of polymerization of 1800, the coating solution in which 3 wt % of polyvinyl alcohol is contained is prepared. This substrate is spin-coated with this solution by using a regular spin coater at 2000 rpm. After coating, a heat treatment is performed for 15 minutes at 180° C., thereby forming a mixed film in which colloidal silica particles are dispersed in a polyvinyl alcohol resin film. At this time, since the solution as a raw material has high viscosity, homogeneity of coating is excellent. It is to be noted that patterning is previously performed in such a manner that a position where a fine particle should be arranged becomes a concave portion.

Then, water kept in the vicinity of a room temperature is used to polish a surface of the mixed film containing the polyvinyl alcohol film and the fine particles by the CMP method. When polyvinyl alcohol is polished/dissolved, the fine particle contained in this portion is also released. Therefore, at the end of CMP, the mixed film remains in the previously formed concave portion alone. Additionally, removing polyvinyl alcohol alone by plasma ashing process using an oxygen gas can arrange the fine particles in the previously formed concave portion alone without agglomeration.

In regard to the entire manufacturing process, like FIGS. 10A to 10E, a CMOS circuit 102 is formed on one main surface of an Si substrate 101, and an $SiO_2$ film, an $Si_3N_4$ film and an $SiO_2$ film 105 are formed on this circuit. Subsequently, the $SiO_2$ film 105 is patterned, and then an Al film 106 is embedded and formed in each pattern groove.

Further, like FIGS. 11A to 11M, a thermally-oxidized film 203, an $Si_3N_4$ film 204 and an $SiO_2$ film 205 are formed on another substrate 201, and then the $SiO_2$ film 205 is patterned and the Al film 206 is embedded and formed in each pattern groove. Subsequently, an $Si_3N_4$ film 207 and an $SiO_2$ film 208 are formed, then the $SiO_2$ film 208 is patterned in order to pattern a connecting portion with respect to the CMOS circuit, and the $Si_3N_4$ film 207 is further patterned. Thereafter, an Al film 209 is embedded and formed, then the $SiO_2$ film 208 is patterned in order to pattern a memory cell array portion, and the $Si_3N_4$ film 207 is further patterned.

Then, as shown in FIG. 13A, a solution including fine particles 210 is applied and formed on a substrate having the structure shown in FIG. 1M. That is, an application liquid obtained by mixing 3 wt % of polyvinyl alcohol having an average degree of polymerization of 1800 in a solution having colloidal silica particles with a particle diameter of 14 nm formed by the reverse miscelle method dispersed in pure water is applied with a regular spin coater at 2000 rpm. After application, a heat treatment is carried out at 180° C. for 15 minutes, thereby forming a mixed film 220 including polyvinyl alcohol and the fine particles 210.

Then, as shown in FIG. 13B, the excess mixed film 220 is removed by the CMP method using pure water maintained at a room temperature. Subsequently, as shown in FIG. 13C, polyvinyl alcohol is removed by plasma ashing process using an oxygen gas so that the fine particles 210 alone remain on the substrate.

Then, like FIG. 11O, the obtained substrate is turned upside down. Subsequently, like FIG. 11P, the substrate is rotated in such a manner that wiring lines face a predetermined direction.

Furthermore, like FIG. 12, the substrate obtained in FIG. 10E and the substrate acquired in FIG. 13C are positioned, and the two substrates are attached by direct bonding in a dry nitrogen atmosphere under one barometric pressure. Then, in order to assure strength of direct bonding, a heat treatment is carried out in a nitrogen atmosphere at 200° C. for one hour after bonding. Finally, the Si portion of the upper substrate is removed by polishing to form a wiring connecting portion which serves as an input/output portion, and then a so-called post-process such as an inspection or dicing is executed, thereby bringing the storage apparatus to completion.

Fourth Embodiment

The storage apparatus according to the forth embodiment utilizes a position of a particle at an intersecting portion of a word line and a bit line as storage information like the apparatus shown in FIG. 1.

Figure 14:
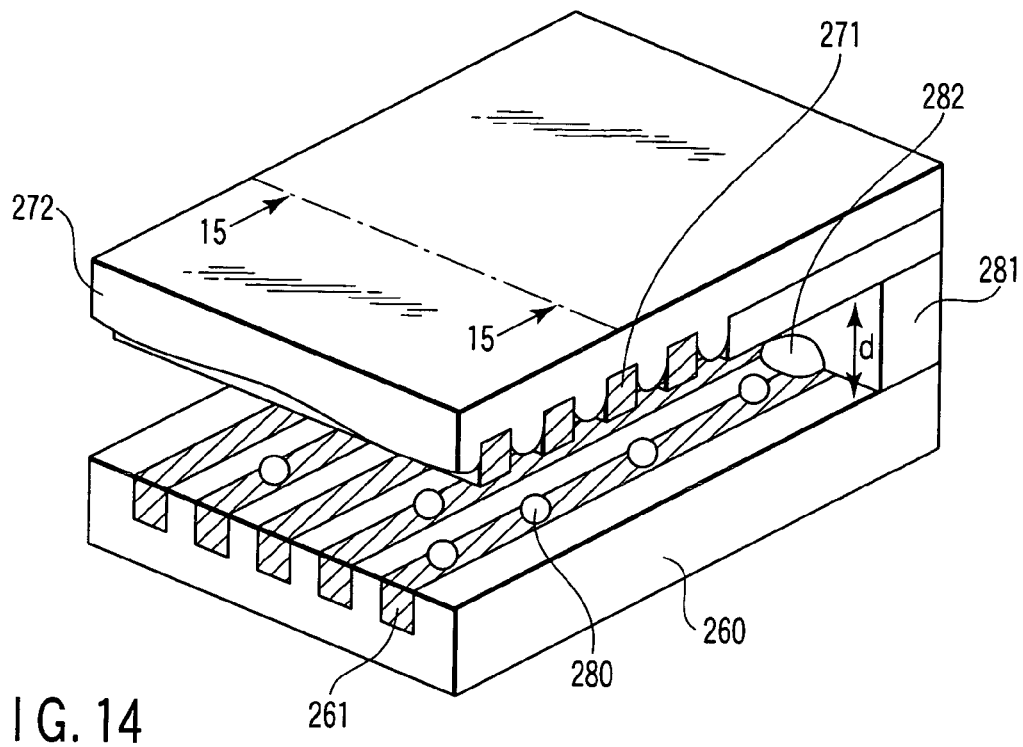
FIG. 14 is a cross-sectional view showing a cell portion structure of a storage apparatus according to a fourth embodiment.

As shown in FIG. 14, a plurality of row lines 261 arranged in parallel are embedded and formed in a surface portion of a substrate 260, and a plurality of column lines 271 arranged in parallel are formed on a surface facing the substrate 260 with a fixed gap d therebetween. A dielectric film 272 is formed on a side opposite to the substrate of the column lines 271, and the row lines 261 and the column lines 271 are orthogonal to each other. Here, the row line 261 will be referred to as a word line and the column line 271 will be referred to as a bit line in accordance with a regular MOS type memory cell.

An intersecting portion of the word line 261 and the bit line 271 corresponds to a memory cell, and each particle 280 movable between electrodes adjacent to each other is selectively arranged in the gap between the word line 261 and the bit line 271 at each intersecting portion. Here, the particle 280 can move in not only a direction vertical to the word line 261 and the bit line 271 but also a direction parallel with the word line 261 or the bit line 271. That is, the particle 280 can move in a direction vertical to the surface of the substrate 260 and between word lines adjacent to each other and between bit lines adjacent to each other. In such a structure, the word lines 261 and the bit lines 271 provided in the substrate 260 have a simple lines-and-spaces pattern, and it is good enough for the word lines 261 and the bit lines 271 to have an orthogonal positional relationship, therefore displacement in the word line direction and the bit line direction does not have to be taken into consideration. Therefore, a positioning accuracy in the cell is not required at the time of manufacture, and production can be readily performed.

In the case of forming such a structure including a gap as shown in FIG. 14, there is generally adopted a technique by which a film of a material called a sacrificial layer is formed in a region surrounded by a spacer 281 and the sacrificial layer is removed by isotropic etching using a chemical agent after forming an upper structure (the bit lines 271). However, with the advancement of miniaturization of wiring lines, an influence of surface tension of the chemical agent becomes extremely large when a line width or a line gap of the bit lines 271 is reduced to several-ten nm or below, and the chemical agent is hard to flow from the gap of the bit lines to enter. Even if the chemical agent spreads, discharging the chemical agent from the gap of the bit lines 271 at the next step is not easy. Moreover, even if the chemical agent is discharged by any means, the particles 280 must remain in the gap in order to form the structure shown in FIG. 14, and preventing the particles 280 from being discharged while the chemical agent is discharged is not easy.

Thus, it is desirable for the material used as the sacrificial layer to be discharged as a gas. It is preferable to decompose this material into a volatile component by a process which is as simple as possible, e.g., a heat treatment in terms of a processing cost.

From this viewpoint, according to this embodiment, a pyrolysis polymer is used as the sacrificial layer. A polyalkylene oxide is known as a typical example of the pyrolysis polymer. In particular, polyethylene oxide or polypropylene oxide whose monomer carbon number is two or three can be pyrolytically decomposed at a relatively low temperature, and hence such a substance is easy to use.

Specifically, there is prepared a solution in which colloidal silica particles with a particle diameter of 14 nm formed by the reverse miscelle method are dispersed in propylene glycol monomethyl ether acetate (PGMEA) which is also used as a general-purpose resist solvent. A solution in which 2 wt % of polyethylene oxide having an average molecular weight of approximately 300,000 is mixed in the prepared solution is manufactured. When the manufactured solution is spin-coated onto the substrate by using a regular spin coater at 2000 rpm, a solvent is vaporized during rotation. Therefore, a composite film in which colloidal silica particles are dispersed in a polyethylene oxide film can be formed. It is to be noted that the spacer is patterned in advance in such a manner that a position where an air gap should be formed becomes a concave portion on the substrate.

Then, a 3:1 mixture of propylene glycol monomethyl ether (PGME) and isopropyl alcohol (IPA) having a small polyethylene oxide dissolution velocity is used to perform chemical mechanical polishing from a surface of the mixed film of polyethylene oxide and the fine particles. When polyethylene oxide is polished/dissolved, the fine particles contained in this portion are also removed. Therefore, at the end of CMP, an upper surface of the spacer is exposed, and the mixed film remains in the previously formed concave portion only.

Subsequently, a Ti—W composite film which serves as the bit lines is formed on the entire surface by the sputtering method. Since the sputtering method does not require an increase in temperature of the substrate, it can form the Ti—W composite film under conditions that underlying polyethylene oxide is not pyrolytically decomposed. Then, a resist pattern is formed by imprint lithography, and a pattern of the bit lines is formed by reactive ion etching with the resist pattern being used as a mask. At this time, polyethylene oxide and the silica fine particles which exist immediately below the part exposed by etching of the bit lines are also partially etched and removed at the same time.

Then, any remaining polyethylene oxide is pyrolytically decomposed by a heat treatment at 180° C. to vaporize a decomposition product so that this product is discharged from each opening portion of the bit lines formed by etching. At this time, a part of the decomposition product or a small amount of a non-decomposed polymer cannot be sufficiently discharged and remains at a position distanced from the opening portion of the air gap, but these residues 282 have hygroscopic properties, and hence they function as a hygroscopic agent which absorbs excess moisture remaining in the air gap after completion. Since the remaining moisture can be a factor of deterioration in electrodes or the like, existence of such a function is rather desirable. Subsequently, the resist is removed by plasma ashing process using an oxygen gas, and then an silicon oxide film capable of spin coating, which is called spin on glass (SOG), is formed by using a highly viscous solution. As a result, a meniscus obtained by surface tension is utilized to form an $SiO_2$ film on the entire surface of the bit lines while leaving a space under the bit line as the air gap.

Figure 15A:
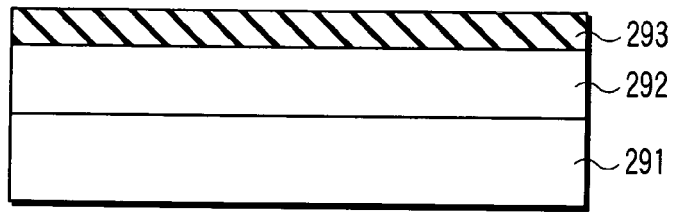
FIGS. 15A to 15L are cross-sectional views showing a manufacturing process of a storage apparatus according to a fourth embodiment step by step.

In regard to the entire manufacturing process, as shown in FIG. 15A, a desired CMOS circuit 292 is first formed on one surface of an Si substrate 291 having a thickness of 625 µm by using a regular CMOS process. Additionally, a dielectric film 293 which is formed of $SiO_2$ and has a film thickness of 30 nm is formed on this substrate by the CVD method using TEOS as a main raw material. It is to be noted that the CMOS circuit 292 includes connection lines with respect to memory cell arrays in addition to regular MOSFETs and multilayer wiring lines.

Figure 15B:
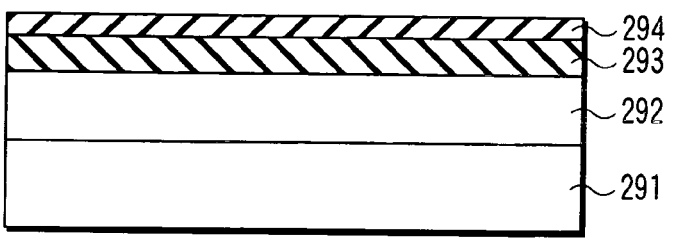
Figure 15C:
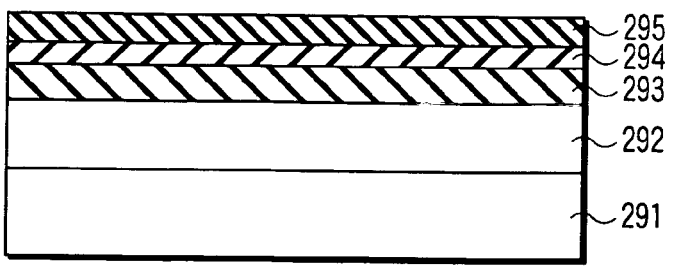

Then, as shown in FIG. 15B, an $Si_3N_4$ film 294 having a film thickness of 20 nm is formed by the LPCVD method using dichlorosilane and ammonia. It is to be noted that a connecting portion between the CMOS circuit 292 and the memory cell portion is processed at this state. Subsequently, as shown in FIG. 15C, an $SiO_2$ film 295 having a film thickness of 30 nm is again formed by the CVD method using TEOS as a main raw material.

Figure 15D:
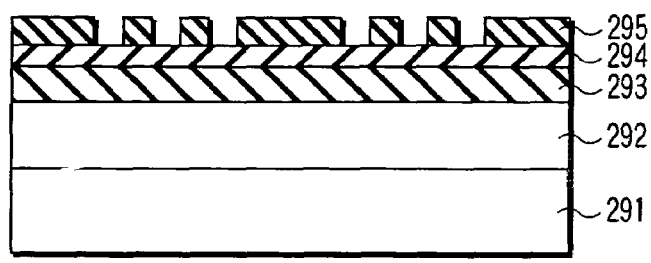
Figure 15E:
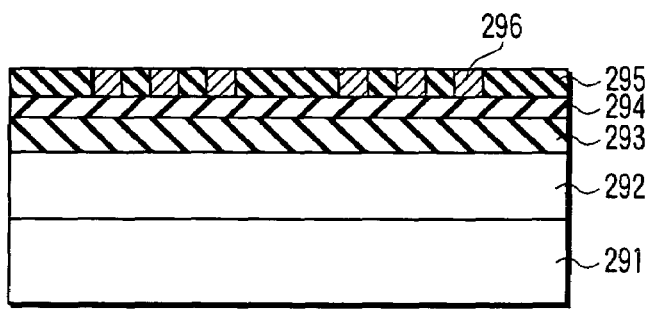

Then, as shown in FIG. 15D, an imprint lithography technique is used to form a resist pattern having a pitch of 40 nm, and the $SiO_2$ film 295 is patterned by reactive ion etching using $CHF_3$ and CO gases with the obtained resist pattern being utilized as a mask. Then, as shown in FIG. 15E, an Al film is formed by the sputtering method. Thereafter, so-called reflow process is carried out to agglomerate and embed the Al film 296 in each pattern groove, and the excess Al film is removed by the CMP method.

Figure 15F:
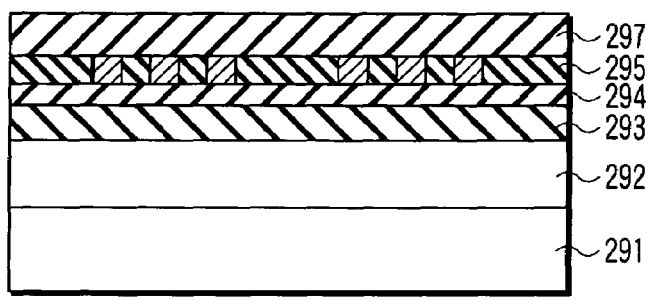
Figure 15G:
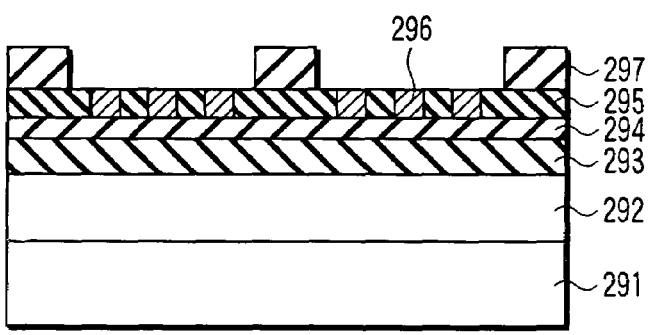

Subsequently, as shown in FIG. 15F, an $Si_3N_4$ film 297 having a film thickness of 20 nm is formed by plasma nitriding and the LPCVD method using dichlorosilane and ammonia as main raw materials. Then, as shown in FIG. 15G, the $Si_3N_4$ film 297 is patterned by reactive ion etching using $CHF_3$, $CF_4$ and $O_2$ gases, thereby forming a spacer. Incidentally, although not shown, the connecting portion between the CMOS circuit 292 and the memory cell upper layer is processed at this stage.

Figure 15H:
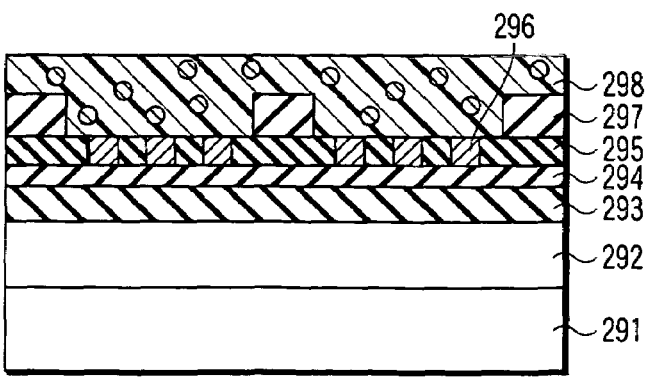
Figure 15I:
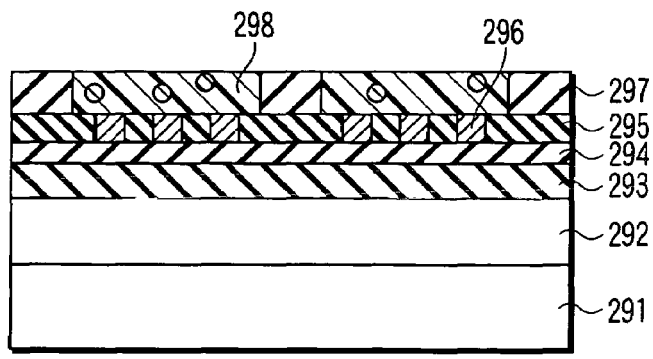

Subsequently, as shown in FIG. 15H, an application liquid in which 2 wt % of polyethylene oxide having an average molecular weight of approximately 300,000 is mixed in a solution having colloidal silica fine particles with a particle diameter of 14 nm formed by the reverse miscelle method are dispersed in propylene glycol monomethyl ether acetate (PGMEA) is applied with a regular spin coater at 2000 rpm to form a mixed film 298 containing polyethylene oxide and fine particles. Then, as shown in FIG. 15I, an excess part of the mixed film 298 containing polyethylene oxide and fine particles is removed by the CMP method using a 3:1 mixture of propylene glycol monomethyl ether (PGME) and isopropyl alcohol.

Figure 15J:
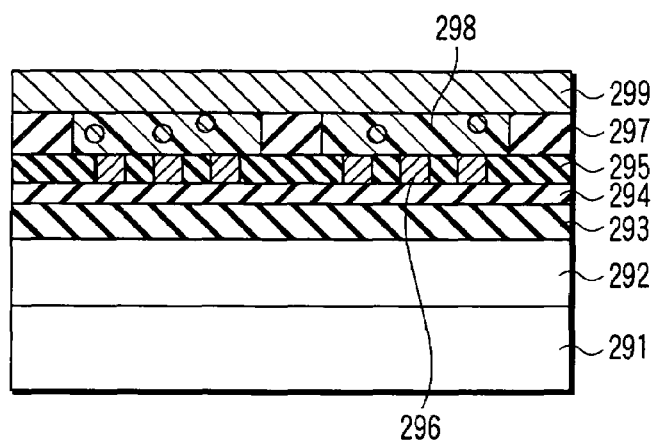

Subsequently, as shown in FIG. 15J, a composite film 299 including Ti having a film thickness of 5 nm and W having a film thickness of 15 nm is successively formed by the sputtering method. Then, the imprint lithography technique is used to form a resist pattern having a pitch of 40 nm to be aligned in a direction vertical to a page space, and the composite film 299 is patterned by reactive ion etching using $CHF_3$ and $SF_6$ gases with the obtained resist pattern being utilized as a mask. This patterned composite film 299 finally becomes the bit lines. Further, at this time, polyethylene oxide and the silica fine particles existing directly below the part exposed by etching of the bit lines are also partially etched and removed at the same time.

Figure 15K:
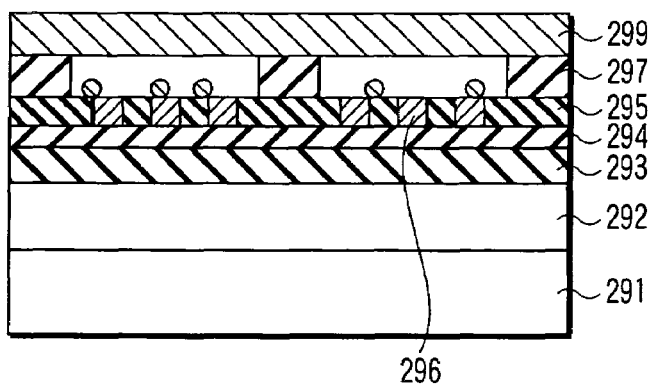

Then, as shown in FIG. 15K, remaining polyethylene oxide is pyrolytically decomposed by a heat treatment at 180° C. to vaporize a decomposition product so that this product is discharged from an opening portion of each bit line formed by etching. Subsequently, although not shown, the resist is removed by plasma ashing process using an oxygen gas.

Figure 15L:
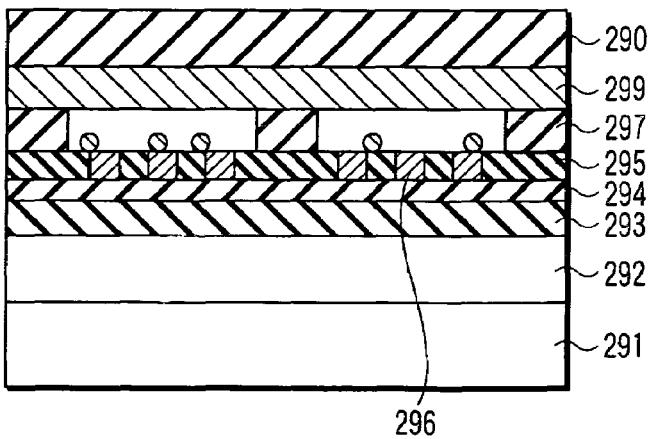

Additionally, as shown in FIG. 15L, a silicon oxide film capable of spin coating, which is called spin on glass (SOG), is formed by using a highly viscous solution. As a result, an $SiO_2$ film 290 is formed on an entire upper surface of the composite film 299 by utilizing a meniscus obtained by surface tension while leaving the lower space of the composite film 299 as an air gap. At this time, although a part of a side surface of the composite film 299 has a structure which is adjacent to an air space, this has an effect of reducing an electrical capacitance of the bit lines, and hence it is a rather desirable structure.

Further, in the case of providing a multilayer structure to the memory cell portion, the above-described process is repeated, thus obtaining a desired structure. Finally, a so-called passivation film is formed, and a wiring connecting portion which serves as an input/output portion is formed. Then, a so-called post-process such as an inspection or dicing is executed, thereby bringing the storage apparatus to completion.

It is to be noted that the present invention is applied to the storage apparatus constituted of an orderly simple lines-and-spaces pattern in this embodiment, but the present invention can be also applied to circuit devices other than the storage apparatus. A regular circuit device often has a problem of a reduction in signal transmission delay due to an electrostatic capacitance between wiring lines. Although lowering a dielectric constant of an insulator between wiring lines is effective in order to reduce an electrostatic capacitance between wiring lines, a relative dielectric constant becomes substantially 1 in the case of a simple air gap. Therefore, using the air gap is optimum. Accordingly, in a regular circuit device, providing a technique of inexpensively forming an air gap by a simple method is also significantly meaningful.

In a regular circuit device, since regularity of a wiring line pattern is poor and both a narrow part and a wide part between lines exist, it is desirable to perform spin coating using a highly viscous solution in order to form an upper dielectric film. Furthermore, a size of a meniscus varies depending on the narrow part and the wide part between lines when the upper dielectric film is formed by spin coating, and hence an entering amount of the dielectric film varies. That is, an entering amount of the dielectric film can be reduced in the narrow part between lines, but there is a possibility that the dielectric film deeply enters to be formed in the wide part between lines.

However, as described above, since the problem is the electrostatic capacitance between lines, if an air gap is assured in the narrow part between lines, a desired effect can be obtained even though the dielectric film having a high dielectric constant deeply enters the air gap in the wide part between lines having a small electrostatic capacitance from the beginning. Moreover, in case of setting the same entering amount of the dielectric film in both the wide part between lines and the narrow part between lines, it is good enough to orderly arrange apparent spaces between lines by arranging a dummy pattern irrespective of a circuit function in the wide part between lines.

Here, the fourth embodiment is summarized as follows.

(1) A polyalkylene oxide is used as a pyrolysis polymer.

(2) The pyrolysis polymer is formed of an alkylene oxide monomer whose carbon number is two or three.

(3) The process of forming the dielectric film on the second wiring material pattern includes spin coating.

(4) The air gap surrounded by a structure provided at a part of the row line and the column line and between both wiring layers is provided, a part of the air gap includes a hygroscopic substance, and the dielectric film is formed on the column line.

(5) The hygroscopic substance is a material formed by performing a heat treatment with respect to the pyrolysis polymer.

Adopting the above-described structure and process can further easily form the storage apparatus.

Fifth Embodiment

Figure 16:
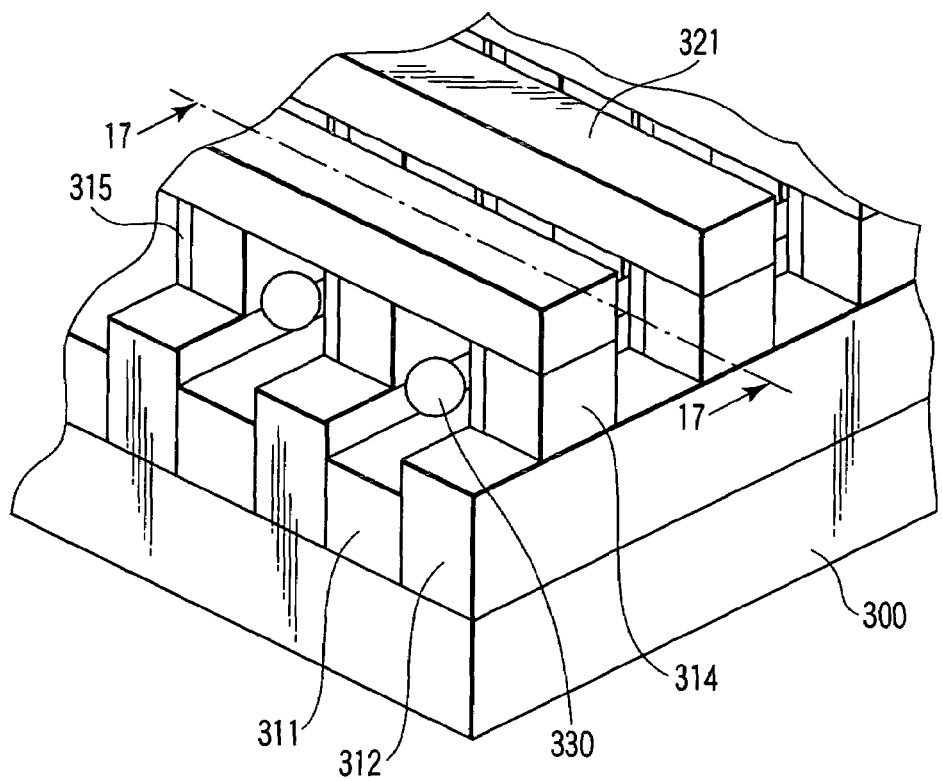
FIG. 16 is a perspective view showing a cell portion structure of a storage apparatus according to a fifth embodiment.
Figure 17:
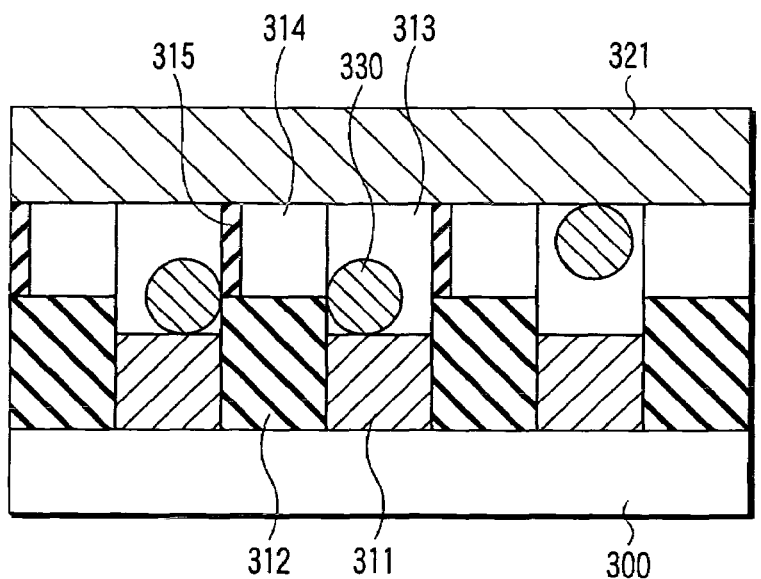
FIG. 17 is a cross-sectional view taken along a line 17-17 in FIG. 16.

As shown in FIGS. 16 and 17, in a storage apparatus according to the fifth embodiment of the present invention, a plurality of row lines 311 and a dielectric film 312 are alternately formed on a surface portion of a substrate 300, and a plurality of column lines 321 are formed to be apart from the row lines 311 by a predetermined distance. Further, conductive particles 330 are arranged between the row lines 311 and the column lines 321. That is, the plurality of row lines 311 arranged in parallel and the plurality of column lines 321 likewise arranged in parallel are arranged to face each other through gaps 313 in such a manner that their line directions cross each other. The conductive particles 330 movable between electrodes as a representative example of a movable conductor are arranged in these gaps 313. Here, the row line 311 will be referred to as a word line and the column line 321 will be referred to as a bit line in accordance with a regular MOS type memory cell.

It is to be noted that convex portions of a semiconductor region (a semiconductor film) 314 are provided on a surface of the column line 321 facing the row lines 311 in the same cycle as that of the row lines 311. Moreover, a sidewall dielectric film 315 is formed on one of two faces of the convex portion 314 in the bit line direction.

In such a configuration, the word lines 311 and the bit lines 321 have a simple lines-and-spaces pattern. It is good enough for each word line 311 and each bit line 321 to have an orthogonal positional relationship, and displacement in the word line direction and the bit line direction does not have to be taken into consideration. Therefore, as will be described later, a positioning accuracy in the cell at the time of manufacture can be set very loose, thereby facilitating manufacture.

Although the basic structure is similar to FIG. 1, a storage state is judged based on whether the word line 311 is electrically connected with the bit line 321 through the particle rather than presence/absence of the particle in this embodiment.

Figure 6:
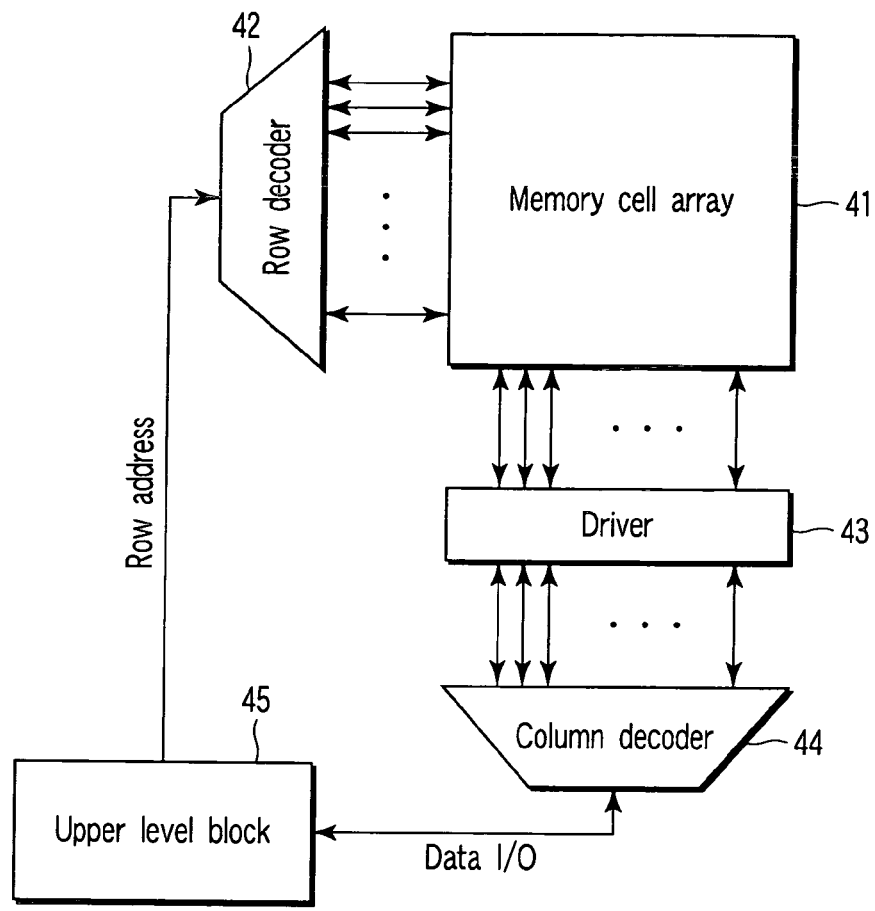
FIG. 6 is a block diagram showing an outline configuration of a storage apparatus including peripheral circuits.

It is to be noted that the portion shown in FIGS. 16 and 17 is a part of the memory cell array 41 depicted in FIG. 6, a row decoder 42 is connected with each row wiring line, and a driver including a read/write circuit and a column decoder 44 are connected with each column wiring line like a conventional memory. Adopting such a configuration can collectively read/write information of all columns included in the same row at a time. It is to be noted that reading, writing and later-described erasing can be carried out through the driver 43.

A junction between the bit line 321 and the convex portion 314 of the semiconductor region forms a so-called a Schottky junction, and functions as a diode. This diode is utilized as a cell selecting diode of a so-called crosspoint type memory cell. A function of this cell selecting diode will now be briefly described.

Figure 18A:
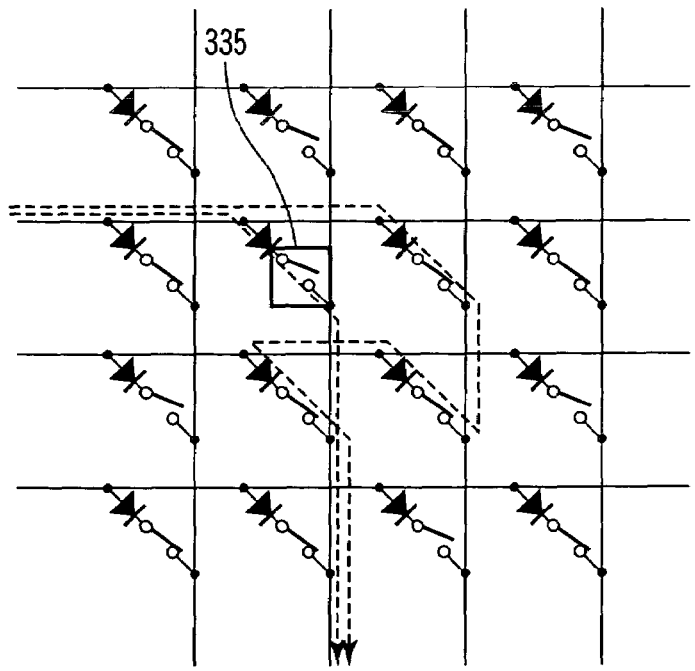
Figure 18B:
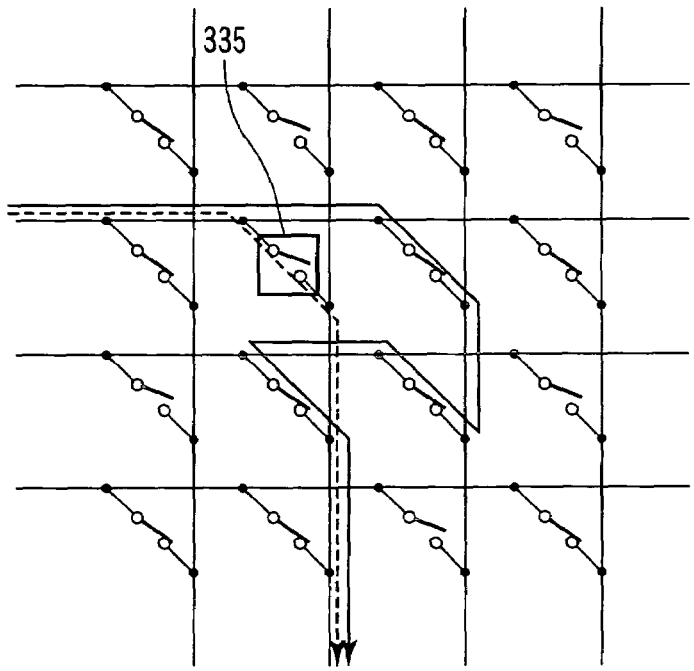

FIGS. 18A and 18B are circuit diagrams showing a crosspoint type memory cell array in which a switch substitutes for a memory cell in the form of an equivalent circuit, where FIG. 18A shows a case where the cell selecting diode is provided and FIG. 18B shows a case where the cell selecting diode is not provided. In the drawings, whether a selected cell 335 is ON/OFF is read by applying a voltage to the bit line and the word line constituting an intersecting point of this cell 335 to detect presence/absence of a current.

In the case of FIG. 18B showing the example where the cell selecting diode is not provided, as illustrated in the drawing, since a current path extending through the peripheral cell which is ON exists, even though the cell 335 is OFF, the same current is detected as if the cell 335 is ON, and erroneous reading occurs. Beside the illustrated path, since many such paths exist in parallel, it is difficult to judge ON/OFF of each cell from the outside of the cell array.

On the contrary, in the case of FIG. 18A showing the example where the cell selecting diode is provided, since the diode is inserted into a current path in question in the reverse direction, a current flowing through this path becomes very small, thereby avoiding erroneous reading. In regard to other detours, the bit line and the word line constituting the intersecting point cannot be connected with each other unless the current flow through the diode at least once in the reverse direction, thereby completely avoiding erroneous reading.

An operating status of this embodiment will now be described with reference to FIG. 19 to FIGS. 22A and 22B.

Figure 19:
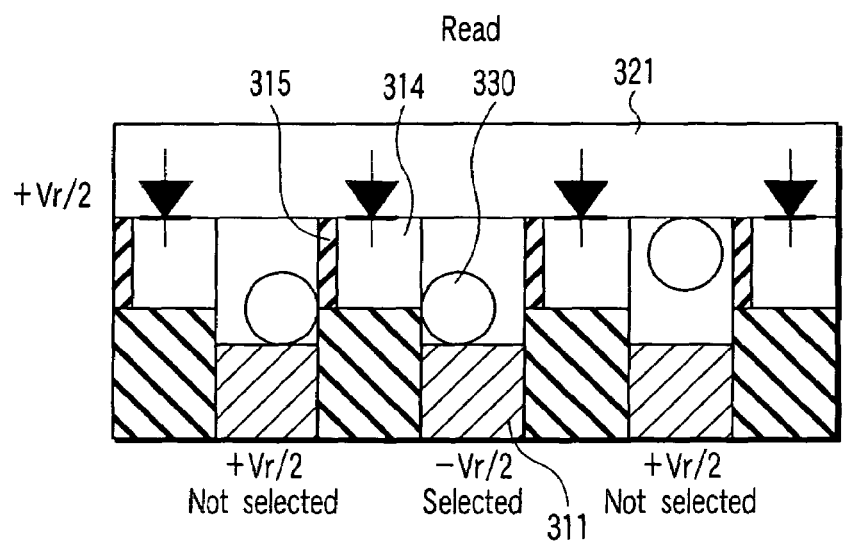
FIG. 19 is a schematic view illustrating a read operation of a storage apparatus according to a fifth embodiment.

FIG. 19 is a cross-sectional view showing a voltage application status at the time of reading. Assuming that a read voltage is Vr, +Vr/2 is applied to the bit line 321, −Vr/2 is applied to the selected word line including information to be read, and +Vr/2 is applied to the non-selected word line. It is to be noted that information of all columns included in the same row is collectively read as described above, and hence there is no difference between selection/non-selection of the bit line 321. In this voltage application state, since the bit line 321 and the non-selected word line have the same potential, a current does not flow through the cell connected with the non-selected word line. Therefore, detecting a current flowing through the bit line 321 can detect a current flowing through each cell on the selected word line.

It is to be noted that a current is detected by connecting a resistance for current-voltage conversion with the bit line in series and detecting a voltage at both ends of this resistance as often performed. Specifically, both ends of the resistance are input to a voltage amplifier, and whether an amplifier output voltage exceeds a threshold value is judged by using a comparator. In each cell, if the conductive particle 330 is close enough to a position cutting across the word line 311 and the semiconductor film 314, a current flows through the cell due to tunneling even though the conductive particle 330 is not securely in contact. As a result, an ON state is defined. On the contrary, if the conductive particle 330 is far enough from the position cutting across the word line 311 and the semiconductor film 314, a current rarely flows through the cell, and hence an OFF state is defined.

Since a tunneling current is dependent on a distance between electrodes in terms of an exponential function, it usually varies by more than one order when a distance between electrodes differs by 1 nm. Therefore, a boundary between an ON state and an OFF state can be sufficiently clearly defined in a practical range. Further, the dielectric film 315 provided on one of the sidewalls of the semiconductor film 314 having a normal line in a direction of the bit line 321 prevents two word lines from being electrically short-circuited when two conductive particles 330 come into electrical contact with the same semiconductor film 314 in two cells adjacent to each other in the bit line direction.

It is to be noted that the voltage application status shown in FIG. 19 is just an example. For instance, all voltages may be reduced by Vr/2 so that 0 V is applied to the bit line 321 and the non-selected word line and −Vr is applied to the selected word line. In this case, a different technique can be applied to detection of a current. For example, before applying a read voltage, all bit lines are connected to the ground (0 V) in advance to determine a potential as 0 V, and then the bit lines are disconnected from the ground and connected to an input of the voltage amplifier.

When the voltage of the selected word line is changed from 0 V to −Vr in terms of pulses in this state, a potential of the bit line connected with a cell which is in the OFF state rarely varies, but a potential of the bit line connected with a cell which is in the ON state varies to approximate −Vr in terms of pulses. Therefore, it is possible to obtain a pulsing voltage change amplified as an output from the voltage amplifier. When the pulse is extremely long, there is a possibility that a large potential difference is produced between the bit line 121 and the non-selected word line. However, it is a potential difference which reverses the direction of the diode, and hence no current flows through the cell connected with the non-selected word line. Therefore, detecting a change in voltage of this amplifier output can judge ON/OFF of the selected cell.

Figure 20A:
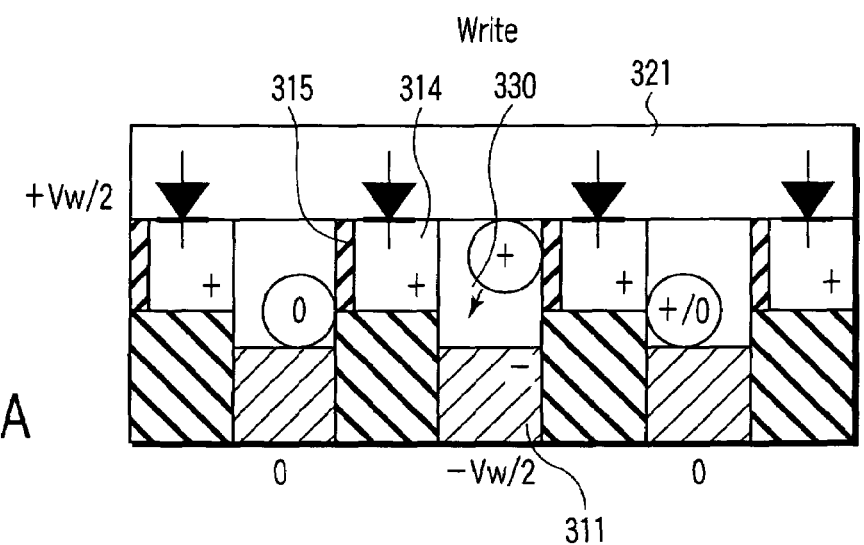
FIGS. 20A and 20B are schematic views illustrating a write operation of the storage apparatus according to the fifth embodiment.
Figure 20B:
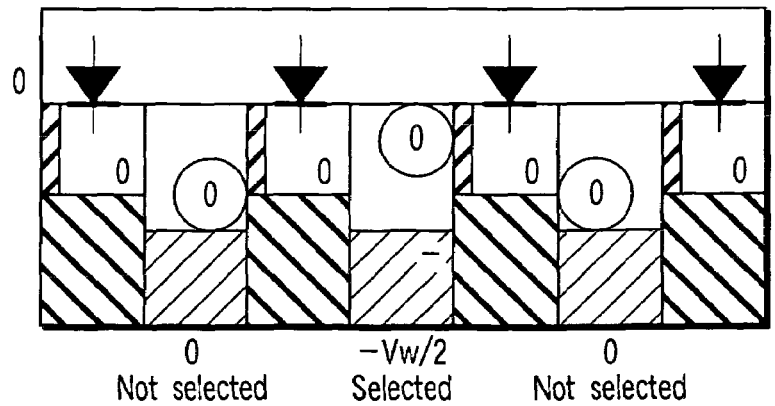

FIGS. 20A and 20B are cross-sectional views showing a voltage application status at the time of writing. FIG. 20A shows a case where the bit line is selected, and FIG. 20B shows a case where the bit line is not selected. Assuming that a write voltage is Vw, +Vw/2 is applied to a selected bit line connected with a cell into which information should be written as a state varies from OFF to ON, −Vw/2 is applied to a selected word line connected with the same, and 0V is applied to other non-selected bit lines and word lines.

As shown in the examples in FIGS. 20A and 20B, there are several cases in dependence on voltages of the electrodes and positions of the conductive particles. However, no change occurs since a voltage is not applied to a cell having both a non-selected bit line and word line. Furthermore, a voltage between electrodes in a half-selected cell in which one of the bit line and the word line is selected is ½ of a voltage between electrodes in a selected cell in which both the bit line and the word line are selected. Moreover, as described below, since there is a lower limit to a voltage which enables movement of the conductive particle 330, the conductive particle can be allowed to move in the selected cell alone and avoid occurrence of movement of the conductive particle in the half-selected cell. Utilizing this phenomenon can perform the write operation in the selected cell alone.

As described above in conjunction with FIG. 2, a force received by an electric charge from an electric field, a mirror image charge induced in an electrode and a force received from a mirror image dipole are applied to the particle, and a combined force F is provided by Expression (1). Representing the force F in Expression (1) acting on the particle in the form of graph, FIG. 3 can be obtained. As described above, the most important thing is that separation of the particle from the electrode occurs when an electric field larger than an electric field indicated by an arrow in FIG. 3 exists, i.e., only when a potential difference larger than a given voltage Vc exists. Additionally, based on this, the read voltage Vr must be set to be not greater than the voltage Vc with which movement of the particle with respect to a counter electrode occur.

As shown in the center of FIG. 20A, when there is a particle at an OFF-state position on the bit line side in a selected cell, the particle is charged to have a positive polarity, separated from the bit line and moves in the word line direction. Since the particle has a dipole moment obtained by polarization, it also receives a force due to an inhomogeneous electric field in the vicinity of the semiconductor film 314 and reaches a part close to an ON-state position having the most intensive electric field and inhomogeneity. When the particle reaches the word line, the particle discharges a positive electric charge to the word line, and receives a negative electric charge from the word line. At this time, since the particle exists at the part close to the ON-state position, the particle moves toward the sidewall of the semiconductor film 314 which is the closest position charged to have a positive polarity, and approaches the ON-state position by a force acting on the dipole moment.

Since the particles converge on the ON-state position within several movements in this manner, the write operation is completed. The ON-state position is stable equilibrium in the write voltage application state, and hence the particle stays at this position and does not move to the OFF-state position when the ON state is achieved.

This is also true when the particle exists at the OFF-state position on the word line side. The particle may reach the bit line, depending on the situation, but it converges on the ON-state position with several movements. Incidentally, there is assumed a case where the particle exists on the dielectric film 315 and it is not in direct contact with any electrode. However, a quantity of electric charge required for movement of the particle is just one elementary electric charge, and hence the electric charge can be satisfactorily assured by using a leakage current or a tunneling current of the dielectric film. Further, since an electric field also exists on the dielectric film 315, the particle likewise converges on the ON-state position within several movements.

As described above, the particle does not move in such a non-selected cell including a half-selected cell as shown in FIG. 20B. The particle thus arrives at an ON-state position in such a selected cell as shown in FIG. 20A. Therefore, the voltage application state in FIG. 20A enables writing. Furthermore, as apparent from FIGS. 20A and 20B, there is no interference between cells connected with different bit lines. Therefore, simply applying a voltage of a selected bit line to all desired bit lines enables writing in a plurality of cells connected with the same word line at the same time.

In an actual write operation, when a circuit is switched in advance to insert a resistance in series with respect to a selected bit line, power consumption can be suppressed. As described above, in the write operation, the particle converges on the ON-state position after several movements, but an electrical resistance of the cell is greatly lowered when the ON state is achieved. Therefore, both a current and power consumption are increased. When a convergence time required to converge on the ON-state position can be estimated in advance, setting a time width of a write voltage pulse to be substantially equal to the convergence time in the write operation can prevent an excessive current from flowing to increase power consumption.

However, when the convergence time is hard to be estimated, it is difficult to take any measures. On the contrary, when a resistance is inserted in series with respect to a selected bit line, a current flowing through a cell is very small during movement of a particle. Therefore, there is almost no influence due to the series resistance. However, when the particle arrives at the ON-state position to increase a current, the same current flows through the series resistor, thereby lowering a voltage. As a result, the voltage applied to the cell is reduced, and a power consumed in the cell is greatly decreased even if an ON resistance value is the same (when the resistance value is the same, the power consumption is in proportion to a square of the voltage).

Although power is consumed in the resistor inserted in series, the power supply voltage is the same and all resistances are increased as seen from the entire circuit, and hence it is apparent that the entire power consumption is lowered. Moreover, measuring voltages at both ends of this resistor inserted in series can confirm that the cell remains in the ON state, i.e., the write operation has been completed, and an operation of detecting completion of the write operation to lower an application voltage can be added. In any case, the power consumed in the write operation can be reduced.

It is to be noted that there is a possibility that the complete ON state cannot be obtained by one write operation (a time width of a write pulse) depending on a position of the conductive particle 330 in the initial state where the write operation starts. Therefore, after the write operation, the state of the same cell is confirmed by the read operation. When the ON state is confirmed, the processing advances to an operation with respect to the next cell. When the ON state cannot be confirmed, a later-describe erase operation is executed, and then the write operation is again performed. It is desirable to repeat this process until the ON state is confirmed. More desirably, an upper limit is set with respect to the number of repetitions. When the ON state cannot be confirmed even though the write operation is executed for the number of times as the upper limit, it is good enough to judge a corresponding cell as a defective cell and store information by using an alternative cell.

Moreover, the voltage application status shown in each of FIGS. 20A and 20B is just an example. In principle, arbitrary combinations can be used under conditions that a voltage difference between the bit line and the word line in a selected cell is larger than the voltage Vc with which movements of the particle with respect to the counter electrode occur and a potential difference between the bit line and the word line in a half-selected cell is smaller than the voltage Vc with which movements of the particle with respect to the counter electrode occur.

Figure 21A:
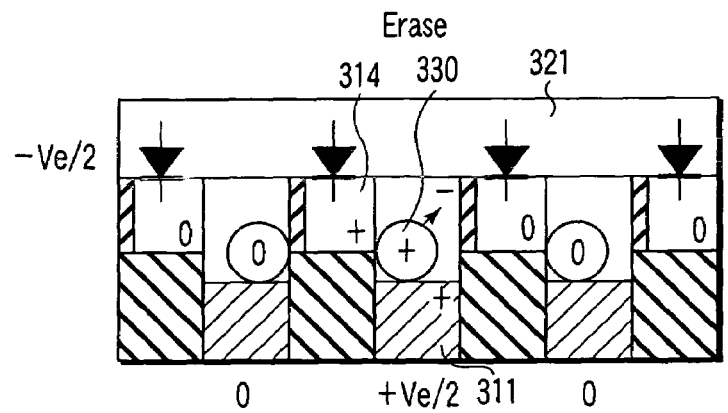
FIGS. 21A and 21B are schematic views illustrating an erase operation of the storage apparatus according to the fifth embodiment.
Figure 21B:
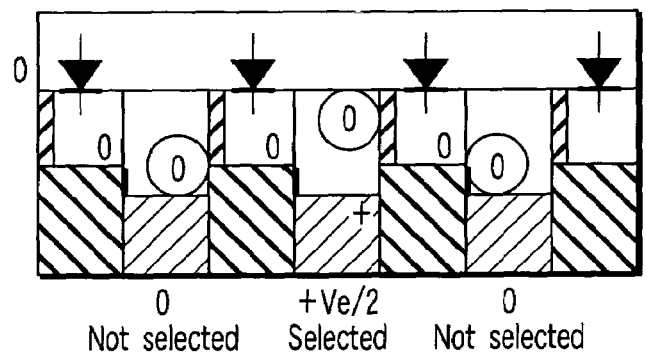

FIGS. 21A and 21B are cross-sectional views each showing a voltage application status at the time of erasing. FIG. 21A shows a case where the bit line is selected, and FIG. 21B shows a case where the bit line is not selected. Assuming that an erase voltage is Ve, $-Ve/2$ is applied to a selected bit line connected with a cell which is a target of an erasing operation from ON to OFF, $+Ve/2$ is applied to a selected word line connected with the same, and 0 V is applied to other non-selected bit lines and word lines.

As shown in the examples of FIGS. 21A and 21B, although there are several cases in dependence on a voltage of an electrode and a position of an conductive particle 330, no change occurs in a cell in which both the bit line and the word line are not selected since a voltage is not applied thereto at all. Further, a voltage between counter electrodes in a half-selected cell in which one of the bit line and the word line is selected is ½ of a voltage between counter electrodes in a selected cell in which both the bit line and the word line are selected. Furthermore, since there is a lower limit to a voltage which enables movement of the conductive particle 330 as described above, the conductive particle moves in the selected cell alone, and movement of the conductive particle does not occur in the half-selected cell.

Utilizing this phenomenon enables an erase operation in the selected cell alone. Incidentally, differing from the write operation, since a reverse voltage is applied to a diode, a potential of the semiconductor film 314 differs. Therefore, a lower limit voltage which enables movement of the conductive particle also differs, and it must be defined as Vce in a narrow sense.

As shown in the center of FIG. 21A, when the particle exists at an ON-state position in a selected cell, the particle is charged to have a positive polarity, separated from the ON-state position and moves in the bit line direction. When the particle reaches the bit line, the particle discharges a positive electric charge to the bit line, receives a negative electric charge from the bit line and continues in its movement. However, differing from the write operation, since a reverse voltage is applied to the diode, a potential of the semiconductor film 314 also differs. As a result, the ON-state position does not become a stable equilibrium, and the particle necessarily moves to a position other than the ON-state position. Therefore, it is apparent that the selected cell shifts to the OFF state.

As described above, movement of the particle does not occur in a non-selected cell including a half-selected cell, and the particle moves to a position other than the ON-state position in a selected cell. Therefore, erasing becomes possible in the voltage application state shown in FIG. 21A. Moreover, as apparent from FIGS. 21A and 21B, since there is no interference between cells connected with different bit lines, simply applying a voltage of a selected bit line to all desired bit lines can perform erasing in a plurality of cells connected with the same word line at the same time.

In the case of actually performing the erase operation in a cell which is in the ON state, voltage application shown in FIG. 21A is carried out in a time width of a preset erase voltage pulse. Differing from writing, it is not necessary to wait for convergence of movement of the particle in the case of erasing, but a capacitor is electrically charged since a reverse voltage is applied to a diode formed of the semiconductor film 314, and hence a time width of an erase voltage pulse is set while considering a time constant of this charging.

Additionally, in a regular two-terminal memory element, in a case where a cell which has a low resistance and is in an ON state is electrically switched to an OFF state, a large initial current is required, which leads to an increase in power consumption. On the contrary, in this embodiment, since a reverse voltage is applied to the diode in the erase operation which is switching to the OFF state, this problem can be avoided and power consumption can be reduced.

It is to be noted that there is a possibility that the OFF state cannot be obtained by one erase operation (a time width of an erase pulse) depending on a position of the conductive particle 330 in the initial state where erasing starts. Therefore, a state of the same cell is confirmed after the erase operation. When the OFF state is confirmed, the processing advances to an operation with respect to the next cell. When the OFF state cannot be confirmed, it is desirable to repeat the process of again performing the erase operation until the OFF state is confirmed. More desirably, an upper limit is set in the number of repetitions. When the OFF state cannot be confirmed even though erasing is carried out for the number of times which is the upper limit, a corresponding cell may be judged as a defective cell, and an alternative cell may be used to store information.

Further, the voltage application status shown in each of FIGS. 21A and 21B is just an example. In principle, arbitrary combinations can be used under conditions that a voltage difference between the bit line and the word line in a selected cell is larger than the voltage Vce, which enables movement of the particle with respect to a counter electrode, and a potential difference between the bit line and the word line in a half-selected cell is smaller than the voltage Vce, which enables movement of the particle with respect to a counter electrode.

In a current memory in which high integration is achieved, a redundancy circuit which remedies a defect at the time of manufacture must be provided in order to improve a production yield. In the case of a conventional memory cell array using a selection transistor, when the transistor induces a short-circuit defect (a defect that a resistance between a source and a drain is lowered irrespective of a gate voltage), only cells which share a bit line (or a word line) with this transistor are affected. Therefore, it is possible to adopt a rescue measure in which the corresponding bit line (or word line) alone is disconnected by using a fuse or the like, and replaced with a preliminary bit line (or word line).

However, in a crosspoint type memory cell array using a selection diode, when the diode induces a short-circuit defect (a defect with which a reverse current cannot be suppressed), a cell which does not share a bit line or a word line with this diode, i.e., the entire cell array may be affected (see FIG. 18A). Therefore, it is necessary to provide means for shifting a cell in which a selection diode has induced a short-circuit defect to an OFF state by any method. Alternatively, it is needed to disconnect one entire block in a cell array and replace it with another block in the cell array, which results in a decrease in an area efficiency of the cell. In the structure according to this embodiment, an erase-for-rescue operation mentioned below can solve this problem.

Figure 22A:
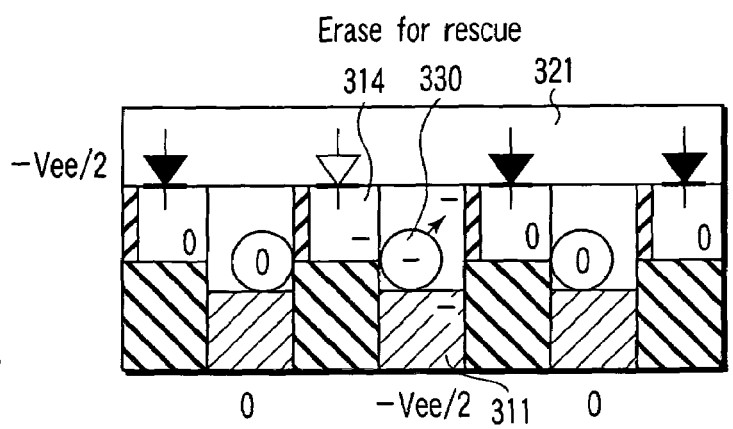
FIGS. 22A and 22B are schematic views illustrating an erase-for-rescue operation of the storage apparatus according to the fifth embodiment.
Figure 22B:
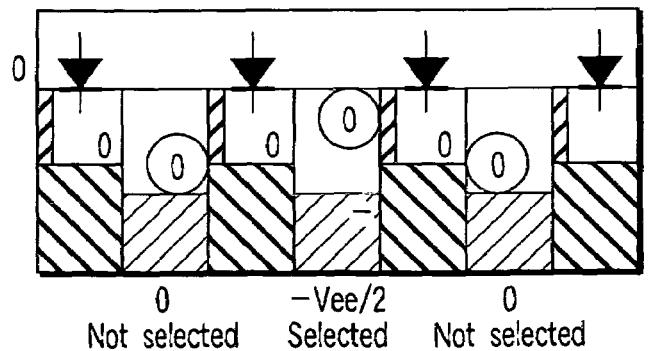

FIGS. 22A and 22B are cross-sectional views each showing a voltage application status in an erase-for-rescue operation. FIG. 22A shows a case where a bit line is selected, and FIG. 22B shows a case where a bit line is not selected. Assuming that an erase-for-rescue voltage is Vee, −Vee/2 is applied to a selected bit line and a selected word line connected with a cell which is an erase-for-rescue target from ON to OFF, and 0 V is applied to other non-selected bit lines and word lines.

As shown in the example of each of FIGS. 22A and 22B, although there are several cases of dependence on a voltage of an electrode and a position of an conductive particle, no change occurs in a non-selected cell in which both a bit line and a word line are not selected since no voltage is applied thereto at all. Further, in a half-selected cell in which one of a bit line and a word line is selected, a particle may move in some cases, and there is a possibility that the transition between an ON state and an OFF state occurs. However, as described above, this erase-for-rescue operation is intended to avoid use of a bit line and a word line connected with a cell having a defective diode in order to utilize a redundancy circuit. Since a cell which is in a half-selected state at the time of the erase-for-rescue operation is not finally used, transition between the ON state and the OFF state is allowed to occur.

As shown in the center of FIG. 22A, when a particle exists at an ON-state position in a selected cell where a diode has a short-circuit defect, the particle is charged to have a negative polarity, separates from the ON-state position, and moves in a direction of the semiconductor film 314 of an adjacent cell where its potential is still 0. Although a dielectric film 315 exists between the semiconductor film 314 and a counterpart in the adjacent cell, a quantity of electric charge required for movement of the particle is just one elementary charge. Therefore, the electric charge can be sufficiently assured by using a leakage current or a tunneling current of the dielectric film, and the particle continues to move.

However, since the diode has a short-circuit defect, an electric field distribution is completely different from that in the case of the write operation, the ON-state position does not become a stable equilibrium, and the particle necessarily moves to a position other than the ON-state position. Therefore, it is apparent that the selected cell shifts to the OFF state. Moreover, as apparent from FIGS. 22A and 22B, since there is no interference between cells connected with different bit lines, simply applying a voltage of a selected bit line to all desired bit lines can perform the erase-for-rescue operation with respect to a plurality of cells connected with the same word line at the same time.

In the case of actually effecting the erase-for-rescue operation to a cell which is in the ON state, the voltage application shown in FIG. 22A is executed in a preset time width of a erase-for-rescue voltage pulse. In case of the erase-for-rescue operation, it is not necessary to wait for convergence of movement of a particle, and a capacitor is electrically charged since a reverse voltage is applied to a diode formed of a semiconductor film 314 of a cell which is half selected by a bit line. Therefore, a time width of an erase-for-rescue pulse is set while considering a time constant of this charging.

Additionally, although a current consumption is very small in a selected cell in the erase-for-rescue operation since a bit line and a word line have the same potential. However, when a cell which is half selected by a word line is in the ON state, a current flows since a diode has a forward direction, thereby increasing power consumption. Therefore, it is desirable to previously perform the erase operation of a cell connected with a word line which is common to a cell as an erase-for-rescue target before effecting the erase-for-rescue operation.

It is to be noted that there is a possibility that one erase-for-rescue operation (a time width of an erase-for-rescue pulse) cannot obtain the OFF state depending on a position of the conductive particle 330 in the initial stage where the erase-for-rescue operation starts. Therefore, a state of the same cell is confirmed by the read operation after the erase-for-rescue operation. When the OFF state is confirmed, the processing advances to the next cell. When the OFF state cannot be confirmed, it is desirable to repeat the process of again effecting the erase-for-rescue operation until the OFF state is confirmed. More desirably, an upper limit is set in the number of repetitions. When the OFF state cannot be confirmed even though the erase-for-rescue operation is carried out for the number of times which is the set upper limit, it is good enough to judge a corresponding cell array as a defective array and use an alternative cell array to store information.

Further, the voltage application status shown in each of FIGS. 22A and 22B is just an example. In principle, arbitrary combinations can be used under conditions that a voltage between a bit line and a word line in a selected cell is larger than the voltage Vcee which enables movement of a particle.

As described thus far, in this embodiment, although an electric charge is used for reading/writing information, storage is carried out by using existence information of a particle rather than an accumulated electric charge, and hence stored contents are hardly affected by natural radiation. Furthermore, since a size of a particle is based on the 10-nm order like the foregoing example, a gravitational force acting on a particle is as small as approximately $10^{-18}$ N, and movement of a particle caused due to the gravitational force acting on a particle or an external impact shock can be ignored. Of course, a magnetic force is not used either, and hence there is provided a storage apparatus which is hardly affected by either a magnetic field or a gravitational disturbance.

Sixth Embodiment

Figure 23A:
FIGS. 23A to 23V are cross-sectional views showing a manufacturing process of a storage apparatus according to a sixth embodiment step by step.
Figure 23B:
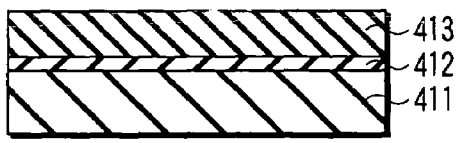
Figure 23C:
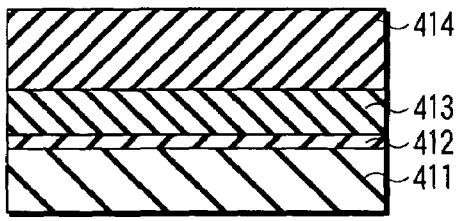
Figure 23D:
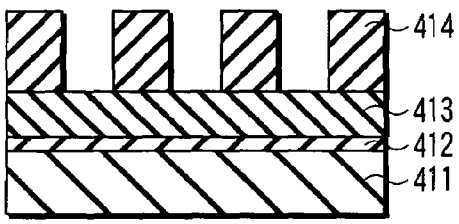
Figure 23E:
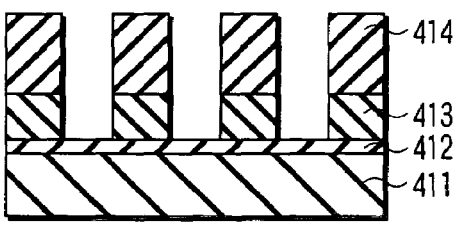
Figure 23F:
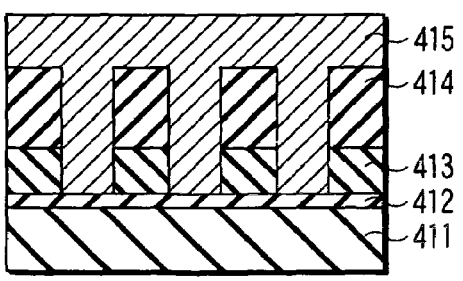
Figure 23G:
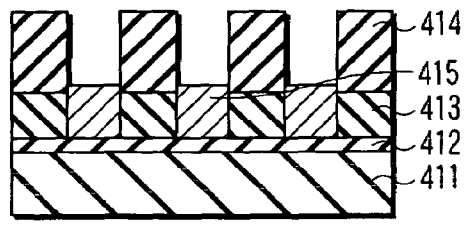
Figure 23H:
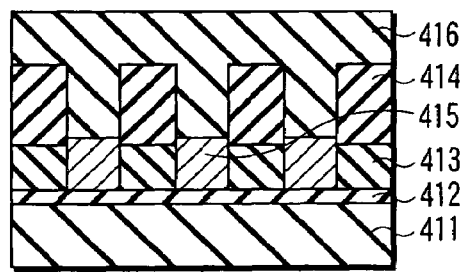
Figure 23I:
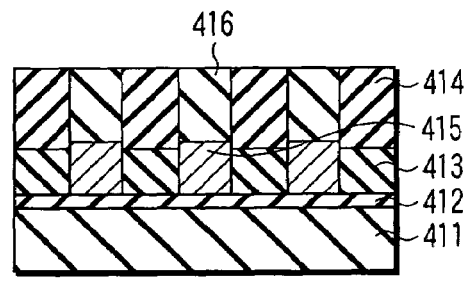
Figure 23J:
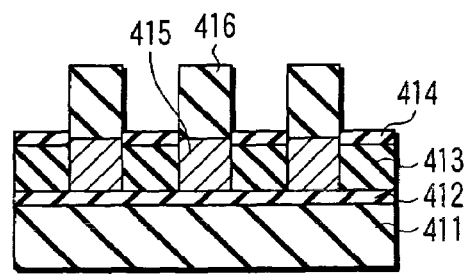
Figure 23K:
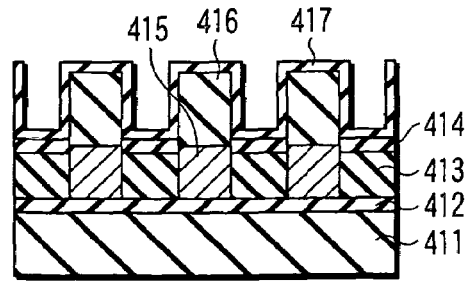
Figure 23L:
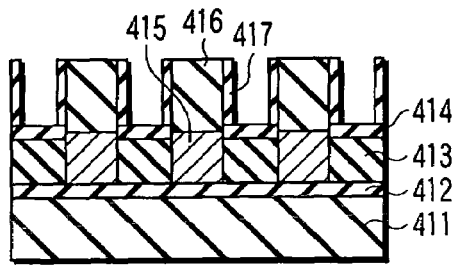
Figure 23P:
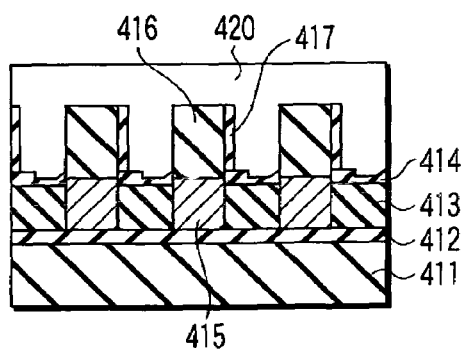
Figure 23M:
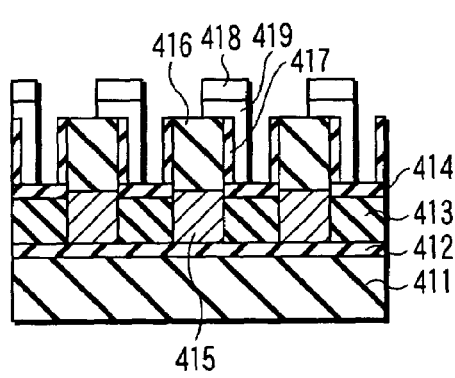
Figure 23Q:
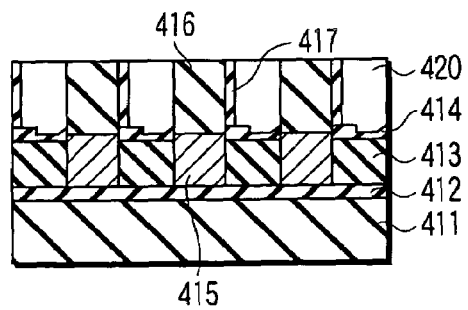
Figure 23N:
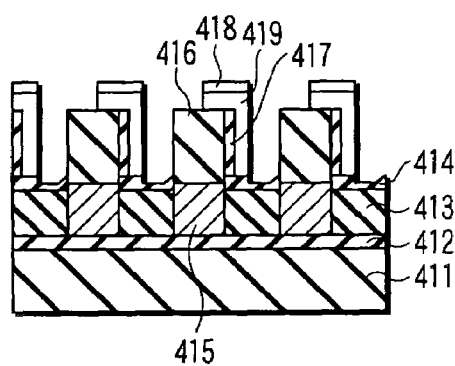
Figure 23R:
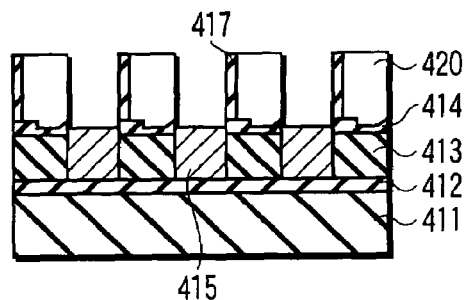
Figure 23O:
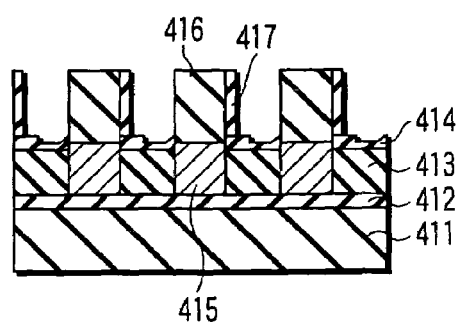
Figure 23S:
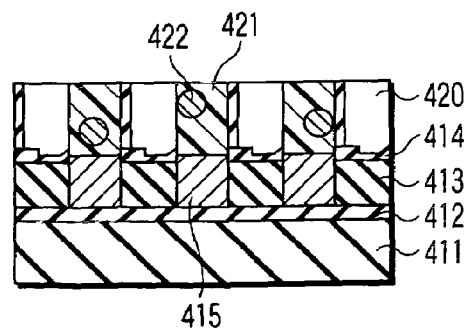
Figure 23T:
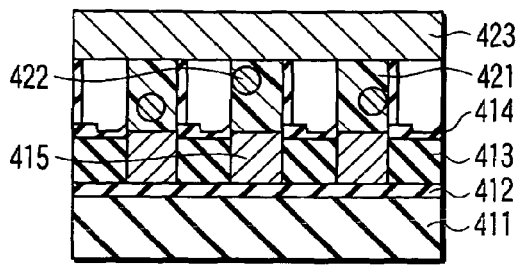
Figure 23U:
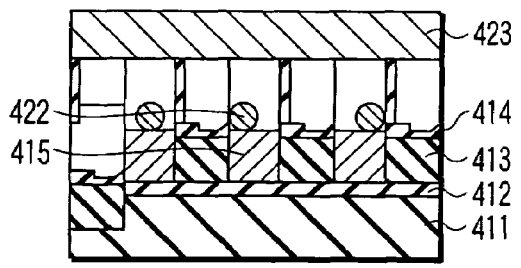
Figure 23V:
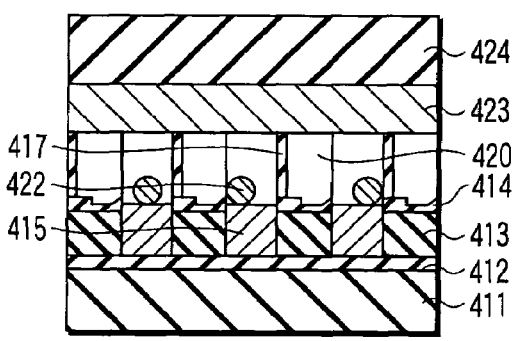

In the sixth embodiment, the manufacturing method of the storage apparatus described in the fifth embodiment is described referring to FIGS. 23A to 23V. A desired CMOS circuit 52 is formed on one surface of an Si substrate 51 having a thickness of 625 μm such as shown in FIG. 7 by using a regular CMOS process, and an obtained structure is determined as an underlying structure. However, it is not illustrated in the drawings in order to avoid complication. The CMOS circuit 52 includes connection lines extended to memory cell arrays in addition to regular MOSFETs and multilayer wiring lines.

A dielectric film 411 which includes $SiO_2$ and has a film thickness of 300 nm is first formed on this substrate by the CVD method using TEOS as a main raw material, and then an $Si_3N_4$ film 412 having a film thickness of 15 nm is formed by an LPCVD method using dichlorosilane and ammonia as main raw materials. It is to be noted that, although not shown, a connecting portion between the CMOS circuit 52 and a memory cell section is processed at this stage.

Then, as shown in FIG. 23B, a dielectric film 413 which includes $SiO_2$ and has a film thickness of 30 nm is again formed by the CVD method using TEOS as a main raw material. Subsequently, as shown in FIG. 23C, an $Si_3N_4$ film 414 having a film thickness of 40 nm is formed by the LPCVD method using dichlorosilane and ammonia as main raw materials.

Then, as shown in FIG. 23D, an imprint lithography technique is used to form a resist pattern having a pitch of 40 nm, and the $Si_3N_4$ film 414 is patterned by reactive ion etching using $CHF_3$, $CF_4$ and $O_2$ gases with the obtained resist pattern being utilized as a mask. Subsequently, as shown in FIG. 23E, the $SiO_2$ film 413 is patterned by reactive ion etching using $CHF_3$ and CO gases. After patterning, a resist is removed. It is to be noted that, although not shown, a connecting portion between the CMOS circuit 52 and a memory cell portion upper layer is processed at this stage.

Then, as shown in FIG. 23F, a film of phosphor-doped polysilicon 415 is formed by an LPCVD method which uses silane as a main raw material and has $PH_3$ added thereto. Since polysilicon has excellent groove filling properties, it completely fills each groove formed by etching, and hence an upper surface has a flat film shape.

Subsequently, as shown in FIG. 23G, an entire surface of the polysilicon film 415 is etched back by reactive ion etching using HBr and $O_2$ gases. As a result, a surface of the $Si_3N_4$ film 414 appears on the first stage, and polysilicon 415 having a film thickness of 35 nm remains in each groove on the second stage. This phosphor-doped polysilicon 415 finally serves as word lines. It is to be noted that, although not shown, the connecting portion between the CMOS circuit 52 and the memory cell portion upper layer is protected by the resist pattern in a state after the end of the first stage of this etching back, and etching back on the second stage is not carried out, thereby achieving electrical connection.

Then, as shown in FIG. 23H, an $SiO_2$ film 416 is formed by a CVD method using TEOS as a main raw material. Subsequently, as shown in FIG. 23I, the $SiO_2$ film 416 is flattened by a CMP method with the $Si_3N_4$ film 414 being utilized as a stopper. Furthermore, as shown in FIG. 23J, an entire surface of the $Si_3N_4$ film 414 is etched back by reactive ion etching using $CHF_3$, $CF_4$ and $O_2$ gases so that $Si_3N_4$ having a film thickness of 10 nm remains in each groove.

Then, as shown in FIG. 23K, an $Si_3N_4$ film 417 having a film thickness of 5 nm is formed by an LPCVD method using dichlorosilane and ammonia as main raw materials. Subsequently, as shown in FIG. 23L, an entire surface of the $Si_3N_4$ film 417 is etched by reactive ion etching using $CHF_3$, $CF_4$ and $O_2$ gases. Since reactive ion etching has excellent directionality, etching advances in a direction vertical to a plane but it hardly proceeds in a direction to a sidewall. Therefore, as shown in FIG. 23L, there is obtained a shape in which the underlying structure is exposed in the upper portion alone.

Then, as shown in FIG. 23M, an upper resist pattern 418 having a pitch of 40 nm is formed by using the imprint lithography technique with a two-layer resist in which a silicon oxide film capable of spin coating, which is called spin on glass (SOG), is used as a lower layer. Then, the silicon oxide 419 as the lower resist is processed by utilizing this upper resist pattern 418. As will be apparent from a later step, a positioning accuracy in this lithography step can be approximately ½ of a line width since it is good enough for one sidewall of the $Si_3N_4$ film 417 formed on both sidewalls of the $SiO_2$ film 416 to be covered with the silicon oxide 419 as the lower resist. Therefore, compared with a general positioning accuracy, a very loose accuracy can be accepted. Therefore, a lithography cost can be suppressed.

Then, as shown in FIG. 23N, parts of the $Si_3N_4$ film 414 and the $Si_3N_4$ film 417 which are not covered with the silicon oxide 419 are removed by wet process etching using a phosphoric acid. Since etching isotropically advances in the wet process, such a shape as shown in FIG. 23N is obtained. Subsequently, as shown in FIG. 23O, the upper resist pattern 418 and the silicon oxide 419 as the lower resist in the two-layer resist are removed.

Then, as shown in FIG. 23P, a semiconductor polysilicon film 420 is formed by an LPCVD method using silane as a main raw material. Subsequently, as shown in FIG. 23Q, the polysilicon film 420 is flattened by the CMP method with the $SiO_2$ film 416 being used as a stopper. Moreover, arsenic is ion-implanted with an acceleration voltage of 1 kV so that an impurity concentration in the vicinity of the surface of the polysilicon film 420 after impurity activation by a heat process becomes approximately $5\times10^{18}$ atoms/cm$^3$. This polysilicon film 420 finally becomes the semiconductor film 314 shown in FIG. 17. Finally, when performing a calculation using an expression $(2\in Vb/Ne)^{1/2}$ based on the impurity concentration and a dielectric constant of silicon with a junction interface of a bit line being determined as Ti, a depth of a depletion layer of a Schottky junction formed on the surface of the polysilicon film 420 is as shallow as approximately 11 nm. This is so small that a particle does not come into contact with the depletion layer in case of the ON state.

Then, as shown in FIG. 23R, the $SiO_2$ film 416 is removed by reactive ion etching using $CHF_3$ and CO gases.

Subsequently, as shown in FIG. 23S, an application liquid obtained by mixing 2 wt % of polyethylene oxide 421 having an average molecular weight of approximately 300,000 in a solution in which conductive polysilicon fine particles 422 having a diameter of 10 nm are dispersed in propylene glycol mono-methyl ether acetate (PGMEA) is applied by using a regular spin coater at 2000 rpm. Additionally, a mixed film including polyethylene oxide 421 and the fine particles 422 is formed.

Subsequently, an excess part of the mixed film including polyethylene oxide 421 and the fine particles 422 is removed by a CMP method using a 3:1 mixture containing propylene glycol mono-methyl ether (PGME) and isopropyl alcohol (IPA). As a result, a resin, in which the conductive polysilicon fine particle 422 which contains phosphor as an impurity and has a diameter of approximately 10 nm is embedded in polyethylene oxide 421, is filled in each groove formed by etching. This polysilicon fine particle 422 finally becomes a conductive particle 330 which is a movable conductor.

Then, as shown in FIG. 23T, a composite film 423 including Ti having a film thickness of 5 nm and W having a film thickness of 15 nm is successively formed by a sputtering method. Ti functions as a lower barrier metal, and forms a Schottky interface between itself and the polysilicon film 420 which becomes the semiconductor film 314. Then, the imprint lithography technique is used to form a resist pattern having a pitch of 40 nm in such a manner that this pattern is aligned in a direction vertical to a page space, and the composite film 423 is patterned by reactive ion etching using $CHF_3$ and $SF_6$ gases with the obtained resist pattern being utilized as a mask. This patterned composite film 423 finally becomes bit lines.

Subsequently, an exposed part (a non-illustrated cross-sectional portion) of the polysilicon film 420 is patterned by reactive ion etching using HBr and $O_2$ gases so that connection between bit lines adjacent to each other in the polysilicon film 420 is cut off. At this time, polyethylene oxide 421 and the embedded polysilicon fine particle 422 in the part exposed by etching the bit lines are also etched and removed at the same time. Thereafter, the resist is removed.

Then, as shown in FIG. 23U, the remaining polyethylene oxide 421 is pyrolytically decomposed by a heat treatment at 180° so that a decomposition product is vaporized and discharged from an opening portion formed by etching. As a result, the polysilicon fine particle 422 enters a movable state. Subsequently, as shown in FIG. 23V, a silicon oxide film capable of spin coating, which is called spin on glass (SOG), is formed by using a highly viscous solvent. As a result, an $SiO_2$ film 424 is formed on the composite film 423 by utilizing a meniscus obtained by surface tension while a lower space where the polysilicon fine particle 422 exists is maintained as a cavity. At this time, a part of a side surface of the composite film 423 is adjacent to the cavity, but this has an effect of reducing an electrical capacitance of the bit line. Therefore, it is rather a desirable structure.

Incidentally, in a case where a multilayer structure is provided to the memory cell portion, repeating the above-described process can obtain a desired configuration. Finally, a so-called passivation film is formed, and a wiring connecting portion as an input/output portion is formed. Thereafter, a so-called post-process such as an inspection or dicing is executed, thereby bringing the storage apparatus to completion.

Seventh Embodiment

Figure 24A:
FIGS. 24A to 24U are cross-sectional views showing a manufacturing process of a storage apparatus according to a seventh embodiment step by step.
Figure 24B:
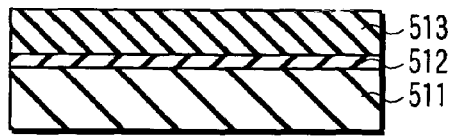
Figure 24C:
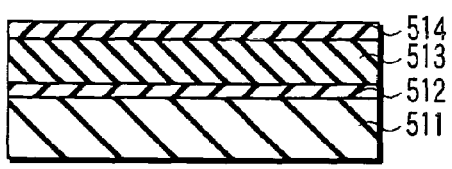
Figure 24D:
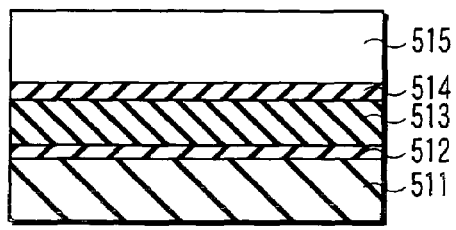
Figure 24E:
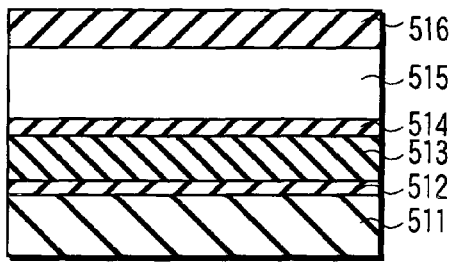
Figure 24F:
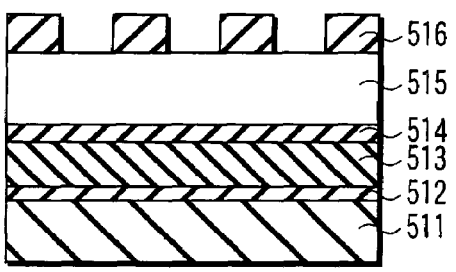
Figure 24G:
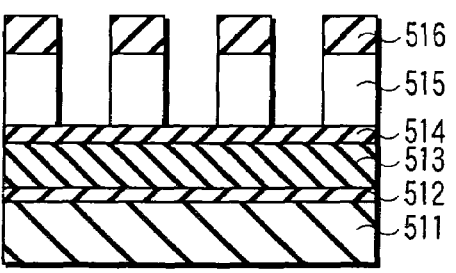
Figure 24H:
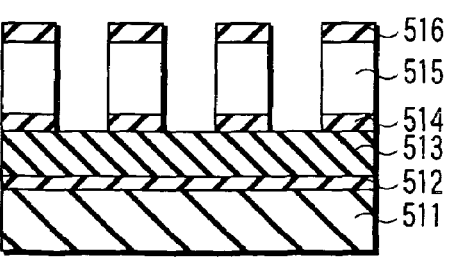
Figure 24I:
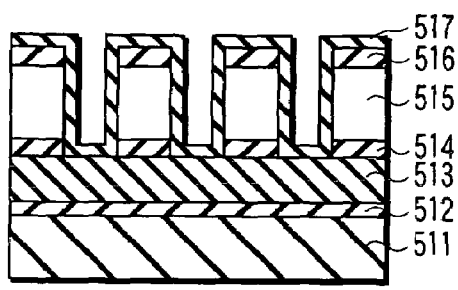
Figure 24M:
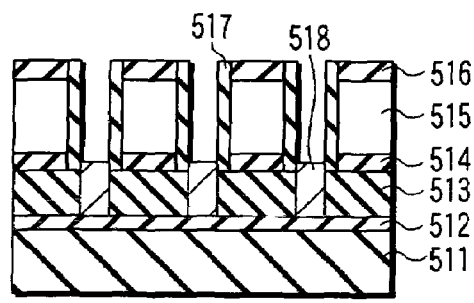
Figure 24J:
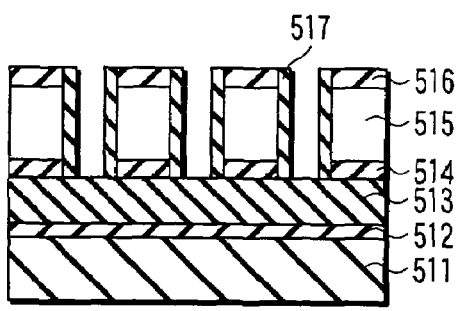
Figure 24N:
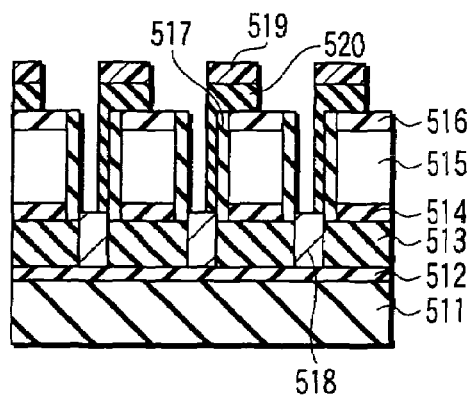
Figure 24K:
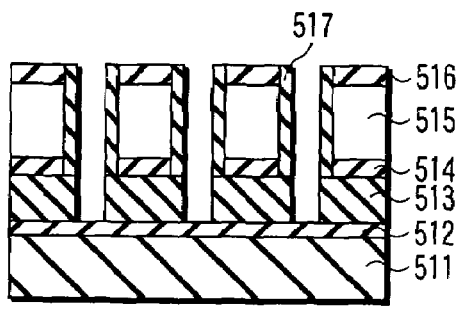
Figure 24O:
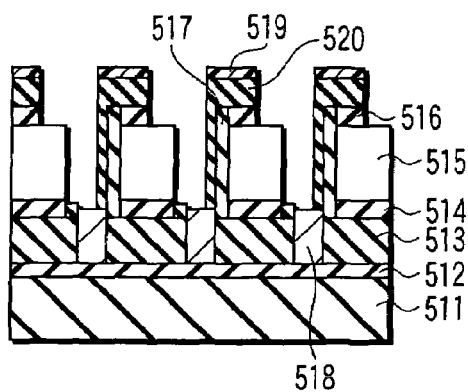
Figure 24L:
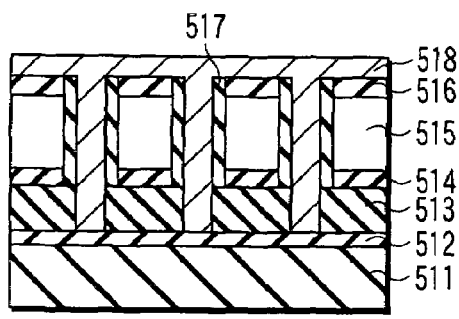
Figure 24P:
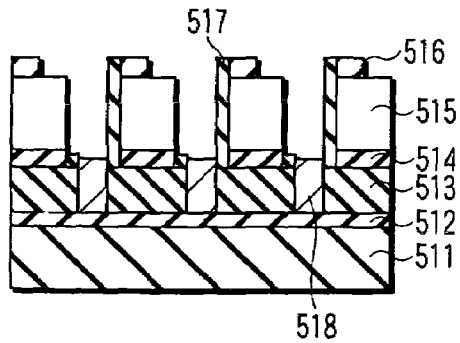
Figure 24Q:
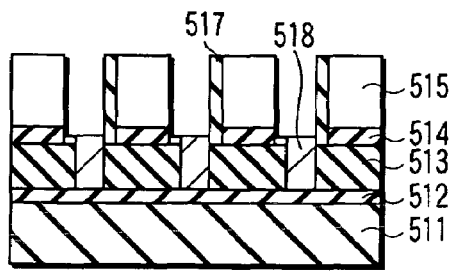
Figure 24U:
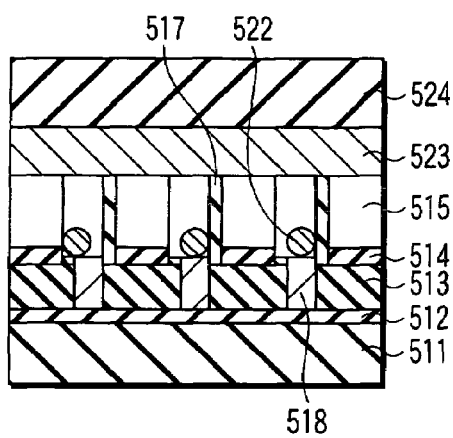

FIGS. 24A to 24U are cross-sectional views showing a manufacturing process of a storage apparatus according to the seventh embodiment of the present invention. This embodiment also describes a manufacturing process of the storage apparatus according to the fifth embodiment.

Although a structure in which a desired CMOS circuit 52 is formed on one surface of such an Si substrate 51 having a thickness of 625 μm as shown in FIG. 7 by using a regular CMOS process is determined as an underlying structure, it is not shown in the drawings in order to avoid complication. The CMOS circuit 52 includes connection lines extended to memory cell arrays in addition to regular MOSFETs and multilayer wiring lines.

First, as shown in FIG. 24A, a dielectric film 511 which includes $SiO_2$ and has a film thickness of 300 nm is formed on this substrate by the CVD method using TEOS as a main row material, and then an $Si_3N_4$ film 512 having a film thickness of 15 nm is formed by an LPCVD method using dichlorosilane and ammonia as main raw materials. It is to be noted that, although not shown, a connecting portion between the CMOS circuit 52 and a memory cell portion is processed at this stage.

Subsequently, as shown in FIG. 24B, a dielectric film 513 which includes $SiO_2$ and a film thickness of 30 nm is again formed by a CVD method using TEOS as a main raw material. Thereafter, as shown in FIG. 24C, an $Si_3N_4$ film 514 having a film thickness of 10 nm is formed by an LPCVD method using dichlorosilane and ammonia as main raw materials.

Then, as shown in FIG. 24D, a semiconductor polysilicon film 515 having a film thickness of 35 nm is formed by an LPCVD method using silane as a main raw material. Moreover, arsenic is ion-implanted with an acceleration voltage of 1 kV in such a manner that an impurity concentration in the vicinity of the surface of the polysilicon film 515 after impurity activation by a heat treatment becomes approximately $5\times10^{18}$ atoms/cm$^3$. This polysilicon film 515 finally becomes a semiconductor film 314 in FIGS. 19 to 22A and 22B. Finally, when a calculation using an expression $(2\in Vb/Ne)^{1/2}$ is performed based on the impurity concentration and a dielectric constant of silicon with a junction interface of a bit line being determined as Ti, a depth of a depletion layer of a Schottky junction formed on the surface of the polysilicon film 515 is as shallow as approximately 11 nm. This is so small that the particle does not come into contact with the depletion layer in an ON state.

Then, as shown in FIG. 24E, an $Si_3N_4$ film 516 having a film thickness of 20 nm is formed by an LPCVD method using dichlorosilane and ammonia as main raw materials. Subsequently, as shown in FIG. 24F, an imprint lithography technique is used to form a resist pattern having a pitch of 40 nm, and the $Si_3N_4$ film 516 is patterned by reactive ion etching using $CHF_3$, $CF_4$ and $O_2$ gases with the obtained resist pattern being used as a mask. Subsequently, as shown in FIG. 24G, the polysilicon film 515 is patterned by reactive ion etching using HBr and $O_2$ gases. After completion of patterning, the resist is removed. It is to be noted that, although not shown, a connecting portion between the CMOS circuit 52 and a memory cell portion upper layer is processed at this stage.

Then, as shown in FIG. 24H, an entire wafer surface is etched by reactive ion etching using $CHF_3$, $CF_4$ and $O_2$ gases to remove the $Si_3N_4$ film 514 in each groove. At this time, the $Si_3N_4$ film 516 in the groove upper portion is also simultaneously etched so that the film thickness is reduced, but the original film thickness is large, and hence this film is not completely removed. Subsequently, as shown in FIG. 24I, an $Si_3N_4$ film 517 having a film thickness of 5 nm is formed by an LPCVD method using dichlorosilane and ammonia as main raw materials.

Then, as shown in FIG. 24J, an entire surface of the $Si_3N_4$ film 517 is etched by 5 nm with reactive ion etching using $CHF_3$, $CF_4$ and $O_2$ gases. Since reactive ion etching has excellent directionality, etching advances in a direction vertical to a plane, but it hardly proceeds in a direction to a sidewall. Therefore, the $SiO_2$ film 513 is exposed in each groove alone as shown in FIG. 24J.

Then, as shown in FIG. 24K, each opening portion of the $SiO_2$ film 513 is removed by reactive ion etching using $CHF_3$ and CO gases. Subsequently, as shown in FIG. 24L, a film of phosphor-doped polysilicon 518 is formed by an LPCVD method using silane as a main raw material and has $PH_3$ added thereto. Since polysilicon has excellent groove filling properties, it completely fills each groove formed by etching. As a result, the upper surface has a flat film shape.

Then, as shown in FIG. 24M, an entire surface of the polysilicon film 518 is etched back by reactive ion etching using HBr and $O_2$ gases in such a manner that a surface of the $Si_3N_4$ film 516 appears on the first stage and polysilicon 518 having a film thickness of 35 nm remains in each groove on the second stage. This phosphor-doped polysilicon 518 finally becomes word lines. It is to be noted that, although not shown, the connecting portion between the CMOS circuit 52 and the memory cell upper layer is protected by the resist pattern in a state after the first stage of this etching back, and etching back of the second stage is not carried out, thereby achieving electrical connection.

Subsequently, as shown in FIG. 24N, an upper resist pattern 519 having a pitch of 40 nm is formed by using the imprint lithography technique with a two-layer resist in which a silicon oxide film capable of spin coating, which is called spin on glass (SOG), is used as a lower layer. Then, silicon oxide 520 as the lower resist is processed by utilizing this upper resist pattern 519. As will be apparent from a later step, a positioning accuracy at this lithography step can be approximately ½ of a line width since it is good enough for one sidewall of the $Si_3N_4$ film 517 formed on both sidewalls of the polysilicon film 515 to be covered with silicon oxide 520 as the lower resist. Therefore, compared with a general positioning accuracy, a very loose accuracy can be accepted. Accordingly, a lithography cost can be suppressed.

Then, as shown in FIG. 24O, parts of the $Si_3N_4$ film 516 and the $Si_3N_4$ film 517 which are not covered with silicon oxide 520 are removed by wet process etching using a phosphoric acid. Since etching isotropically advances in the wet process, such a shape as shown in FIG. 24O can be obtained. Subsequently, as shown in FIG. 24P, the upper resist pattern 519 and silicon oxide 520 as the lower resist in the two-layer resist are removed.

Then, as shown in FIG. 24Q, the entire wafer surface is etched by reactive ion etching using $CHF_3$, $CF_4$ and $O_2$ gases to remove upper exposed parts of the $Si_3N_4$ film 516 and the $Si_3N_4$ film 517, thereby exposing the upper surface of the polysilicon film 515. Since reactive ion etching has excellent directionality, etching advances in a direction vertical to a plane, but it hardly proceeds in a sidewall direction. Therefore, such a shape as shown in FIG. 24Q can be obtained.

Figure 24R:
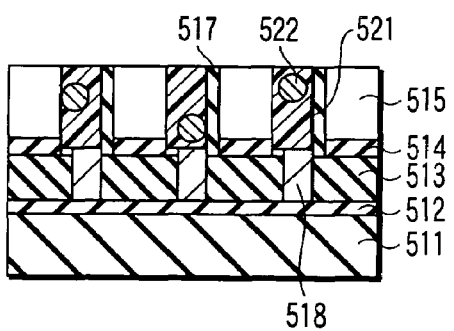

Subsequently, as shown in FIG. 24R, an application liquid in which 2 wt % of polyethylene oxide 521 having an average molecular weight of approximately 300,000 is mixed in a solution in which conductive polysilicon fine particles 522 having a diameter of approximately 10 nm are dispersed in propylene glycol mono-methyl ether acetate (PGMEA) is applied by using a regular spin coater at 2000 rpm. Additionally, a mixed film including polyethylene oxide 521 and the fine particle 522 is formed.

Then, an excess part of the mixed film including polyethylene oxide 521 and the fine particles 522 is removed by a CMP method using a 3:1 mixture containing propylene glycol mono-methyl ether (PGME) and isopropyl alcohol (IPA). As a result, each groove formed by etching is filled with a resin obtained by embedding the conductive polysilicon fine particles 522 which contains phosphor as an impurity and has a diameter of approximately 10 nm in polyethylene oxide 521. This polysilicon fine particle 522 finally becomes a conductive particle 330 (FIG. 17) which is a movable conductor.

Figure 24S:
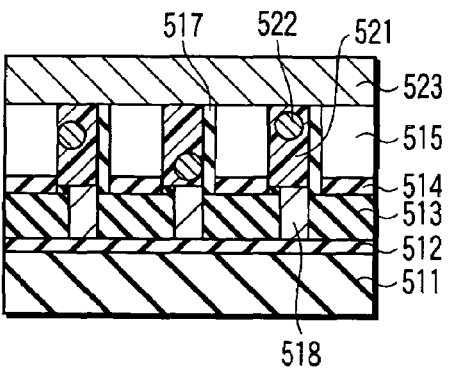

Subsequently, as shown in FIG. 24S, a composite film 523 including Ti having a film thickness of 5 nm and W having a film thickness of 15 nm is successively formed by a sputtering method. Ti functions as a lower barrier metal, and forms a Schottky interface between itself and the polysilicon film 515 which serves as a semiconductor film 314. Then, the imprint lithography technique is used to form a resist pattern having a pitch of 40 nm in such a manner that it is aligned in a direction vertical to a page space, and the composite film 523 is patterned by reactive ion etching using $CHF_3$ and $SF_6$ gases with the obtained resist pattern being utilized as a mask. This patterned composite film 523 finally becomes bit lines.

Subsequently, an exposed part (a non-illustrated cross-sectional portion) of the polysilicon film 515 is patterned by reactive ion etching using HBr and $O_2$ gases, and connection between bit lines adjacent to each other in the polysilicon film 515 is cut off. At this time, polyethylene oxide 521 and the embedded polysilicon fine particle 522 at the part exposed by etching the bit lines are also simultaneously etched and removed. Thereafter, the resist is removed.

Figure 24T:
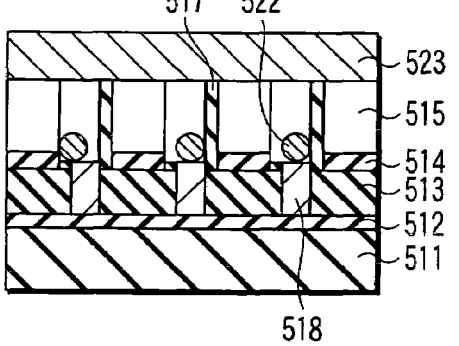

Then, as shown in FIG. 24T, the remaining polyethylene oxide 521 is pyrolytically decomposed by a heat treatment at 180° C. in such a manner that a decomposition product is vaporized and discharged from an opening portion formed by etching, and the polysilicon fine particle 522 enters a movable state. Subsequently, as shown in FIG. 24U, a silicon oxide film capable of spin coating, which is called spin on glass (SOG), is formed by using a highly viscous solvent. As a result, an $SiO_2$ film 524 is formed on the composite film 523 by utilizing a meniscus obtained by surface tension while a lower space where the polysilicon fine particle 522 exists is maintained as a cavity. At this time, a part of the side surface of the composite film 523 has a structure adjacent to the cavity, but this structure has an effect of decreasing an electrical capacitance of the bit line, and hence it is rather a desirable structure.

Incidentally, in a case where a multilayer structure is provided to the memory cell portion, repeating the above-described process can obtain a desired configuration. Finally, a so-called passivation film is formed, and a wiring connecting portion as an input/output portion is formed. Thereafter, a so-called post-process such as an inspection or dicing is carried out, thereby bringing the storage apparatus to completion.

Furthermore, the conductive polysilicon fine particle which contains phosphor as an impurity is used as a particle utilized in operations in this embodiment. However, it is also possible to use metal particles of chrome, nickel, copper, gold, titanium, aluminum and the like as other conductors, particles including alloys containing such materials, or carbon particle. Moreover, titanium oxide, tin oxide or the like as conductive metal oxides can be also used. Additionally, the shape of the particle does not have to be spherical, and a polyhedral, elliptic or columnar shape can be used.

In the case of using metal particles other than polysilicon, an interface between the metal particle and the semiconductor film 314 must form an ohmic junction rather than a Schottky junction in the ON state. Thus, a later-described step is inserted after the state shown in FIG. 24Q, and then the step shown in FIG. 24R and subsequent steps are carried out.

Figure 25A:
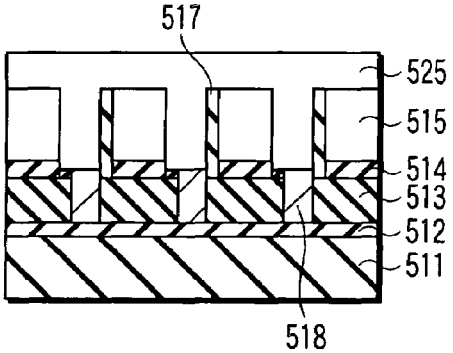
FIGS. 25A to 25C are cross-sectional views showing a modification of the manufacturing process according to the seventh embodiment step by step.
Figure 25B:
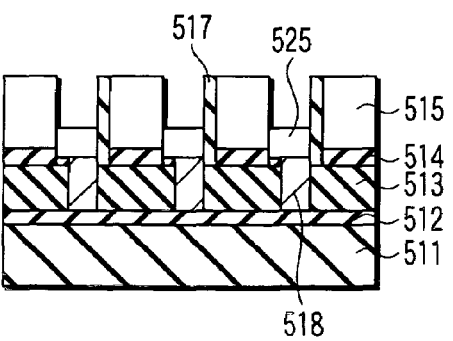

First, as shown in FIG. 25A, a BPSG film 525 as a silicon oxide film which contains a large amount of boron and phosphor is formed by the CVD method to completely fill each groove. Then, as shown in FIG. 25B, the entire wafer surface is etched back by reactive ion etching using $CHF_3$ and CO gases so that the BPSG film 525 having a film thickness of 10 nm remains in each groove.

Figure 25C:
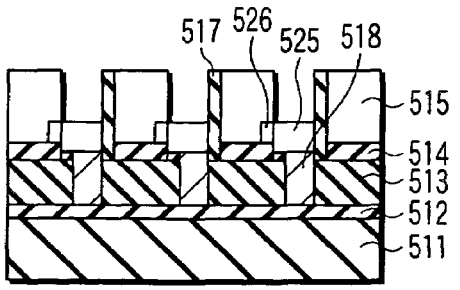

Subsequently, as shown in FIG. 25C, a heat treatment is conducted to enable solid-phase diffusion of boron and phosphor to polysilicon 515 from the BPSG film 525. An access range of solid-phase diffusion is sufficiently small, and a region 526 containing a sufficient amount of impurity can be formed at a lower part of the side surface of polysilicon 515 without affecting a Schottky junction between the film and the bit line, thereby forming an ohmic junction with respect to the contact of the metal particle. Additionally, the BPSG film 525 remaining in each groove is removed by again performing reactive ion etching using $CHF_3$ and CO gases, and the step shown in FIG. 24R and subsequent steps are carried out.

Eighth Embodiment

Figure 26:
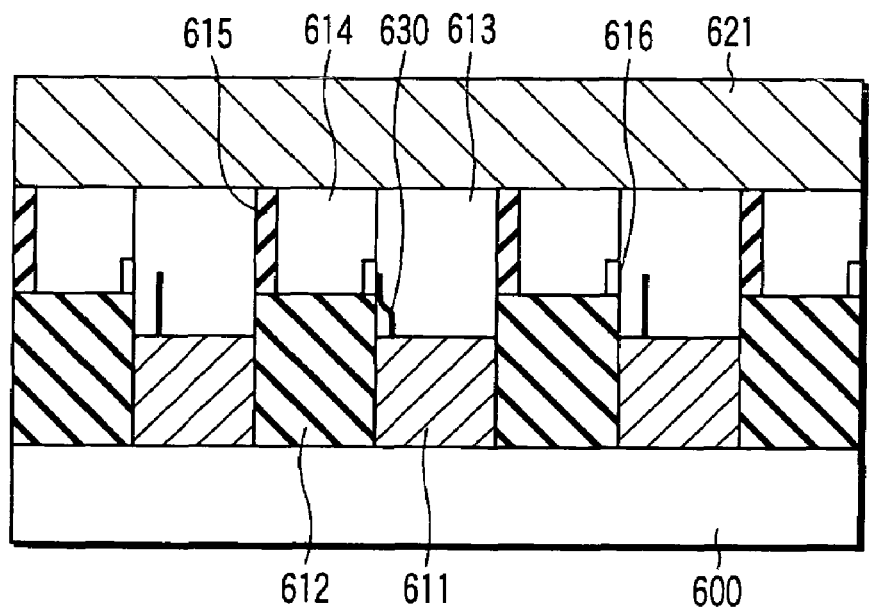
FIG. 26 is a cross-sectional view showing a cell portion structure of a storage apparatus according to an eighth embodiment.

In the eighth embodiment, as shown in FIG. 26, a plurality of row lines 611 arranged in parallel and a plurality of column lines 621 likewise arranged in parallel face each other through a gap 613 in such a manner that their line directions cross each other, and an conductive thin line (wire) 630 as a representative example of a movable conductor having one end fixed at a position apart from the center of the row line 611 and having the other movable end is arranged in this gap. Further, a convex portion 614 of a semiconductor region (a semiconductor film) is provided on a surface of the column line 621 facing the column line 611 in the same pitch as that of the row line 611. Here, the row line 611 will be referred to as a word line and the column line 621 will be referred to as a bit line in accordance with a regular MOS type memory cell. As a typical size of the conductive thin line (wire) 630, a diameter is 2 nm and a length is approximately 25 nm. Usually, the plurality of thin lines are aligned along a word line direction.

A region 616 which contains sufficient impurities is formed in a region of the semiconductor film 614 which is in contact with the conductive thin line 630, and a junction between the semiconductor film 614 and the conductive thin line 630 is set to form an ohmic junction.

In such a structure, the word lines 611 and the bit lines 621 have a simple lines-and-spaces pattern, and it is good enough for each word line 611 and each bit line 621 to have an orthogonal positional relationship, and displacement in the word line direction or the bit line direction does not have to be taken into consideration. Therefore, as will be described later, a positioning accuracy in a cell at the time of manufacture can be set very loose, thereby facilitating production.

It is to be noted that the part shown in FIG. 26 is a part of a memory cell array 41 shown in FIG. 6, and a row decoder 42 is connected with each row wiring line whilst a driver 43 including a read/write circuit and a column decoder 44 are connected with each column wiring line like a conventional memory. Adopting such a structure can collectively read/write information of all columns included in the same row at one time to effect reading and writing.

A junction portion between the column line 621 and the convex portion 614 of the semiconductor region forms a so-called Schottky junction, and functions as a diode. This diode is utilized as a cell selecting diode of a so-called crosspoint type memory cell. A function of this cell selecting diode is the same as that described in conjunction with FIGS. 18A and 18B.

An operating status of this embodiment will now be described with reference to FIGS. 27 to 30.

Figure 27:
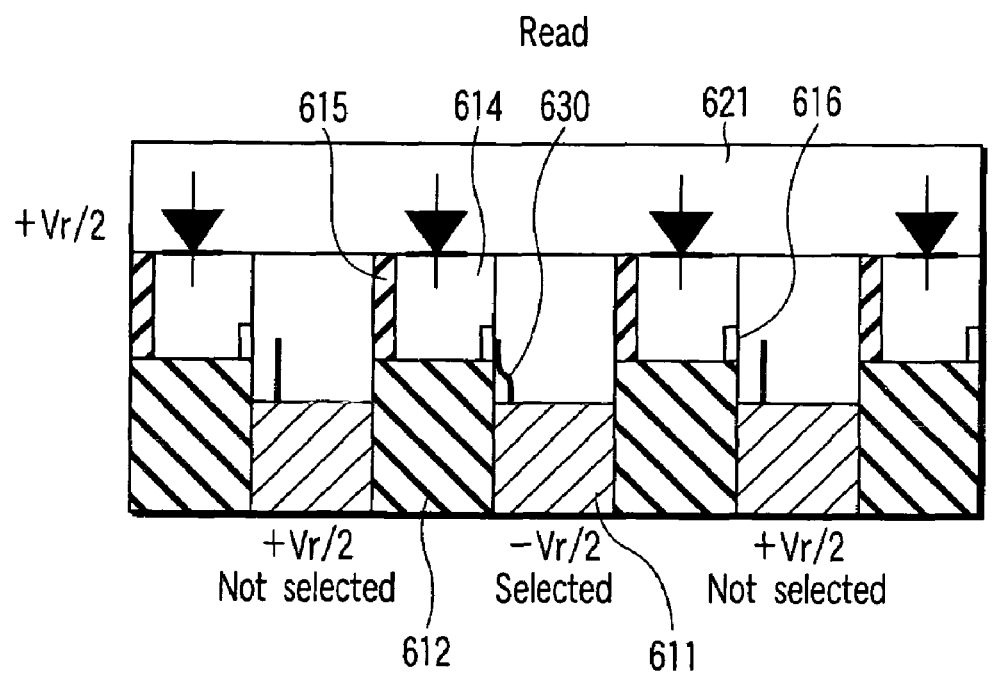
FIG. 27 is a schematic view illustrating a read operation of the storage apparatus according to the eighth embodiment.

FIG. 27 is a cross-sectional view showing a voltage application status at the time of reading. Assuming that a read voltage is Vr, +Vr/2 is applied to the bit line 621. In regard to the word line 611, −Vr/2 is applied to a selected word line including information to be read, and +Vr/2 is applied to a non-selected word line. It is to be noted that information of all columns included in the same row is collectively read as described above, and hence there is no discrimination between selection/non-selection in the bit line. In this voltage application state, since the bit line 621 and the non-selected word line have the same potential, a current does not flow through a cell connected with the non-selected word line. Therefore, detecting a current flowing through the bit line 621 can detect a current flowing through each cell on the selected word line.

It is to be noted that a current is detected by connecting a resistance for current-voltage conversion with the bit line in series and detecting voltages at both ends of this resistance as often performed. Specifically, both ends of the resistance are input to a voltage amplifier, and whether an amplifier output voltage exceeds a threshold value is judged by using a comparator. In each cell, if one end of the conductive thin line 630 is close enough to the semiconductor film 614, an ON state is defined since a current flows through a cell by tunneling even though the conductive thin line 630 is not firmly in contact with the semiconductor film 614. If one end of the conductive thin line 630 is far enough from the semiconductor film 614, a current rarely flows through a cell, and hence an OFF state is defined.

A tunneling current is dependent on an inter-electrode distance in terms of an exponential function. Usually, when the inter-electrode distance differs by 1 nm, the tunneling current varies by more than one order. Therefore, a boundary between the ON state and the OFF state can be sufficiently clearly defined in a practical range. Additionally, a dielectric film 615 provided on one of the sidewalls of the semiconductor film 614 having a normal line in a direction of the bit line 621 prevents two word lines from being electrically short-circuited when the two conductive thin lines 630 electrically come into contact with the same semiconductor film 614. Further, the region 616 containing a sufficient amount of an impurity is formed in the region of the semiconductor film 614 with which the conductive thin film 630 is in contact, and a junction between the semiconductor film 614 and the conductive thin film 630 is set to form an ohmic junction.

It is to be noted that the voltage application status shown in FIG. 27 is just an example. For instance, all voltages may be reduced by Vr/2 so that 0 V is applied to the bit line 621 and the non-selected word line and −Vr is applied to the selected word line. In such a case, a different technique can be applied to current detection. For example, before applying a read voltage, all bit lines are connected with the ground (0 V) in advance to determine a potential as 0 V, and then the bit lines are disconnected from the ground and connected with an input of the voltage amplifier.

When the voltage of the selected word line is changed from 0 V to −Vr in terms of pulses in this state, a potential of the bit line connected with a cell which is in the OFF state rarely changes, but a potential of the bit line connected with a cell which is in the ON state varies to approximate −Vr in terms of pulses, thereby obtaining a pulsing voltage change amplified as an output from the voltage amplifier. When the pulse is extremely long, there is a possibility that a large potential difference is produced between the bit line 621 and the non-selected word line. However, this is a potential difference which reverses a direction of the diode, and hence no current flows through a cell connected with the non-selected word line. Therefore, detecting a voltage change in an output from this amplifier can judge ON/OFF of the selected cell.

FIGS. 28A and 28B are cross-sectional views each showing a voltage application status at the time of writing. FIG. 28A shows a case where the bit line is selected, and FIG. 28B shows a case where the bit line is not selected. Assuming that a write voltage is Vw, +Vw/2 is applied to a selected bit line connected with a cell, which is a writing target to change from the OFF state to the ON state, −Vw/2 is applied to a selected word line connected with the same, −Vw/2 is applied to other non-selected bit lines, and +Vw/2 is applied to non-selected word lines, respectively. As a result, as will be described later, the conductive thin line 630 of a selected cell can be set to the ON state without changing a state of the conductive thin line 630 in a non-selected cell.

As forces acting on the conductive thin line 630 having one fixed end and the other movable end, there are an electrostatic force acting between electric charges between the conductive thin line 630 and the semiconductor film 614 both having these electric charges, an elastic force caused due to elastic deformation of the conductive thin line 630, and an interatomic force which is caused by the contact between the conductive thin line 630 and the semiconductor film 614 and becomes nonignorable since contact area forms in a line shape rather than a point. Here, considering a potential based on the elastic force and the interatomic force excluding the electrostatic force which varies in dependence on a voltage applied to an electrode, a minimum of the potential based on the elastic force, i.e., first stable equilibrium is in a state where the conductive thin line 630 is not deformed. Furthermore, a minimum of the potential based on the interatomic force, i.e., second stable equilibrium is in a state where the conductive thin line 630 is in contact with the semiconductor film 614. Since the interatomic force takes a significant value in an extremely short range only, there is substantially no problem in independent existence of these two types of stable equilibrium even if both forces are taken into consideration.

This first stable equilibrium can be set as the OFF state, and the second stable equilibrium can be set as the ON state. Moreover, there is a large difference in the gradient of the potential in the vicinity of these two types of stable equilibrium. That is, since one end of the conductive thin line is a free end, a change in energy of the elastic force is relatively small with respect to deformation in the vicinity of the first equilibrium. However, since the potential based on the interatomic force takes a significant value in a short range alone, a change in energy is relatively large with respect to deformation in the vicinity of the second equilibrium. Therefore, assuming that F1 is an attraction force required to enable deformation from the first equilibrium to the second equilibrium beyond a wall of the potential and F2 is a repulsive force required to enable deformation from the second equilibrium to the first equilibrium beyond the wall of the potential, F2 is significantly larger than F1.

In accordance with this, it is assumed that Vc1 is a voltage difference between electrodes with which the electrostatic force becomes equal to F1 and Vc2 is an electrode voltage with which the electrostatic force becomes equal to F2 (both polarities are the same since it is the repulsive force). When the voltage difference between electrodes is smaller than Vc1, a movement between the two types of equilibrium does not occur. When the voltage difference between electrodes is larger than Vc1 but smaller than Vc2, a movement from the first equilibrium to the second equilibrium can occur, but a movement from the second equilibrium to the first equilibrium is not produced. When the electrode voltage is larger than Vc2, a movement between the two types of equilibrium can occur in both directions.

In order to determine whether a movement is actually generated, other conditions which depend on a distribution situation including a polarity of an electric charge are also required. However, conditions under which the movement does not occur can be determined based on at least the above-described reference. Therefore, setting the read voltage Vr to be smaller than the voltage Vc1, which enables a movement, can perform the read operation without changing one of the two equilibrium points where the conductive thin line 630 exists, namely, without changing the ON/OFF state.

Additionally, setting the write voltage Vw to be larger than Vc1, but smaller than Vc2, it is possible to realize a situation in which transition from the OFF state to the ON state can occur but transition from the OFF state to the ON state does not occur. Further, a later-describe erase voltage Ve must be set to be larger than Vc2, thereby enabling a situation where transition from the ON state to the OFF state can occur. It is to be noted that the conductive thin line 630 also receives an electrostatic force from the adjacent semiconductor film 614 in a precise sense, but the conductive thin line 630 is placed at a position deviating from the center, and hence it can be considered that this line is substantially driven by a force from a closer semiconductor region.

As shown in the center of FIG. 28A, since a voltage between electrodes is Vw in a cell where both the bit line and the word line are selected, transition to the ON state occurs when the OFF state is achieved before voltage application. Even if the ON state is set from the beginning, transition to the OFF state does not occur, and the ON state remains. On the contrary, in a cell where the bit line alone is selected and the word line is not selected, there is no potential difference between both electrodes, and hence no change occurs.

Further, in a cell where the word line alone is selected and the bit line is not selected, since there is likewise no potential difference between both electrodes, no change occurs. Furthermore, in a cell where both the bit line and the word line are not selected, since a reverse voltage is applied to the selection diode, a potential of the semiconductor film 614 does not become −Vw/2. It becomes +Vw/2 when the cell is in the ON state, and it becomes 0 when the cell is in the OFF state. Therefore, a potential difference between electrodes becomes Vw/2 at the maximum level, and hence transition between the ON and OFF states does not occur if Vw/2 is smaller than Vc1.

As described above, transition between the ON and OFF states does not occur in a non-selected cell including a half-selected cell, and the state necessarily shifts to the ON state in the selected cell. Therefore, writing is possible in the voltage application state shown in FIG. 28A. Moreover, as apparent from FIGS. 28A and 28B, since there is no interference between cells connected with different bit lines, simply applying a voltage of a selected bit line to all desired bit lines can perform writing in a plurality of cells connected with the same word line at the same time.

In the actual write operation, switching a circuit to insert a resistance to a selected bit line in series can suppress power consumption. As described above, in the write operation, the state shifts to the ON state. However, an electrical resistance of a cell is greatly reduced when the ON state is achieved, and hence both a current and power consumption are increased. If a transition time to the ON state can be estimated in advance, setting a time width of a write voltage pulse in the write operation to be substantially equal to the transition time can avoid an increase in power consumption which is caused due to a flow of an excessive current.

However, it is difficult to take a counter measure when a transition time is hard to be estimated. On the contrary, when a resistance is inserted in series with respect to a selected bit line, there is almost no influence of the series resistance since a current flowing through a cell is very small during a movement of the conductive thin line 630 from the OFF state to the ON state. However, when the thin line reaches an ON-state position and a current is to be increased, the same current flows through the series resistance, and hence a voltage is decreased. As a result, a voltage applied to the cell drops. Even if an ON resistance value remains unchanged, a power to be consumed in the cell is greatly lowered (if the resistance value remains unchanged, power consumption is in proportion to a square of the voltage).

Although power is consumed in the resistance inserted in series, a power supply voltage is the same and all resistances are increased as seen from the entire circuit, and hence it is apparent that entire power consumption is reduced. Additionally, measuring voltages at both ends of this resistance inserted in series can confirm that the cell has shifted to the ON state, i.e., writing has been completed, and an operation of detecting completion of writing to lower an application voltage can be added. In any case, a power which is consumed in the write operation can be decreased.

Incidentally, there is also a case where the complete ON state cannot be achieved by one write operation (a time width of a write pulse) depending on situations. Therefore, after the write operation, a state of the same cell is confirmed by the read operation. When the ON state is confirmed, the processing advances to an operation of the next cell. Further, when the ON state cannot be confirmed, it is desirable to repeat the process of again performing the write operation again until the ON state is confirmed. More preferably, an upper limit is set with respect to the number of repetitions. When the ON state cannot be confirmed even though the write operation is carried out for the number of times which is the set upper limit, it is good enough to judge a corresponding cell as a defective cell and use another alternative cell to store information.

Furthermore, the voltage application status shown in each of FIGS. 28A and 28B is just an example. In principle, arbitrary combinations can be used under conditions that a voltage difference between a bit line and a word line in a selected cell is larger than the voltage Vc1 with which the OFF state shifts to the ON state in the cell and a potential difference between a bit line and a word line in a half-selected cell is smaller than the voltage Vc1 with which the OFF state shifts to the ON state.

FIG. 29 is a cross-sectional view showing a voltage application status at the time of erasing. It is to be noted that erasing is performed as collective erasing which simultaneously erases cells connected with the same word line. Assuming that an erase voltage is Ve, −Ve/2 is applied to a bit line as an erasing target, and +Ve/2 is applied to a word line.

As shown in FIG. 29, since a reverse voltage is applied to a selection diode of a cell at this time, both the semiconductor film 614 and the conductive thin line 630 have a potential of +Ve/2 in a cell which is in the ON state. If this potential is larger than Vc2 mentioned above, transition from the ON state to the OFF state occurs. In a cell which has once entered the OFF state, since both the semiconductor film 614 and the conductive thin line 630 are charged to have a positive polarity, the electrostatic force remains as the repulsive force, and the OFF state does not again shift to the ON state.

On the other hand, in a cell which is in the OFF state from the beginning, since a reverse voltage is applied to a selecting diode of the cell, a potential of the semiconductor film 614 becomes 0, and a potential difference between electrodes becomes Ve/2. If Ve/2 is smaller than the voltage Vc1 which enables transition from the OFF state to the ON state, the state of the cell does not vary and remains in the OFF state. If Ve/2 is larger than the voltage Vc1 which enables transition from the OFF state to the ON state, the cell once shifts to the ON state. However, transition to the ON state allows the conductive thin film 630 to charge the semiconductor film 614, whereby the same potential is provided. If +Ve/2 is larger than Vc2 as described above, transition from the ON state to the OFF state occurs. Therefore, in any case, the cell finally enters the OFF state, and erasing can be performed by the voltage application state shown in FIG. 29.

Further, as can be understood from FIG. 29, since there is no interference between cells connected with different word lines, simply applying a voltage to all desired word lines can perform erasing with respect to cells connected with the plurality of word lines.

In the case of actually effecting the erase operation, voltage application shown in FIG. 29 is effected during a preset time width of an erase voltage pulse. Like the write operation, since a reverse voltage is applied to a diode formed of the semiconductor film 614, a capacitor is electrically charged. Therefore, the time width of the erase voltage pulse is set considering a time constant of this charging. Furthermore, in a regular two-terminal memory element, when electrically switching a cell with a low resistance in the ON state to the OFF state, a large initial current is necessarily required, thereby increasing the power consumption. On the contrary, in this embodiment, since a reverse voltage is applied to the diode in the erase operation which is switching to the OFF state, this problem can be avoided, thus achieving a reduction in power consumption.

It is to be noted that the OFF state may not be possibly achieved by one erase operation (a time width of an erase pulse) in some cases. Therefore, after the erase operation, a state of a cell is confirmed by the read operation. When the OFF state is confirmed, the processing advances to the next operation. Furthermore, when the OFF state cannot be confirmed, it is desirable to repeat a process of again executing the erase operation again until the OFF state is confirmed. More desirably, an upper limit is set with respect to the number of repetitions. When the OFF state cannot be confirmed even though the erase operation is carried out for the number of times which is the set upper limit, it is good enough to judge a corresponding cell as a defective cell and use another alternative cell to store information.

Moreover, the voltage application status shown in FIG. 29 is just an example. In principle, arbitrary combinations of potentials or the like of bit lines can be used if potentials of the semiconductor film 614 and a word line in a cell are larger than the voltage Vc2 which enables transition from the ON state to the OFF state.

In present memories in which high integration is achieved, a redundancy circuit which rectifies a defect in manufacture must be provided in order to improve a production yield. In the case of a conventional memory cell array using selecting transistors, when the transistor produces a short-circuit defect (a defect which reduces a resistance between a source and a drain irrespective of a gate voltage), cells which share a bit line (or a word line) with this transistor is affected. Therefore, this problem can be avoided simply by disconnecting the corresponding bit line (or word line) by a fuse or the like and switching this line to a preliminary bit line (or word line).

However, in a crosspoint type memory cell array using selecting diodes, when the diode produces a short-circuit defect (a defect with which a reverse current cannot be suppressed), a cell which does not share a bit line or a word line with this diode, i.e., the entire cell array may possibly be affected (see FIG. 18A). Therefore, it is necessary to provide means for shifting the cell in which the selection diode has produced the short-circuit defect to the OFF state by any method. Or, a counter measure must be taken by disconnecting one entire block of the cell array and replacing it with another block of the cell array, which decrease an area efficiency of the cell. In the structure according to this embodiment, an erase-for-rescue operation mentioned below can solve this problem.

FIG. 30 is a cross-sectional view showing a voltage application status at the time of the erase-for-rescue operation. It is to be noted that the erase-for-rescue operation is likewise performed as collective erasing which simultaneously performs erasing with respect to cells connected with the same word line. Assuming that an erase-for-rescue voltage is Vee, −Vee/2 is applied to a word line as an erasing target, and −Vee/2 is also applied to a bit line.

As shown in FIG. 30, both the semiconductor film 614 and the conductive thin film 630 have a potential of −Vee/2 irrespective of the ON/OFF state of a cell and are charged to have a negative polarity, and hence a repulsive force acts. Therefore, in a cell which is in the ON state, if −Vee/2 is larger than Vc2 mentioned above, transition from the ON state to the OFF state occurs, and the cell which has entered the OFF state does not shift to the ON state. If a cell is in the OFF state from the beginning, an attracting force does not act, and hence a state of the cell does not vary. Therefore, the cell finally enters the OFF state in any case, and the erase-for-rescue operation becomes possible by the voltage application state shown in FIG. 30. Additionally, as can be understood from FIG. 30, since there is no interference between cells connected with different word lines, simply applying a voltage to all desired word lines can simultaneously perform the erase-for-rescue operation with respect to cells connected with a plurality of word lines.

In the case of actually effecting the erase-for-rescue operation to a cell which is in the ON state, the voltage application shown in FIG. 30 is carried out during a preset time width of an erase-for-rescue voltage pulse. Differing from the write operation or the regular erase operation, since a reverse voltage is not applied to a diode formed of the semiconductor film 614, a time constant of charging a capacitor in the diode portion does not have to be taken into consideration. However, a wiring capacitance exists, and hence a time width of an erase voltage pulse is set while in consideration of this capacitance. Further, in a regular two-terminal memory element, when electrically switching a cell with a low resistance in the ON state to the OFF state, a large initial current is required, thereby increasing the power consumption. On the contrary, in this embodiment, since both ends of a cell have the same potential during the erase-for-rescue operation which is switching to the OFF state, a current does not flow through the cell, thereby avoiding this problem to achieve a reduction in power consumption.

It is to be noted that the OFF state may not be achieved by one erase-for-rescue operation (a time width of an erase-for-rescue pulse) in some cases. Therefore, after the erase-for-rescue operation, a state of a cell is confirmed by the read operation. If the OFF state is confirmed, the processing advances to the next operation. Furthermore, if the OFF state cannot be confirmed, it is desirable to repeat a process of again effecting the erase-for-rescue operation until the OFF state is confirmed. More desirably, an upper limit is set with respect to the number of times of repetition. If the OFF state cannot be confirmed even though the erase-for-rescue operation is effected for the number of times which is the set upper limit, it is good enough to judge a corresponding cell as a defective cell and use another alternative cell to store information.

Moreover, the voltage application status shown in FIG. 30 is just an example. In principle, arbitrary combinations of potentials or the like of bit lines can be used if potentials of the semiconductor film 614 and a word line in a cell are larger than the voltage Vc2 which enables transition from the ON state to the OFF state.

As described thus far, in this embodiment, an electric charge is used for reading/writing information, but a physical shape of the conductive thin line rather than an accumulated charge is used for storage. Therefore, this embodiment is characterized in that stored contents are hardly affected by natural radiation. Additionally, since a size of the thin line is based on an order of 10 nm like the foregoing example, a gravitational force acting on the thin line is as small as approximately $10^{-18}$ N, and a movement of a thin line due to the gravitational force acting on the thin line or an external impact shock can be ignored. Of course, magnetism is not utilized, thereby providing a storage apparatus which is hardly affected by a disturbance of a magnetic field.

Ninth Embodiment

Figure 31A:
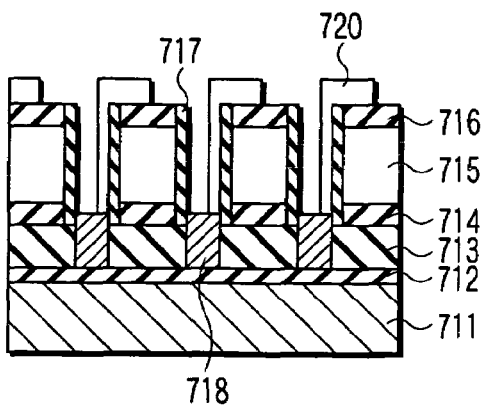
FIGS. 31A to 31N are cross-sectional views showing a manufacturing process of a storage apparatus according to a ninth embodiment step by step.
Figure 31D:
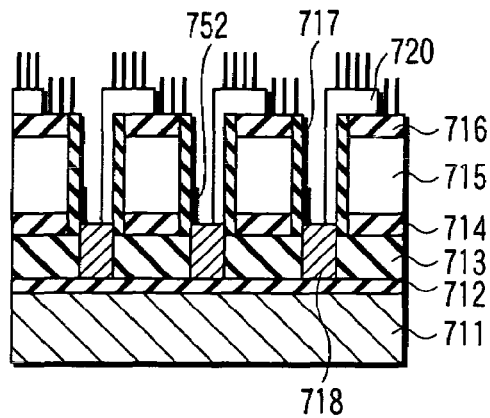
Figure 31B:
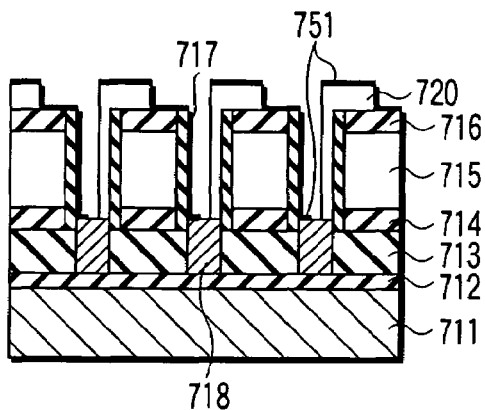
Figure 31E:
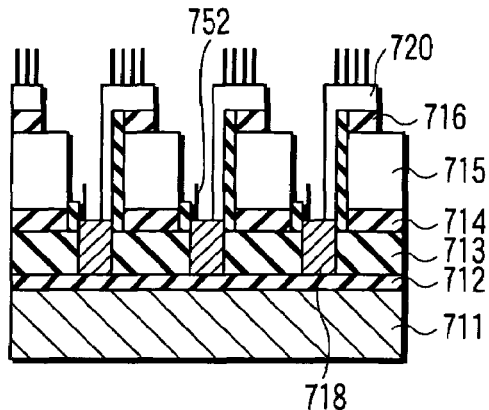
Figure 31C:
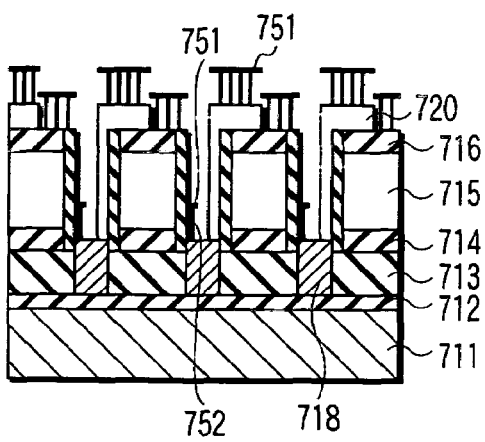
Figure 31F:
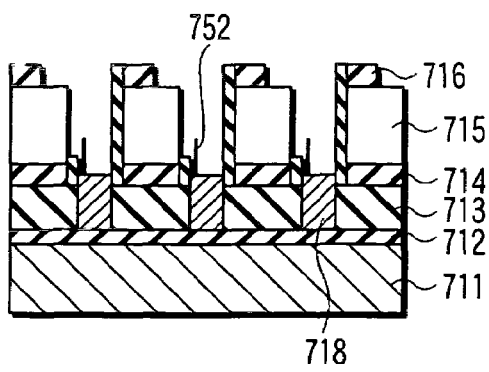
Figure 31G:
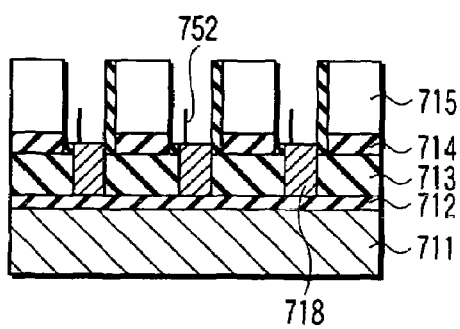
Figure 31K:
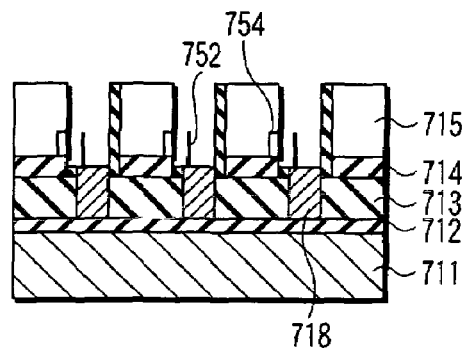
Figure 31H:
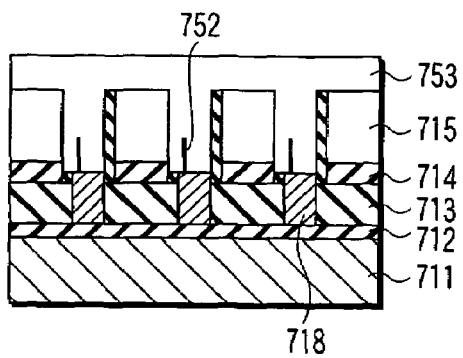
Figure 31L:
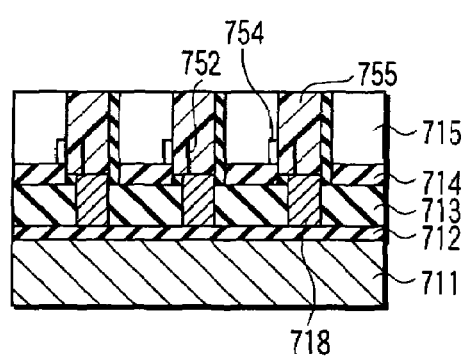
Figure 31I:
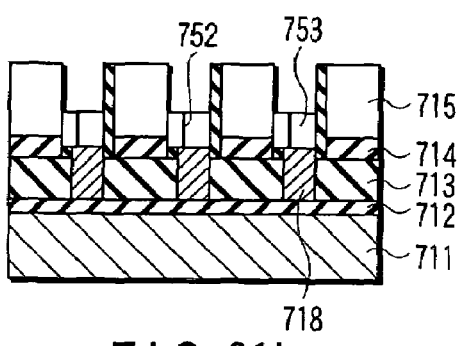
Figure 31M:
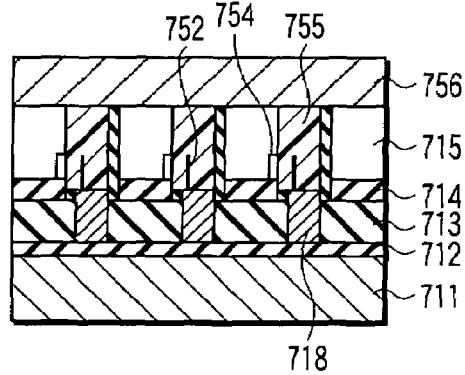
Figure 31J:
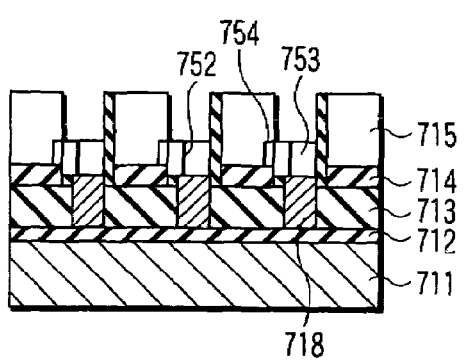
Figure 31N:
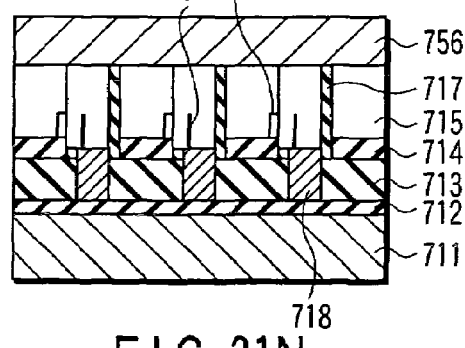

In the ninth embodiment, the manufacturing process of the storage apparatus according to the eighth embodiment is described referring to FIGS. 31A to 31N.

It is to be noted that a half of the process is completely the same as that in the seventh embodiment, and hence FIGS. 24A to 24N are utilized. Further, reference numerals 711 to 720 in FIGS. 31A to 31N correspond to reference numerals 511 to 520 in FIGS. 24A to 24N.

A structure in which a desired CMOS circuit 52 is formed on one surface of such an Si substrate 51 having a thickness of 625 μm as shown in FIG. 7 by a regular CMOS process is determined as an underlying structure, but it is not shown in the drawings in order to avoid complication. The CMOS circuit 52 includes connection lines extended to memory cell arrays in addition to regular MOSFETs and multilayer wiring lines.

In this embodiment, as shown in FIG. 31A, like FIGS. 24A to 24N, after forming an $SiO_2$ film 711, an $Si_3N_4$ film 712, an $SiO_2$ film 713, an $Si_3N_4$ film 714, a polysilicon film 715, an $Si_3N_4$ film 716, an $Si_3N_4$ film 717, phosphor-doped polysilicon 718 and silicon oxide 720, an upper resist pattern (not shown, corresponding to 519 in FIG. 24) in a two-layer resist is removed.

Then, as shown in FIG. 31B, a film of a mixture 751 which has a film thickness of 2 nm and contains 90% of Ni and 10% of Fe is formed by a sputtering method. The substrate is slightly inclined at the time of film formation so that the film is not formed on a side where silicon oxide 720 at each groove bottom remains but the film is formed on a side where the $Si_3N_4$ film 717 remains. As a result, at the next step, an conductive thin line (630 in FIG. 26) is formed along a line apart from the center on which no silicon oxide 720 exists. It is to be noted that an extremely small amount of the film is also formed on a sidewall of the $Si_3N_4$ film 717, but an incidence angle is very large, and hence this film has a negligible film thickness.

Then, as shown in FIG. 31C, a carbon thin line 752 having a diameter of 2 nm and a length of 25 nm is formed by a CVD method using a $CH_4$ gas as a main component with the mixture 751 containing 90% of Ni and 10% of Fe being utilized as a catalytic agent. This carbon thin line 752 finally becomes an conductive thin line 630 (FIG. 26) as a movable conductor. Since the mixture 751 containing 90% of Ni and 10% of Fe constantly exists at a leading reactive end as the catalytic agent, the carbon thin line 752 is formed below the mixture 751 containing 90% of Ni and 10% of Fe. The carbon thin lines formed in this example contain both ones with semiconductive properties and others with metallic properties, but an operation is possible without a problem if at least one of the plurality of thin lines formed in a word line direction has metallic properties in one cell. Subsequently, as shown in FIG. 31D, a mixed liquid including a sulfuric acid and hydrogen peroxide is used to perform wet etching, thereby removing the mixture 751 containing 90% of Ni and 10% of Fe.

Then, as shown in FIG. 31E, parts of the $Si_3N_4$ film 716 and the $Si_3N_4$ film 717 which are not covered with silicon oxide 720 are removed by wet process etching using a phosphoric acid. Since etching isotropically advances in the wet process, such a shape as shown in FIG. 31E can be obtained, and the carbon thin line 752 formed in the etched region is removed together with the underlying $Si_3N_4$ film 716. Subsequently, as shown in FIG. 31F, silicon oxides 720 are removed by wet process. At this time, the carbon thin line 752 formed on silicon oxide 720 is removed together with silicon oxide 720.

Then, as shown in FIG. 31G, an entire wafer surface is etched by reactive ion etching using $CHF_3$, $CF_4$ and $O_2$ gases to remove the exposed upper parts of the $Si_3N_4$ film 716 and the $Si_3N_4$ film 717, thereby exposing the upper surface of the polysilicon film 715. Since reactive ion etching is superior in directionality, etching advances in a direction vertical to a plane, but it hardly proceeds in a sidewall direction, and hence such a shape as shown in FIG. 31G is obtained.

Subsequently, as shown in FIG. 31H, a BPSG film 753 as a silicon oxide film containing a large amount of boron and phosphor is formed by the CVD method to completely fill each groove. Then, as shown in FIG. 31I, the entire wafer surface is etched back by reactive ion etching using $CHF_3$ and CO gases so that a 20 nm-thick BPSG film 753 remains in each groove.

Then, as shown in FIG. 31J, a heat treatment is conducted to allow solid-phase diffusion of boron and phosphor from the BPSG film 753 to polysilicon 715. A solid-phase diffusion access range is small enough, and a region 754 containing a sufficient amount of an impurity can be formed at a lower portion of a side surface of polysilicon 715 without affecting a Schottky junction between this region and a bit line, thereby forming an ohmic junction with respect to contact of a metallic carbon thin line. Subsequently, as shown in FIG. 31K, the BPSG film 753 remaining in each groove is removed by reactive ion etching using $CHF_3$ and CO gases.

Then, as shown in FIG. 31L, an application liquid obtained by mixing 2 wt % of polyethylene oxide having an average molecular weight of approximately 300,000 in propylene glycol mono-methyl ether acetate (PGMEA) is applied by using a regular spin coater at 2000 rpm to fill each groove with a resin 755 including polyethylene oxide. Further, an excess part of the polyethylene oxide film is removed by a CMP method using a 3:1 mixture including propylene glycol mono-methyl ether (PGME) and isopropyl alcohol (IPA).

Then, as shown in FIG. 31M, a composite film 756 including Ti with a film thickness of 5 nm and W with a film thickness of 15 nm is successively formed by a sputtering method. Ti functions as a lower barrier metal, and forms a Schottky interface between itself and the polysilicon film 715 which becomes a semiconductor film (614 in FIG. 26). Subsequently, an imprint lithography technique is used to form a resist pattern having a pitch of 40 nm to be aligned in a direction vertical to a page space, and the composite film 756 is patterned by reactive ion etching using $CHF_3$ and $SF_6$ gases with the obtained resist pattern being utilized as a mask. This patterned composite film 756 finally becomes a bit line.

Subsequently, an exposed part (a non-illustrated cross-sectional part) of the polysilicon film 715 is patterned by reactive ion etching using HBr and $O_2$ gases, and connection between bit lines adjacent to each other in the polysilicon film 715 is cut off. At this time, the resin 755 including polyethylene oxide and the embedded carbon thin line 752 at the part exposed by etching the bit lines are also simultaneously etched and removed. Further, the resist is removed off.

Furthermore, as shown in FIG. 31N, the remaining resin 755 including polyethylene oxide is pyrolytically decomposed by a heat treatment at 180° C. so that a decomposition product is vaporized and discharged from each opening portion formed by etching, thereby allowing a movement of the carbon thin line 752. Subsequently, a silicon oxide film capable of spin coating, which is called spin on glass (SOG), is formed by using a highly viscous solvent. As a result, an $SiO_2$ film is formed on the composite film 756 by utilizing a meniscus obtained by surface tension while maintaining a lower space where the carbon thin line 752 exists as a cavity. At this time, a part of a side surface of the composite film 756 may be also possibly adjacent to the cavity, but this structure has an effect of reducing an electrical capacitance of the bit line, and hence it is a very desirable configuration.

Incidentally, in the case of providing a multilayer structure to the memory cell portion, repeating the above-described process can obtain a desired configuration. Finally, a so-called passivation film is formed, and a wiring connecting portion which serves as an input/output portion is formed. Thereafter, a so-called post-process such as an inspection or dicing is carried out, thereby bringing the storage apparatus to completion.

Moreover, although the carbon thin line is used as a conductive thin line utilized for operations in this embodiment, it is also possible to adopt metal thin lines formed of, e.g., chrome, nickel, copper, gold, titanium or aluminum as other conductors, or thin lines including alloys containing these materials, or semiconductor thin lines including silicon or the like having metallic conductive properties. A shape of the thin line does not have to be columnar, and it may be a polygonal pillar or an elliptic cylinder.

It is to be noted that the present invention is not restricted to each of the foregoing embodiments. Although colloidal silica as an insulator including silicon oxide is used as a particle utilized for memory operations in the foregoing embodiments, it is possible to adopt other inorganic oxides such as aluminum oxide or titanium oxide or employ organic matters such as polystyrene. Moreover, the particle does not have to be an insulator in principle, and hence it is possible to use, e.g., metal particles including chrome, nickel, copper, gold, titanium or aluminum as conductors, particles including alloys containing these materials, a carbon particle, a silicon particle as a conductor and others. A shape of the particle does not have to be spherical, and it may be polyhedral, elliptic or columnar.

Additionally, the row line and the column line do not have to be arranged in an orthogonal relationship, and they may be arranged in a crossing relationship. Further, conditions such as a length of a gap between the first and second electrodes, a size of the particle and others can be appropriately changed in accordance with a specification.

Furthermore, the description has been given as to the storage apparatus including both the data read circuit and the data write circuit in the embodiments, but the storage apparatus does not have to be provided with both circuits, and it may include one of these circuits. For example, considering a case where the storage apparatus according to the present invention is used like an ROM, it is good enough for such a storage apparatus main body as shown in FIG. 1 to include the data write circuit alone on the ROM providing side and include the data read circuit alone on the ROM using side.

According to the embodiments of the present invention described above, the storage apparatus can be allowed to function by utilizing presence/absence of the particle between the row line and the column line. Moreover, in the manufacture of this apparatus, the particles can be prevented from being agglomerated, thereby realizing an efficient manufacturing method. Additionally, the storage apparatus can function by utilizing existence information of the conductive movable material between the row line and the column line.

Further, in these cases, forming wiring lines of the first electrode and the second electrode can suffice as a circuit pattern of the memory, the structure is very simple, and positioning in a cell or a pattern dimensional accuracy becomes loose as compared with an example using an MOSFET, thereby suppressing a manufacturing cost. Furthermore, since existence information of the conductive movable material rather than accumulation of an electric charge is utilized to store data, properties with respect to resistance to influence of a disturbance are provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a storage apparatus, comprising:
    preparing a first substrate on which a plurality of row lines are arranged in parallel;
    preparing a second substrate on which a plurality of column lines are arranged in parallel;
    dispensing as a droplet a solution, in which particles are dispersed in a solvent, from a solution supply port to which an electric field is applied, toward a surface of the first substrate on which the row lines are formed or a surface of the second substrate on which the column lines are formed; and
    arranging the surface of the first substrate and the surface of the second substrate to face each other with a gap in such a manner that the column lines cross the row lines, thereby making the particles at crossing portions to be movable between the row lines and the column lines facing each other and between the crossing portions adjacent to each other.

2. The method of manufacturing a storage apparatus according to claim 1, wherein said dispensing as a droplet a solution includes setting an intensity of the electric field in such a manner that a repulsive force caused due to charging becomes larger than surface tension of the droplet before the droplet reaches the substrate.

3. The method of manufacturing a storage apparatus according to claim 1, wherein said dispensing as a droplet a solution includes preparing the supply port to include a plurality of supply ports.

4. The method of manufacturing a storage apparatus according to claim 1, wherein the particle is formed of one material selected from the group consisting of silicon oxide, aluminum oxide, titanium oxide, polystyrene, chrome, nickel, copper, gold, titanium, aluminum, alloys of these materials, carbon and silicon.

5. A method of manufacturing a storage apparatus, comprising:
    preparing a first substrate on which a plurality of row lines are arranged in parallel;
    preparing a second substrate on which a plurality of column lines are arranged in parallel;
    spin-coating a surface of the first substrate on which the row lines are formed or a surface of the second substrate on which the column lines are formed with a solution obtained by dispersing particles in a solvent and further mixing a highly viscous soluble resin in the solvent; and
    arranging the surface of the first substrate and the surface of the second substrate to face each other through a gap in such a manner that the column lines cross the row lines, thereby making the particles at crossing portions to be movable between the row lines and the column lines facing each other and between the crossing portions adjacent to each other.

6. The method of manufacturing a storage apparatus according to claim 5, further comprising performing CMP and ashing after said spin-coating with the solution.

7. The method of manufacturing a storage apparatus according to claim 5, wherein the particle is formed of one material selected from the group consisting of silicon oxide, aluminum oxide, titanium oxide, polystyrene, chrome, nickel, copper, gold, titanium, aluminum, alloys of these materials, carbon and silicon.

8. The method of manufacturing a storage apparatus according to claim 5, wherein the highly viscous resin contains polyvinyl alcohol.

9. A method of manufacturing a storage apparatus, comprising:
forming on a substrate a plurality of row lines made of a first wiring material and arranged in parallel;
forming on the substrate a structure which defines an air gap region on the row lines;
embedding a mixture including a pyrolysis polymer and particles in the air gap region to form a mixture layer;
forming a film of a second wiring material on the mixture layer;
processing the second wiring material to obtain a plurality of column lines arranged in parallel in such a manner that the column lines cross the row lines;
performing a heat treatment to the substrate in order to decompose and expel the pyrolysis polymer in the mixture layer; and
forming a dielectric film over the column lines and between the column lines adjacent to each other.

10. The method of manufacturing a storage apparatus according to claim 9, wherein the polymer includes a polyalkylene oxide.

11. A method of manufacturing a storage apparatus, comprising:
alternately arranging on a substrate a plurality of row lines and a plurality of row-line-side dielectric lines, the row lines including a first wiring material, in such a manner that upper ends of the dielectric lines are higher than upper ends of the row lines adjacent to the row-line-side dielectric lines;
forming insulating walls on the same side edge of each of the row-line-side dielectric lines;
stacking semiconductor lines on the row-line-side dielectric lines, respectively, to form a plurality of linear structure portions, which include the row-line-side dielectric lines, the semiconductor lines and the insulating walls attached to the semiconductor lines;
embedding a mixture including a pyrolysis polymer and conductive particles in regions on the row lines and sandwiched between neighboring ones of the linear structure portions to form a plurality of mixed film portions;
forming a film of a second wiring material over the semiconductor lines and the mixed film portions;
etching the second wiring material to provide a plurality of column lines arranged in parallel with each other, in such a manner that the column lines cross the row lines, followed by etching the semiconductor lines;
performing a heat treatment to the substrate to decompose and expel a polymer in the mixed film portions outside; and
forming an interlayer dielectric film over the column lines and between the column lines adjacent to each other.

12. The method of manufacturing a storage apparatus according to claim 11, further comprising forming a metal film which constitutes a Schottky junction on the semiconductor lines before forming the film of the second wiring material over the semiconductor lines and the mixed film portions.

13. The method of manufacturing a storage apparatus according to claim 11, wherein the conductive particles are made of polysilicon, and the polymer is made of polyalkylene oxide.

* * * * *